US012681116B2

(12) United States Patent
Wallace et al.

(10) Patent No.: US 12,681,116 B2
(45) Date of Patent: Jul. 14, 2026

(54) DYNAMIC DISTORTION CORRECTION FOR MRI

(71) Applicant: Children's Medical Center Corporation, Boston, MA (US)

(72) Inventors: Tess E. Wallace, Boston, MA (US); Simon K. Warfield, Boston, MA (US); Onur Afacan, Boston, MA (US)

(73) Assignee: Children's Medical Center Corporation, Boston, MA (US)

( * ) Notice: Subject to any disclaimer, the term of this patent is extended or adjusted under 35 U.S.C. 154(b) by 160 days.

(21) Appl. No.: 18/687,865

(22) PCT Filed: Aug. 19, 2022

(86) PCT No.: PCT/US2022/040917
§ 371 (c)(1),
(2) Date: Feb. 29, 2024

(87) PCT Pub. No.: WO2023/034044
PCT Pub. Date: Mar. 9, 2023

(65) Prior Publication Data
US 2025/0138121 A1      May 1, 2025

Related U.S. Application Data

(60) Provisional application No. 63/238,640, filed on Aug. 30, 2021.

(51) Int. Cl.
*G01R 33/54* (2006.01)
*G01R 33/56* (2006.01)

(52) U.S. Cl.
CPC ....... *G01R 33/543* (2013.01); *G01R 33/5608* (2013.01)

(58) Field of Classification Search
CPC .............. G01R 33/543; G01R 33/5608; G01R 33/243; G01R 33/56563; G01R 33/4806;
(Continued)

(56) References Cited

U.S. PATENT DOCUMENTS 7,423,430 B1      9/2008  Sharif
9,524,567 B1    12/2016  Brokish et al.
(Continued)

FOREIGN PATENT DOCUMENTS

WO      2020078907 A1      4/2020
WO      2020219803 A1    10/2020
(Continued)

OTHER PUBLICATIONS

U.S. Appl. No. 17/605,775, filed Oct. 22, 2021, Kermani et al.
(Continued)

*Primary Examiner* — G.M. A Hyder
(74) *Attorney, Agent, or Firm* — Greenberg Traurig, LLP; Andrew J. Tibbetts; George E. Banis

(57) ABSTRACT

Described herein are various embodiments of techniques for controlling creation of a magnetic resonance (MR) image from a magnetic resonance imaging (MRI) scan of a subject using an MRI scanner, through real-time, dynamic control of the MRI scanner during the MRI scan and/or of processing during the MRI scan of acquired MR signals as part of generating MR data for creation of the MR image. More particularly, some embodiments described herein relate to identifying changes that occur in a magnetic field within an MRI scanner during a course of an MRI scan. In response to changes in the magnetic field, an MRI scanner may be adjusted to change a way in which additional MR data is captured and/or a processing of captured MR signals (that are to be used in generating an MR image) may be adjusted.

17 Claims, 32 Drawing Sheets

(58) Field of Classification Search

CPC .......... G01R 33/4835; A61B 2576/026; A61B
5/7203; A61B 5/055

See application file for complete search history.

(56) References Cited

U.S. PATENT DOCUMENTS

| | | |
|---|---|---|
| 2002/0039024 A1 | 4/2002 | Fuderer |
| 2005/0058368 A1 | 3/2005 | Moriguchi |
| 2005/0189942 A1 | 9/2005 | Tsao |
| 2006/0261809 A1 | 11/2006 | Fuderer et al. |
| 2010/0284595 A1 | 11/2010 | Mori et al. |
| 2012/0082355 A1 | 4/2012 | Mendes |
| 2012/0249137 A1* | 10/2012 | Witschey ........... G01R 33/3875 |
| | | 324/309 |
| 2012/0249138 A1 | 10/2012 | Pfeuffer |
| 2013/0076356 A1 | 3/2013 | Jellus et al. |
| 2013/0229177 A1 | 9/2013 | Bammer et al. |
| 2013/0249553 A1 | 9/2013 | Simonetti et al. |
| 2013/0259343 A1 | 10/2013 | Liu |
| 2013/0300414 A1 | 11/2013 | Guerin |
| 2013/0320974 A1 | 12/2013 | Liu |
| 2014/0009156 A1 | 1/2014 | Doneva et al. |
| 2014/0361770 A1 | 12/2014 | Dannels |
| 2015/0065854 A1 | 3/2015 | Ahn et al. |
| 2015/0369893 A1 | 12/2015 | Takeshima |
| 2016/0252596 A1 | 9/2016 | Nielsen et al. |
| 2017/0325709 A1 | 11/2017 | Nayak |
| 2018/0024215 A1 | 1/2018 | Zhu |
| 2018/0232878 A1 | 8/2018 | Braun et al. |
| 2018/0238986 A1 | 8/2018 | DeWeerdt |
| 2018/0238988 A1 | 8/2018 | Bernstein |
| 2018/0260981 A1 | 9/2018 | Gholipour-Baboli et al. |
| 2018/0306882 A1 | 10/2018 | Li |
| 2019/0122398 A1 | 4/2019 | Huang |
| 2019/0244399 A1 | 8/2019 | Li |
| 2021/0046329 A1 | 2/2021 | Lachaine et al. |
| 2021/0196109 A1 | 7/2021 | Shelton, IV et al. |
| 2022/0218222 A1 | 7/2022 | Kermani et al. |
| 2022/0347492 A1* | 11/2022 | Gach ................... A61N 5/1049 |

FOREIGN PATENT DOCUMENTS

| | | |
|---|---|---|
| WO | 2021099282 A1 | 3/2021 |
| WO | 2023004412 A1 | 1/2023 |
| WO | 2023027958 A1 | 3/2023 |
| WO | 2023034044 A1 | 3/2023 |

OTHER PUBLICATIONS

U.S. Appl. No. 18/291,540, filed Jan. 23, 2024, Warfield et al.
U.S. Appl. No. 18/685,777, filed Feb. 22, 2024, Sui et al.
International Search Report and Written Opinion from the International Searching Authority from corresponding PCT Application No. PCT/US2022/040917, dated Nov. 18, 2022, By: Authorized Officer: Shane Thomas.
Wang et al., "CONtrast Conformed Electrical Properties Tomography (CONCEPT) Based on Multi-Channel Transmission and Alternating Direction Method of Multipliers", IEEE Transactions on Medical Imaging, Author Manuscript, PMC, Feb. 1, 2020, 33 pages.

* cited by examiner

| Reference Image Matrix Size | Acquisition Time (s)* | Computation Time (ms) | Mean absolute error FIDnav vs. DOCMA | | |
|---|---|---|---|---|---|
| | | | Zeroth-order (μT) | First-order (μT/m) | Second-order (μT/m2) |
| 64x64 | 44 | 264 | 0.03 ± 0.01 | 0.49 ± 0.06 | 1.05 ± 0.25 |
| 32x32 | 22 | 144 | 0.03 ± 0.01 | 0.49 ± 0.06 | 1.22 ± 0.37 |
| 16x16 | 11 | 62 | 0.02 ± 0.01 | 0.52 ± 0.08 | 7.30 ± 0.83 |

*based on TR = 1000 s and multi-shot EPI for phantom scan

FIG. 8

| NRMSE (%) | Y-Shim | | | | Nose Touching | | |
| Subject No. | Static | FIDnav | DOCMA | Static | FIDnav | DOCMA |
| --- | --- | --- | --- | --- | --- | --- |
| 1 | 5.2 | 2.3 | 2.4 | 4.0 | 2.5 | 2.6 |
| 2 | 5.0 | 1.5 | 1.6 | 1.7 | 1.3 | 1.4 |
| 3 | 4.8 | 1.4 | 1.5 | 2.2 | 1.4 | 1.3 |
| 4 | 5.3 | 2.0 | 0.5 | 1.4 | 1.6 | 1.6 |
| 5 | 6.7 | 2.6 | 6.3 | 3.1 | 1.5 | 1.7 |
| Mean | 5.5 | 2.0* | 2.14* | 2.49 | 1.7 | 1.7 |
| SD | 1.0 | 0.6 | 1.59 | 1.05 | 0.5 | 0.5 |

FIG. 12

| tSNR Subject | No Motion | | | Nose Touching | | | Deep Breathing | | |
|---|---|---|---|---|---|---|---|---|---|
| | Static | FIDnav | DOCMA | Static | FIDnav | DOCMA | Static | FIDnav | DOCMA |
| 1 | 74.7 ± 28.5 | 78.8 ± 30.4 | 76.3 ± 30.5 | 58.3 ± 26.5 | 69.1 ± 29.7 | 67.5 ± 29.1 | 67.5 ± 26.9 | 73.4 ± 29.6 | 71.1 ± 30.2 |
| 2 | 58.6 ± 22.1 | 68.1 ± 25.0 | 53.3 ± 23.0 | 47.7 ± 20.2 | 61.0 ± 23.9 | 57.3 ± 24.0 | 47.6 ± 21.1 | 62.3 ± 25.5 | 61.7 ± 27.2 |
| 3 | 69.4 ± 26.5 | 71.3 ± 28.8 | 70.0 ± 27.9 | 62.1 ± 22.7 | 68.9 ± 25.8 | 65.7 ± 25.7 | 55.1 ± 25.1 | 63.4 ± 28.8 | 60.8 ± 29.3 |
| 4 | 66.0 ± 24.2 | 69.3 ± 27.4 | 68.8 ± 26.1 | 43.8 ± 21.0 | 54.4 ± 23.6 | 54.2 ± 24.3 | 29.7 ± 14.8 | 39.0 ± 19.5 | 38.1 ± 19.9 |
| 5 | 64.1 ± 22.4 | 68.7 ± 24.8 | 67.7 ± 25.4 | 57.0 ± 18.4 | 62.3 ± 20.2 | 61.4 ± 21.5 | 59.6 ± 22.8 | 65.2 ± 24.7 | 62.1 ± 24.8 |
| Mean | 66.6 | 71.2 | 58.8 | 53.8 | 63.2 | 61.2 | 51.9 | 60.7 | 58.8 |
| SD | 6.0 | 4.4 | 12.3 | 7.7 | 6.2 | 5.6 | 14.3 | 12.9 | 12.3 |

FIG. 16

DYNAMIC DISTORTION CORRECTION FOR MRI

CROSS-REFERENCE TO RELATED APPLICATIONS

The present application is the U.S. National Stage application, pursuant to 35 U.S.C. § 371, of PCT International Patent Application No. PCT/US2022/040917, filed Aug. 19, 2022, designating the United States and published in English, which claims the benefit under 35 U.S.C. § 119(e) of U.S. Provisional Application No. 63/238,640, filed Aug. 30, 2021, and titled "DYNAMIC DISTORTION CORREC-TION FOR MRI USING FID NAVIGATORS," the entire contents of each of which are incorporated herein by reference.

BACKGROUND

Magnetic resonance imaging (MRI) is a non-invasive and versatile technique for imaging biological systems. Generally, MRI operates by detecting magnetic resonance (MR) signals, which are electromagnetic waves emitted by atoms in response to an applied electromagnetic field. The detected MR signals may then be used to generate images of tissues of a patient, usually internal to the patient and unable to be directly viewed without invasive surgery.

SUMMARY

In one embodiment, there is provided a method for controlling creation of a magnetic resonance (MR) image from a magnetic resonance imaging (MRI) scan of a subject using an MRI scanner. The method comprises, prior to completion of the MRI scan of the subject using the MRI scanner, evaluating MR signals captured during the MRI scan at a time to determine first information indicative of a state of a magnetic field within the MRI scanner at the time, and comparing the first information indicative of the state of the magnetic field within the MRI scanner at the time to second information indicative of an expected state of the magnetic field for the time. The second information indicative of the expected state of the magnetic field at the time was derived from previously-captured MR data for the MRI scan of the subject using the MRI scanner. The method further comprises, in response to detecting that a result of the comparing of the first information indicative of the state of the magnetic field at the time to the second information on the expected state of the magnetic field for the time satisfies at least one criterion, adjusting the MRI scanner and/or a processing of MR signals during the MRI scan based at least in part on the result. The method further comprises capturing additional MR data of the MRI scan of the subject.

In another embodiment, there is provided a system configured to evaluate a magnetic resonance image (MRI) scan. The system comprises at least one processor and at least one non-transitory computer-readable storage medium storing processor executable instructions that, when executed by the at least one processor, cause the at least one processor to perform a method for controlling creation of a magnetic resonance (MR) image from a magnetic resonance imaging (MRI) scan of a subject using an MRI scanner. The method comprises, prior to completion of the MRI scan of the subject using the MRI scanner, evaluating MR signals captured during the MRI scan at a time to determine first information indicative of a state of a magnetic field within the MRI scanner at the time, and comparing the first information indicative of the state of the magnetic field within the MRI scanner at the time to second information indicative of an expected state of the magnetic field for the time. The second information indicative of the expected state of the magnetic field at the time was derived from previously-captured MR data for the MRI scan of the subject using the MRI scanner. The method further comprises, in response to detecting that a result of the comparing of the first information indicative of the state of the magnetic field at the time to the second information on the expected state of the magnetic field for the time satisfies at least one criterion, adjusting the MRI scanner and/or a processing of MR signals during the MRI scan based at least in part on the result. The method further comprises capturing additional MR data of the MRI scan of the subject.

In a further embodiment, there is provided a magnetic resonance imaging (MRI) system configured to evaluate a magnetic resonance image (MRI) scan. The MRI system comprises an MRI scanner, at least one processor, and at least one non-transitory computer-readable storage medium storing executable instructions that, when executed by the at least one processor, cause the at least one computer hardware processor to perform a method for controlling creation of a magnetic resonance (MR) image from a magnetic resonance imaging (MRI) scan of a subject using an MRI scanner. The method comprises, prior to completion of the MRI scan of the subject using the MRI scanner, evaluating MR signals captured during the MRI scan at a time to determine first information indicative of a state of a magnetic field within the MRI scanner at the time, and comparing the first information indicative of the state of the magnetic field within the MRI scanner at the time to second information indicative of an expected state of the magnetic field for the time. The second information indicative of the expected state of the magnetic field at the time was derived from previously-captured MR data for the MRI scan of the subject using the MRI scanner. The method further comprises, in response to detecting that a result of the comparing of the first information indicative of the state of the magnetic field at the time to the second information on the expected state of the magnetic field for the time satisfies at least one criterion, adjusting the MRI scanner and/or a processing of MR signals during the MRI scan based at least in part on the result. The method further comprises capturing additional MR data of the MRI scan of the subject.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 8 includes graphs of zeroth-, first-, and second-order field measurements that may be used in some experiments in connection with some embodiments.

FIG. 12 lists values for an example experiment in connection with some embodiments.

FIG. 16 depicts temporal signal-to-noise ratio distributions that were calculated for an experiment in connection with some embodiments.

DETAILED DESCRIPTION

Figure 1:
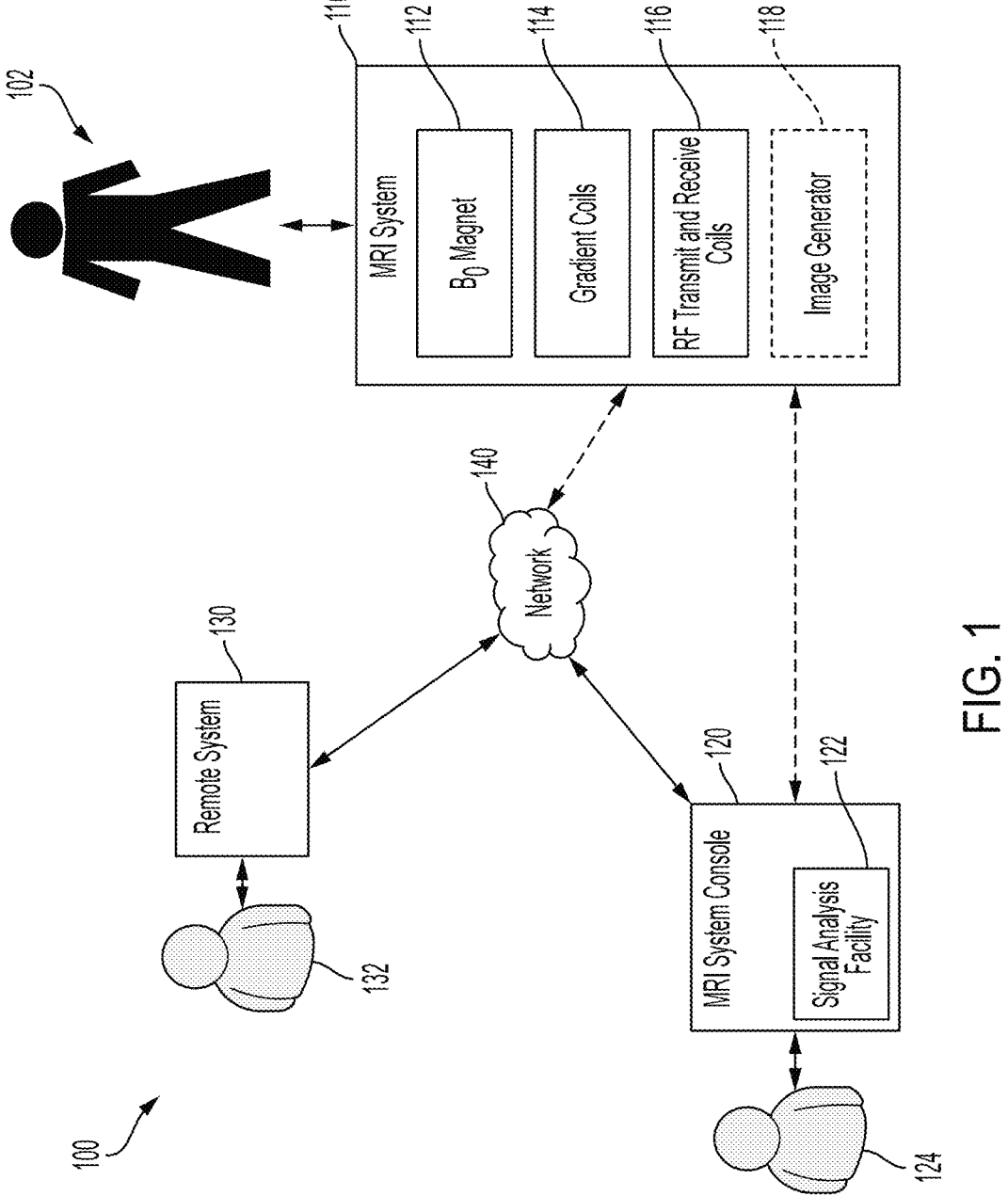
FIG. 1 is a schematic diagram of a magnetic resonance imaging (MRI) facility for conducting an MRI scan, in accordance with some embodiments of the technology described herein.

Described herein are various embodiments of techniques for controlling creation of a magnetic resonance (MR) image from a magnetic resonance imaging (MRI) scan of a subject using an MRI scanner, through real-time, dynamic control of the MRI scanner during the MRI scan and/or of processing during the MRI scan of acquired MR signals as part of generating MR data for creation of the MR image. More particularly, some embodiments described herein relate to identifying changes that occur in a magnetic field within an MRI scanner during a course of an MRI scan, such as changes in magnetic field that are triggered by movement of the subject, biological functions of the subject (e.g., respiration), variation in operation of components of an MRI scanner during use of the components (e.g., operational changes that may be caused by variations in component temperature, electrical charge, inductance, or other characteristics during operation of the component), or other causes.

Often, techniques for conducting an MRI scan and for processing MR signals to generate an MR image presume an unchanging magnetic field, which may not be accurate in every (or any) scan. Failing to account for changes in the magnetic field may result in poor quality images, which can hamper diagnostic use of the images. By detecting these changes in magnetic field, steps may be taken to account for the changes, which may lead to a more accurate MR image or a higher quality MR image that may be more useful for diagnostic purposes, or may limit the need for additional MR data capture (e.g., a longer MRI scan or a subsequent scan) to re-capture data that was initially of insufficient quality due to changes in the magnetic field. In some embodiments described herein, in response to changes in the magnetic field, an MRI scanner may be adjusted to change a way in which additional MR data is captured and/or a processing of captured MR signals (that are to be used in generating an MR image) may be adjusted. In some embodiments, the detection of changes in the magnetic field and the adjusting of the MRI scanner and/or the adjusting of the processing of acquired MR signals may be performed by the MRI scanner, during the course of an MRI scan and prior to completion of the MRI scan. In cases in which the processing during the MRI scan of acquired MR signals is performed by a device other than the MRI scanner, the adjusting may be done by such another device, such as in response to a communication from the MRI scanner regarding a change in the magnetic field.

Examples of techniques for detecting such changes in a magnetic field are described in more detail below. In some embodiments, information indicative of a state of the magnetic field at a time during the MRI scan is compared to information indicative of an expected state of the magnetic field at the time, to determine whether there is variation and/or a degree of variation. If a result of a comparing of the information regarding the state and the information regarding the expected state satisfies one or more criteria, adjustments may be made to the MRI scanner and/or to the processing of captured MR signals. In some embodiments, the information regarding the state of the magnetic field may be obtained from processing of free-induction decay (FID) navigator signals captured during the MRI scan. In such a case, the information regarding an expected state of the magnetic field may be information corresponding to reference data captured during the MRI scan, such as from an initial MRI scan that in some cases may be performed faster and at lower resolution than the portions of the MRI scan from which diagnostic-quality images are to be generated. The reference data may be used to calculate expected values for FID navigator signals. Differences between the values for FID navigator signals captured at a time during an MRI scan and expected values for the FID navigator signals for that time may be indicative of changes in the magnetic field within the MRI scanner. Accordingly, such information on FID navigator signals may be used in some embodiments to trigger adjustments to the MRI scanner and/or to processing of MR signals, as discussed below.

MRI is a non-invasive, versatile technique for studying physiology and pathology of a body, such as a human body or other animal body. MRI exploits the nuclear magnetic resonance (NMR) phenomenon to distinguish different structures, phenomena, or characteristics of a subject. For example, in biological subjects, MRI may be employed to distinguish between various tissues, organs, anatomical anomalies (e.g., tumors), and/or to image diffusion, blood flow, blood perfusion, etc. In general, MRI operates by manipulating spin characteristics of atomic nuclei of subject material. MRI techniques include aligning the spin characteristics of nuclei of the material being imaged using a generally homogeneous magnetic field and perturbing the magnetic field with a sequence of radio frequency (RF) pulses. To invoke the NMR phenomenon, one or more resonant coils may be provided proximate a subject positioned within the magnetic field. The RF coils are adapted to generate RF pulses, generally in the form of RF pulse sequences adapted for a particular MRI application, to excite the nuclei and cause the spin to precess about a different axis (e.g., about an axis in the direction of the applied RF pulses). When an RF pulse subsides, spins gradually realign with the magnetic field, releasing energy that can be measured to capture NMR data about the internal structure of the subject. Measurement of the energy of the signals can generated data indicative of nuclei excitation and relaxation. These measurements of nuclei excitation and relaxation are not meaningful to or susceptible to human manual interpretation. But complex digital signal processing techniques may be implemented by a device (e.g., through execution of software implementing the signal processing techniques) to generate, from variations within that nuclei excitation and relaxation data, information on different biological materials that were subjected to the MRI scan and that correspond to those variations, which in the context of biological subjects may be information about tissues or other anatomy of the subject. Such complex signal processing may be used to generate MR images of the subject, such as images of anatomy of a biological subject.

Different types of MRI techniques are used to generate images for studying specific structures and functions. Structural MRI may be used to detect tissues within a body, such as different organs or other tissues within the body or tissue variations within an organ. Functional MRI (fMRI) and diffusion MRI are two MRI techniques that can be used to generate image data for studying anatomical structures. fMRI measures the small changes in blood flow that occur with metabolic activity, while diffusion MRI assesses microstructural properties of tissue based on the dispersion of water molecules. These can be used, for example, to study small structures within the brain or brain activity.

Generating MRI data that is sufficient for accurate analysis may depend on the stillness of the subject being scanned. Motion of a subject during an MRI scan can result in image artifacts including ghosting, blurring, and signal dropout that can significantly degrade data quality. Motion of a subject during fMRI can disrupt the blood oxygenation level dependent (BOLD) signal measurement, which is used for measuring neural activity. Such motion effects can be subtle and not easy to identify during acquisition but can jeopardize imaging quality.

If image quality from an MRI scan is sufficiently degraded, it may not be possible for a radiologist to make a diagnosis using the image. To increase the likelihood of acquiring motion-free data, the imaging technologist or radiologist may acquire additional data (e.g., additional volumes) during an MRI scan, in the hopes that at least one of the acquired volumes will be motion-free. Or if a radiologist determines following an MRI scan that a resulting image is of insufficient quality, it may be necessary to repeat the MRI scan and, in some cases, sedate the patient during the repeated MRI scan to keep them still. Acquiring more data during a scan undesirably increases the duration of the scan, which is inconvenient for the subject and hospital and increases costs for the hospital. Moreover, this strategy does not ensure that motion-free data will be acquired. Longer scans, additional scans, or subject sedation also increase the emotional and physical burden on the subject, in addition to significantly increasing clinical and research costs. On top of disadvantages of a repeated MRI scan in terms of time and resources for the hospital and patient, a repeated MRI scan may be even more challenging because (as discussed below) there may be a significant time lag between the first MRI scan and when the radiologist has determined that the image is not of sufficient quality. That significant time lag between a first time MRI scan and any decision that a second or subsequent MRI scan is needed can have a significant negative impact on the patient, the hospital, the imaging technologies, and others.

An MRI scan is performed by an imaging technologist operating an MRI system, and an image is obtained through processing of the MR data that is obtained by the MRI system during the MRI scan. The imaging technologist does not read the images or make any diagnoses. Instead, the detailed images generated using MRI are interpreted by a radiologist, such as to help diagnose or monitor treatment for a variety of conditions. The radiologist may guide imaging technologists in performing MRI scans and generating images for the radiologist's evaluation, but the radiologist does not operate the MRI system and often is not present during the MRI scan. Instead, the radiologist may be located in another area (perhaps not even in the same building or geographic area) and may be reviewing many images resulting from many MRI scans to perform diagnoses.

In an attempt to prevent motion from degrading image quality, conventionally, an imaging technologist may visually monitor and provide instructions to a patient during the MRI scan. Due to the architecture of many MRI scanners, it can be difficult for a technologist to see if the subject in the MRI machine is moving, preventing the technologist from providing instructions to the subject to keep still. In addition, this may not be sufficient for preventing patient movement altogether, especially in children and other uncooperative patient populations. And in cases in which a technologist does observe the patient moving, the imaging technologist has no way of determining if that particular motion will or will not impact the diagnostic quality of the image that will result from the MRI scan. Interrupting and repeating an MRI scan that may have resulted in a diagnostically useful image is a waste of time and resources. Therefore, an imaging technologist must wait until the MRI scan is complete and the image is generated. Even in a case that the image does include artifacts that impact diagnostic quality, an imaging technologist (who is trained to operate the MRI system) is not trained or qualified to identify those artifacts in the image or determine whether the image can still be used by a radiologist to make a diagnosis. Furthermore, the imaging technologist is not trained to select alternative strategies for addressing the imaging needs. Providing these skills to every imaging technologist would require a substantial investment in training and education, as well as a long period of practical experience. Thus, after the MRI scan, a radiologist evaluates a resulting image to determine if it is of diagnostic quality or if another MRI scan needs to be acquired. However, in the usual imaging workflow, a radiologist may not be immediately available to assess image quality, as they may be interpreting or managing other cases. This may incur delays of fifteen minutes or more, in addition to the time already taken for completing the initial MRI scan or the time needed for repeat MRI scans to be completed and evaluated. During that time, in many cases, a patient may have left the hospital or, even if in the hospital, may have been kept waiting for a time the patient may find unacceptable.

While subject movement may be one source of artifacts in an MR image, it is not the sole source. Artifacts may arise as a result of biological activity within the subject, such as respiration/breathing or gastrointestinal activity. In addition, MRI scanner hardware may vary during operation, such as due to changes in operating condition like changes in temperature, electrical charge, inductance, or other characteristics, or from routine wear and tear on components. Such hardware variations may be associated with gradient heating and with eddy currents, which can affect quality of MR images resulting from a scan.

The inventors have recognized and appreciated that such artifacts may be related to perturbations in a magnetic field within an MRI scanner, and thus have recognized and appreciated that if such perturbations in the magnetic field could be detected during the MRI scan, steps could be taken to adjust the MRI scanner and/or adjust processing of MR signals captured during the MRI scan. Such steps could enable accounting for the perturbations and mitigating the effects of the perturbations or artifacts in an MR image resulting from the scan. For example, MR signals captured during a scan may be processed once captured, as part of generating an MR image from the MR signals. One aspect of the processing of MR signals may be accounting for distortion of the magnetic field, such as by modifying the signals to offset that distortion. One approach to accounting for such distortion may be presuming that the distortion remains constant during the MRI scan and performing the same processing/modifying over the course of the MRI scan. Another approach, examples of which are discussed below, includes adjusting the manner of processing MR signals to account for changes in the magnetic field and changes in the distortion of the magnetic field, such that different processing/modifying of MR signals to account for perturbations in the magnetic field may be performed on MR signals acquired at different times during the MRI scan. As another example of an adjustment that may be made, a manner in which the MRI scanner is operated to perform the MRI scan may be adjusted. For example, an MRI scanning sequence with which the MRI scanner is configured, which defines operations to be performed for the MRI scan, may be modified. Modifying the MRI scanning sequence may include performing shim updates to the MRI scanning sequence, modifying frequency and/or gradient offsets for the MRI scanning sequence, and/or updating the current through external shim coils.

In some embodiments, to detect changes in the magnetic field within an MRI sequence over time, a reference scan may be performed to obtain information regarding a state of the magnetic field within the MRI scanner at a first time. This may be done, for example, at a start of an MRI scan.

This information on the state of the magnetic field at the first time may set an expectation of the state of the magnetic field at a later time, if there are no changes. Subsequently, information on a state of the magnetic field may be obtained at a later time and compared to the information on the expected state of the magnetic field at that time. If the current state differs from the expected state, there has been a change in the magnetic field. In response, a change may be made to the MRI scanner and/or a manner of processing MR signals.

In some embodiments, the information regarding a current state of the magnetic field at a time during the MRI scan may be obtained from processing of free-induction decay (FID) navigator signals captured during the MRI scan. An FID navigator may be embedded in an MRI scanning sequence for an MRI scan prior to an RF excitation pulse, following an RF excitation pulse, or at any suitable position in an MRI sequence, as embodiments are not limited in this respect. In some cases, the FID navigator may be embedded in the sequence following the RF excitation pulse, to measure the free induction decay following the pulse. The pulse that the FID navigator follows may be a pulse used for imaging, a pulse used for the purpose of acquiring an FID navigator signal, or other pulse at another suitable position in the MRI sequence. For example, a signal analysis facility may instruct the MRI system to perform an MRI scan with one or more sequences including FID navigator signals. In some embodiments, such instructions may specify parameters for acquiring an MRI sequence. For example, the parameters may specify a repetition time (TR), a time to echo (TE), a flip angle, receiver bandwidth, field-of-view (FOV), a spatial resolution, a generalized auto-calibrating partially parallel acquisition (GRAPPA) acceleration factor, a total acquisition time, or any other suitable parameter, as aspects of the technology described herein are not limited in this respect. In some embodiments, sequence parameters may be chosen to match those typically used in clinical studies.

The inventors have recognized that FID navigators are sensitive to changes in a magnetic field within an MRI scanner, such as due to subject motion, due to the localized spatial sensitivities of receiver coils in a multi-channel receiver array of the MRI scanner. The inventors have also recognized that FID navigator signals may be captured by MRI scanner receiver coils without any spatial gradient encoding, which can mean the FID navigator signals may be captured and processed more quickly than some other MR signals. As such, using such FID navigator signals in this way may enable faster acquisition of information regarding a magnetic field, with less impact on the magnetization or overall scan time.

In a case in which FID navigators are used to determine information a current state of a magnetic field, the information regarding an expected state of the magnetic field may be information corresponding to reference data captured during the MRI scan, such as from an initial MRI scan that in some cases may be performed faster and at lower resolution than the portions of the MRI scan from which diagnostic-quality images are to be generated. The reference scan may be obtained using MR signals other than FID navigator signals, in some embodiments, but may be used to calculate expected values for FID navigator signals at a later time. For example, information on an expected state of a magnetic field may include information on values expected to result from acquisition of FID navigator signals at the later time. Differences between the values for FID navigator signals captured at a time during an MRI scan and expected values for the FID navigator signals for that time may be indicative of changes in the magnetic field within the MRI scanner. Accordingly, such information on FID navigator signals may be used in some embodiments to trigger adjustments to the MRI scanner and/or to processing of MR signals, as discussed below.

Various examples of ways in which these techniques and systems can be implemented are described below. It should be appreciated, however, that embodiments are not limited to operating in accordance with these examples. Other embodiments are possible.

FIG. 1 is a block diagram of an example system 100 for evaluating MRI signals of an MRI scan to make estimations regarding an image that would result from the MRI scan, in accordance with some embodiments of the technology described herein. In the illustrative example of FIG. 1, system 100 includes an MRI system 110 (which may be an MRI scanner), an MRI system console 120, and a remote system 130. It should be appreciated that system 100 is illustrative and that a system may have one or more other components of any suitable type in addition to or instead of the components illustrated in FIG. 1. For example, there may be additional remote systems (e.g., two or more) present within a system.

As illustrated in FIG. 1, in some embodiments, one or more of the MRI system 110, the MRI system console 120, and the remote system 130 may be communicatively connected by a network 140. The network 140 may be or include one or more local and/or wide-area, wired and/or wireless networks, including a local-area or wide-area enterprise network and/or the Internet. Accordingly, the network 140 may be, for example, a hard-wired network (e.g., a local area network within a healthcare facility), a wireless network (e.g., connected over Wi-Fi and/or cellular networks), a cloud-based computing network, or any combination thereof. For example, in some embodiments, the MRI system 110 and the MRI system console 120 may be located within the same healthcare facility and connected directly to each other or connected to each other via the network 140, while the remote system 130 may be located in a remote healthcare facility and connected to the MRI system 110 and/or the MRI system console 120 through the network 140.

In some embodiments, the MRI system 110 may be configured to perform MR imaging of anatomy of a patient 102. For example, the MRI system 110 may include a $B_0$ magnet 112, gradient coils 114, and radio frequency (RF) transmit and receive coils 116 configured to act in concert to perform MR imaging.

In some embodiments, $B_0$ magnet 112 may be configured to generate the main static magnetic field ($B_0$) during MR imaging. The $B_0$ magnet 112 may be any suitable type of magnet that can generate a static magnetic field for MR imaging. For example, the $B_0$ magnet 112 may include a superconducting magnet, an electromagnet, and/or a permanent magnet. In some embodiments, the $B_0$ magnet 112 may be configured to generate a static magnetic field having a particular field strength. For example, the $B_0$ magnet 112 may be a magnet that can generate a static magnetic field having a field strength of 1.5 T, or, in some embodiments, a field strength greater than or equal to 1.5 T and less than or equal to 3.0 T, or a field strength greater than or equal to 1.5 T and less than or equal to 7.0 T.

In some embodiments, gradient coils 114 may be arranged to provide one or more gradient magnetic fields. For example, gradient coils 114 may be arranged to provide gradient magnetic fields along three substantially orthogonal directions (e.g., x, y, and z). The gradient magnetic fields may be configured to, for example, provide spatial encoding of MR signals during MR imaging. Gradient coils 114 may comprise any suitable electromagnetic coils, including discrete wire windings coils and/or laminate panel coils.

In some embodiments, RF transmit and receive coils 116 may be configured to generate RF pulses to induce an oscillating magnetic field, B1, and/or to receive MR signals from nuclear spins within a target region of the imaged subject during MR imaging. The RF transmit coils may be configured to generate any suitable types of RF pulses useful for performing MR imaging. RF transmit and receive coils 116 may comprise any suitable RF coils, including volume coils and/or surface coils.

In some embodiments, the MRI system 110 may optionally include image generator 118. Image generator 118 may be configured to generate images based on MR data acquired by the MRI system 110 during MR imaging of the patient 102. For example, in some embodiments, image generator 118 may be configured to perform image reconstruction to generate images in the image domain based on MR data in the spatial frequency domain (e.g., MR data comprising data describing k-space). Image generator 118 may be implemented as hardware, software, or any suitable combination of hardware and software, as embodiments are not limited in this respect. In some embodiments, image generator 118 may be integrated with signal analysis facility 122, such as by being implemented in a same software program or collection of software programs to be executed on the MRI system console 120 and/or the MRI system 110, or another device such as a remote server or servers executing operations of the signal analysis facility 112 and/or image generator 118. In some embodiments, MR signal processing performed by the image generator 118 (and/or by the signal analysis facility 122 in some embodiments) may be adjusted during an MRI scan, such as in response to detected changes in a magnetic field (e.g., $B_0$) within the MRI system 110 during an MRI scan.

As illustrated in FIG. 1, MRI facility 100 includes MRI system console 120 communicatively coupled to the MRI system 110. MRI system console 120 may be any suitable electronic device configured to send instructions and/or information to MRI system 110, to receive information from MRI system 110, and/or to process obtained MR data. In some embodiments, MRI system console 120 may be a fixed electronic device such as a desktop computer, a rack-mounted computer, or any other suitable fixed electronic device. Alternatively, MRI system console 120 may be a portable device such as a laptop computer, a smart phone, a tablet computer, or any other portable device that may be configured to send instructions and/or information to MRI system 110, to receive information from MRI system 110, and/or to process obtained MR data.

Some embodiments may include a signal analysis facility 122. Signal analysis facility 122 may be configured to analyze MR data obtained by MRI system 110 from an MR imaging procedure of patient 102. Signal analysis facility 122 may be configured to, for example, analyze the obtained MR data to identify potential perturbations in a magnetic field within the MRI system 110 (e.g., perturbations of $B_0$) and responsively trigger adjustments to operation of the MRI system 110 and/or processing of MR signals by the image generator 118, as described herein. Signal analysis facility 122 may be implemented as hardware, software, or any suitable combination of hardware and software, as embodiments are not limited in this respect. As illustrated in FIG. 1, the signal analysis facility 122 may be implemented in the MRI system console 120, such as by being implemented in software (e.g., executable instructions) executed by one or more processors of the MRI system console 120. However, in other embodiments, the signal analysis facility 122 may be additionally or alternatively implemented at one or more other elements of the system 100 of FIG. 1. For example, the signal analysis facility 122 may be implemented at the MRI system 110 and/or the remote system 130 discussed below. In other embodiments, the signal analysis facility 122 may be implemented at or with another device, such as a device located remote from the system 100 and receiving data via the network 140.

MRI system console 120 may be accessed by MRI user 124 in order to control MRI system 110 and/or to process MR data obtained by MRI system 110. The MRI user 124 may be, for example, an imaging technologist. For example, MRI user 124 may implement an MR imaging process by inputting one or more instructions into MRI system console 120 (e.g., MRI user 124 may select an MR imaging process from among several options presented by MRI system console 120). Alternatively or additionally, in some embodiments, MRI user 124 may implement an MR data analysis procedure by inputting one or more instructions into MRI system console 120 (e.g., MRI user 124 may select MR data instances to be analyzed by MRI system console 120).

As illustrated in FIG. 1, MRI system console 120 also interacts with remote system 130 through network 140, in some embodiments. Remote system 130 may be any suitable electronic device configured to receive information (e.g., from MRI system 110 and/or MRI system console 120) and to display generated images for viewing. The remote system 130 may be remote from the MRI system 110 and MRI system console 120, such as by being located in a different room, wing, or building of a facility (e.g., a healthcare facility) than the MRI system 110, or being geographically remote from the system 110 and console 120, such as being located in another part of a city, another city, another state or country, etc. In some embodiments, remote system 130 may be a fixed electronic device such as a desktop computer, a rack-mounted computer, or any other suitable fixed electronic device. Alternatively, remote system 130 may be a portable device such as a laptop computer, a smart phone, a tablet computer, or any other portable device that may be configured to receive and view generated images and/or to send instructions and/or information to MRI system console 120.

In some embodiments, remote system 130 may receive information (e.g., MR data analysis results, generated images) from MRI system console 120 and/or MRI system 110 over the network 140. A remote user 132 (e.g., a radiologist or other clinician, such as the patient's medical clinician) may use remote system 130 to view the received information on remote system 130. For example, the remote user 132 may view generated images using remote system 130 after the MRI user 124 has completed MR data analysis using MRI system 110 and/or MRI system console 120.

Figure 2:
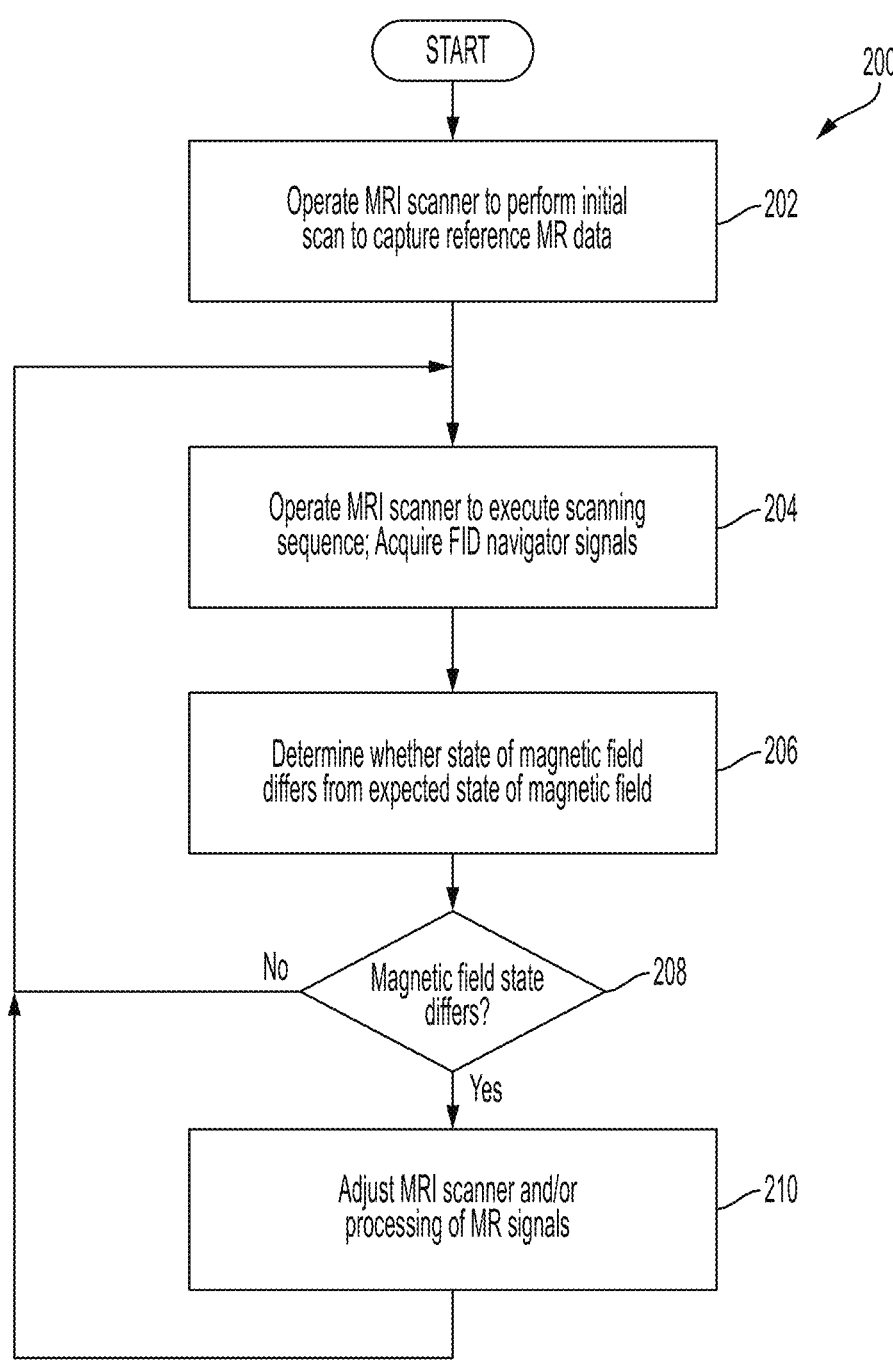
FIG. 2 is a flowchart of an illustrative process 200 of controlling generation of an MR image from an MRI scan, in accordance with some embodiments of the technology described herein.

FIG. 2 is a flowchart of an illustrative process 200 for controlling creation of an MRI image from an MRI scan, in accordance with some embodiments of the technology described herein. Process 200 may be implemented by a signal analysis facility, such as the facility 122 of FIG. 1. As such, in some embodiments, the process 200 may be performed by a computing device configured to send instructions to an MRI system and/or to receive information from an MRI system (e.g., MRI system console 120 executing signal analysis facility 122 as described in connection with FIG. 1). As another example, in some embodiments, the process 200 may be performed by an MRI scanner/MRI system, such as by image generator 118, or by one or more devices/processors located remotely (e.g., as part of a cloud computing environment, as connected through a network) from the MRI system that obtained MR data from the MRI system, such as via network 140.

Prior to the start of the process 200 of FIG. 2, an MRI scanner may be configured to execute an MRI scanning sequence. An MRI sequence may include a T1-weighted scan, a T2-weighted scan, a functional MRI scan, a diffusion weighted scan, or any suitable MRI sequence, as aspects of the embodiments described herein are not limited in this respect. In some embodiments, an MRI sequence may further include one or more embedded navigators, such as FID navigators. An FID navigator may be embedded in a sequence prior to an RF excitation pulse, following an RF excitation pulse, or at any suitable position in an MRI sequence, as aspects of the embodiments described herein are not limited in this respect. In some cases, the FID navigator may be embedded in the sequence following the RF excitation pulse, to measure the free induction decay signal following the pulse. The pulse that the FID navigator follows may be a pulse used for imaging, a pulse used for the purpose of acquiring an FID navigator signal, or other pulse at another suitable position in the MRI sequence. For example, the MRI system may be configured to perform an MRI scan with one or more FID-navigated sequences. In some embodiments, the configuration may specify parameters for acquiring an MRI sequence. For example, the parameters may specify a repetition time (TR), a time to echo (TE), a flip angle, receiver bandwidth, field-of-view (FOV), a spatial resolution, a generalized auto-calibrating partially parallel acquisition (GRAPPA) acceleration factor, a total acquisition time, or any other suitable parameter, as aspects of the technology described herein are not limited in this respect. In some embodiments, sequence parameters may be chosen to match those typically used in clinical studies.

In some embodiments, an MRI scanning sequence may specify acquisition settings for capturing FID navigator signals and/or the MRI sequence using the MRI system. For example, the sequence may specify an imaging trajectory, such as a Cartesian sampling trajectory with the center of the phase encoding direction acquired halfway through the MRI scan. As another example, the sequence may specify whether acquisitions are non-selective. As yet another example, the sequence may specify an acquisition plane, such as the sagittal, coronal, or transverse plane.

Process 200 begins at block 202, in which the MRI scanner is operated (e.g., in accordance with an MRI scanning sequence) to perform an initial scan to capture reference MR data for the scan. The reference MR data may be used to determine a state of a magnetic field within the MRI scanner with the subject positioned within the scanner and having not yet moved. This reference MR data may be subsequently used, in accordance with techniques described herein, to determine whether the magnetic field has changed, which may be associated with subject movement or other causes discussed above. In some embodiments, the MRI scanner may be operated in block 202 to perform a lower-resolution or lower-quality MRI scan than the configuration of the MRI scanner indicates for obtaining MR data for diagnostic purposes. Such lower-resolution or lower-quality scans may be obtained, for example, by adjusting a number of encoding lines per shot as compared to what will be performed for obtaining MR data for diagnostic purposes.

The signal analysis facility analyzes the reference MR data to determine information on an expected state of the magnetic field, for subsequent analysis.

Once the initial scan is performed to capture reference MR data, then the signal analysis facility moves to block 204 and performs iterations of several blocks of the flowchart of FIG. 2, during the MRI scan. The operations may be performed during the MRI scan such that they are performed prior to completion of acquisition of MR data for the scan. The operations may also be performed during the MRI scan such that each iteration is performed in association with a slice (e.g., for every slice, or for some slices) and is performed before MR data for the slice is output from the MRI scanner or from a system that analyzes MR data as it is acquired by the MRI scanner. The operations may be performed in real time, as MR data is acquired and prior to output of the MR data to an element that will compile MR data and generate imagery. Such operations may include operations that are performed "online" in the MRI scanner environment, as opposed to offline.

In block 204, the MRI scanner executes the scanning sequence and, as part of the scanning sequence, obtains FID navigator signals. In block 206, the MRI scanner analyzes the FID navigator signals to determine information on a state of the magnetic field at the time the FID navigator signals were acquired, and determines in block 208 whether the state of the magnetic field differs from the expected state of the magnetic field as determined from the reference data. If not, then the process 200 continues and the signal analysis facility loops back to block 204 to acquire more MR data as part of the MRI scanning sequence.

If, however, the signal analysis facility determines in block 208 that the current state of the magnetic field is different from the expected state of the magnetic field, the signal analysis facility triggers adjustments to be made in view of the difference. The signal analysis facility may change the MRI scan or MRI scanner, such as by reconfiguring the MRI scanner. Such a reconfiguration may be performed through changing the MRI scanning sequence, which may include changing one or more instructions of it. In some embodiments, the reconfiguring of the MRI scanner may include changing $B_0$ shim offsets, updating current through external shim coils of the MRI scanner, modifying frequency or gradient offsets, and/or other operations. In some embodiments, in addition to or as an alternative to adjusting the MRI scan or MRI scanner, the signal analysis facility may adjust a processing of MR signals acquired by the MRI scanner during the MRI scan. When the processing of the MR signals is adjusted, the processing that is adjusted may include processing prior to output from the MRI system of MR data acquired by the MRI system at a time, such as the "online" process for analyzing MR signals. In some embodiments, the adjusting of the MR signal processing may include adjusting a spatially-resolved map of magnetic field distortion to reflect changes in field distortion determined from the analysis of the FID navigator signals analyzed by the signal analysis facility.

Once the signal analysis facility adjusts the MRI scanner and/or the processing of the MR signals, the process 200 continues to block 204 for the MRI scanner to acquire more data following the adjusting, to complete the scanning sequence. The process 200 ends once the MR data to be acquired (as indicated by the scanning sequence) has been acquired.

EXAMPLE EMBODIMENTS

Described below are certain non-limiting examples of techniques for evaluating MR signals such as FID navigators during an MRI scan and, during the MRI scan, adjusting the MRI scanner and/or a processing of MR signals to generate an MR image. These are intended to be illustrative of various ways in which techniques described herein may operate. It should be appreciated that embodiments are not limited to operating in accordance with these examples. Further, while two sets of example embodiments are described, it should be appreciated that some embodiments may operate with illustrative techniques discussed in connection with the first set or the second set, or operate with any combination of techniques from the first and second set.

First Set of Example Embodiments

In some embodiments there is provided an approach for slice-wise dynamic distortion correction for echo planar imaging (EPI) using FID navigators (FIDnavs). In some such embodiments, a low-resolution reference image is used to create a forward model of FIDnav signal changes to enable estimation of spatiotemporal $B_0$ field inhomogeneity variations up to second order from measured FIDnavs.

Single-shot EPI forms the basis of many functional MRI studies as it facilitates measurement of BOLD signal fluctuations related to neuronal activity with high temporal resolution. However, given its low effective bandwidth in the phase-encoding direction, EPI is highly sensitive to magnetic field ($B_0$) inhomogeneities that occur at interfaces between materials with different magnetic susceptibilities and due to hardware imperfections. Uncompensated variations in the encoding field produce non-linear geometric distortions and regions of signal "pile-up" where image intensities are assigned to incorrect spatial locations, while intra-voxel dephasing during long readouts creates signal voids in regions with high inhomogeneity. These susceptibility-induced effects increase linearly with field strength, and lead to a loss in BOLD sensitivity, as well as difficulties in co-localizing functional data with anatomical information.

Active $B_0$ shimming is typically performed prior to imaging to help offset inhomogeneities induced by the subject-specific susceptibility distribution by superimposing an optimal set of low-spatial-order spherical harmonic (SH) fields on the static magnetic field. The total EPI readout time can also be reduced by employing ramp sampling and/or parallel imaging acceleration to minimize artifacts, but residual distortions remain a problem. Static distortions may be corrected in post-processing by computing voxel displacements in the phase-encoding direction from a low-resolution map of field offsets, usually measured from a separate gradient-echo (GRE) acquisition with multiple echo times. This fails, however, to capture dynamic changes that occur over time due to physiological mechanisms such as respiration, subject motion, and imperfections in the gradient system, including eddy current effects and gradient heating. These spatially-dependent field fluctuations result in residual non-linear geometric distortions and signal variations. As most fMRI studies attempt to detect BOLD contrast changes on the order of 1%, even small signal instabilities degrade temporal SNR and reduce sensitivity to detect true neural activity, yielding spurious results.

The issues associated with dynamic field perturbations have motivated the development of various strategies to measure spatiotemporal $B_0$ field changes during fMRI, usually at the cost of modifying the sequence and timing of acquisition. Dynamic spatially-resolved field maps may be estimated from the phase evolution of each EPI volume if a second echo is acquired using accelerated readouts (dynamic off-resonance correction with multi-echo acquisition (DOCMA)); however, acquisition of two volumes per repetition time limits the spatial resolution that can be achieved. This spatiotemporal constraint can be avoided by jittering the echo time or alternating the spatial encoding direction for consecutive time points. While these modifications facilitate dynamic field mapping, they fundamentally alter the fMRI acquisition, potentially inducing additional BOLD contrast variations, and are not rapid enough to accurately characterize respiration-induced $B_0$ changes. Alternatively, coil-dependent phase offsets may be measured in a separate reference scan and subtracted from single-echo EPI data to generate a field map at each time point. In general, data-driven methods are limited by signal dropout, geometric distortions, and phase unwrapping, particularly at ultra-high fields and in highly heterogeneous regions such as air-tissue interfaces and post-operative sites.

It may be advantageous in an MRI context for shim parameters to be calculated for each slice, to enable correction for continuous physiological effects, rather than accepting a global compromise. However, currently, the only existing solution for real-time field monitoring is external NMR field probes, which allows independent field measurements to be sampled concurrently with the imaging process at discrete locations around the object. Multiple studies have demonstrated that physiological and hardware-related temporal $B_0$ field variations can be effectively modeled by a series of low-spatial-order expansions. Thus, fitting SH functions to field probe measurements can allow correction for field fluctuations that occur due to both hardware imperfections and physiological mechanisms. Correction can be performed either retrospectively, or prospectively by dynamically updating the scanner shim currents in real time. Real-time shimming capability may compensate for respiration-induced $B_0$ fluctuations, however, this approach requires subject-specific training to calibrate phase changes related to chest motion and cannot correct for other sources of field perturbations.

FID navigator methods can offer a more efficient solution for measuring these low-spatial-order relative $B_0$ variations by sampling a small additional amount of k-space data, while circumventing the need for additional instrumentation. Double volumetric navigators (DvNavs), based on a pair of highly-accelerated, low-resolution 3D EPI acquisitions periodically interleaved with the host sequence, may also be used to generate a spatially resolved field map for each volume, recently demonstrated in diffusion tensor imaging; however, the time required for DvNav encoding would place a substantial burden on the fMRI acquisition. Measuring linear $B_0$ inhomogeneities from the phase difference between three orthogonal projections with different TEs to enable real-time shimming has been proposed. Cloverleaf navigators combine motion and shim measurement in a single trajectory and measure $B_0$ inhomogeneities directly from shifts in the k-space domain. However, as spatial encoding takes time, most navigator solutions increase the minimum TE or decrease the speed of acquisition if interleaved with the host sequence. Also, most of these prior navigator methods cannot resolve higher-order spatial field patterns. A combination of one-dimensional navigators and sensitivity encoding has been used to enable an approximation of the spatially-resolved $B_0$ field, although this requires explicit knowledge of the coil sensitivity profiles.

FID navigators (FIDnavs) measure the signal from each receiver coil without any spatial encoding and thus can be acquired extremely rapidly. Measuring the phase evolution between two FID signals may be used to compensate for global respiratory-induced frequency fluctuations and system frequency drifts in EPI time series; however, this may be insufficient to correct for non-linear geometrical distortions that arise from more localized $B_0$ field variations. Described herein are embodiments of a method for dynamic distortion correction in MRI (e.g., EPI time series) that leverages the spatial encoding information provided by the multi-channel RF receive coil arrays to enable characterization of spatio-temporal $B_0$ fluctuations from FIDnavs embedded in each slice. This approach can address limitations of previous MR-based solutions by enabling fast calculation of higher-order shim parameters, without the need for spatial encoding, image reconstruction or phase unwrapping algorithms, or calculation of coil sensitivity profiles.

FIDnavs may measure a signal integral over an excited slice of the underlying spin density distribution, modulated by the $B_0$ field inhomogeneities and RF receive coil sensitivities at each spatial location. This may be approximated by the discrete summation of a complex-valued multi-channel reference image with matched contrast properties. Dynamic changes in the $B_0$ field from a reference time point may be expressed as a series of low-spatial-order basis functions: $\Delta B_{0,n}(r)=\Delta B_{0,0}(r)+\beta(r)b_n$, where r denotes the spatial coordinate and n indexes time. In some embodiments, a forward model can be generated by simulating the effect of changes in these inhomogeneity coefficients on the complex-valued FIDnav signals ($y_{j,n}$), with spatial encoding provided by a multi-channel reference image;

$$\begin{bmatrix} y_{1,n} \\ y_{2,n} \\ \vdots \\ y_{N_c,n} \end{bmatrix} = \begin{bmatrix} S_{1,0} \\ S_{2,0} \\ \vdots \\ S_{N_c,0} \end{bmatrix} \exp(i\gamma\tau_{NAV}\beta b_n)$$

where $y_{j,n}$ is the measured FIDnav from coil j at acquisition n; each $S_{j,0}$ is a $1{\times}N_p$ vector of the complex pixel intensities of a reference image with $N_p$ pixels, measured by coil j; y is the gyromagnetic ratio (in rad/s); $\tau$ is the echo time of the reference image (designed to match the sampling time of the FIDnav); $\beta$ is an $N_p{\times}N_b$ matrix representing the $N_b$ basis functions and $b_n$ is an $N_b{\times}1$ vector representing the inhomogeneity coefficients at acquisition n. In-plane SH functions up to second order can be represented by a total of five inhomogeneity coefficients $b=[b_0, b_x, b_y, b_{x^2-y^2}, b_{xy}]$. These unknown coefficients at each time point can be computed using a non-linear algorithm that minimizes the residual sum of squares between the forward model and the measured FIDnavs at each excitation:

$$\hat{b}_n = \underset{b_n}{\text{argmin}}\|y_n - f(b_n)\|^2$$

Figure 3:
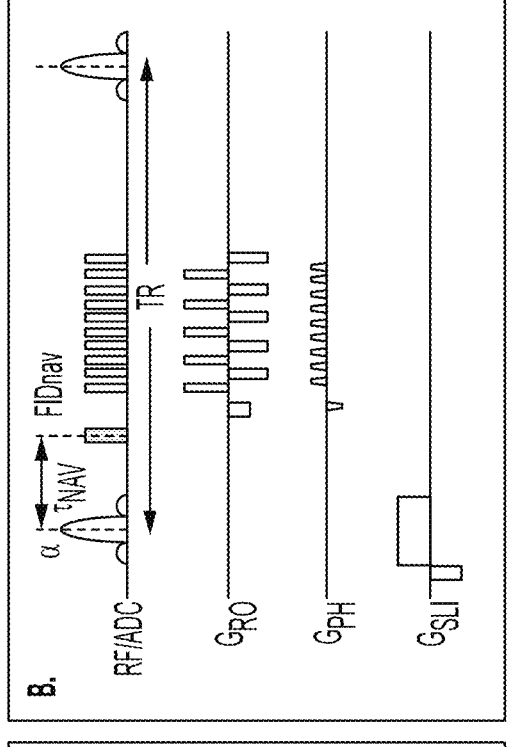
FIG. 3 is a pulse timing diagram showing example MRI scans with which some embodiments may operate.
Figure 3:
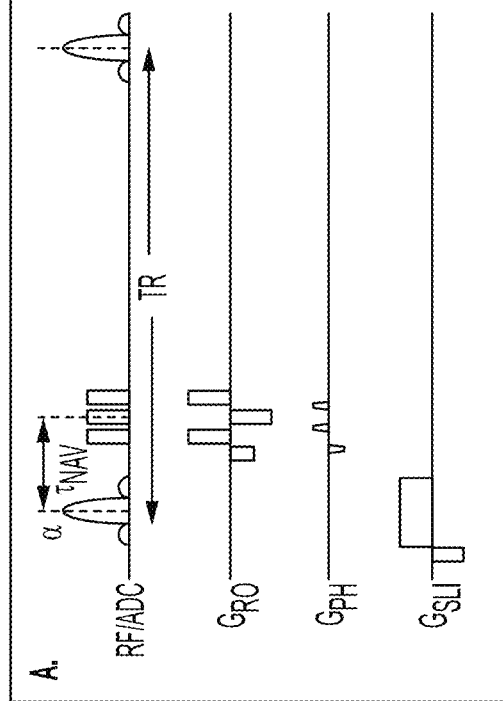

The FIDnav signal model of this example uses multi-channel GRE reference image data with matched contrast properties to be acquired for each subject. Two datasets may be acquired with reversed gradient polarities to account for phase errors that could arise due to gradient delays and other system imperfections. One challenge of this approach is that, to achieve full brain coverage, TRs for single-shot EPI acquisitions are typically on the order of 2-3 seconds. For a matrix size of 64×64 and a TR of 2 s, acquisition of reference data for model calibration could take approximately 4 minutes. In some embodiments, reference data acquisition may be quickened by using a segmented EPI reference image with three encoding lines per shot (FIG. 3(A)), and with blip-up and blip-down encoding, to provide self-referencing compensation for the effects of gradient imperfections on the encoded signal. FIG. 3 is a pulse timing diagram showing segmented EPI reference scan (A) and FID-navigated EPI time series scan (B). Resolution requirements for the reference image data may be adjusted to further reduce the time required for forward model generation, such as to <1 minute in some cases.

Accordingly, described herein are embodiments of an approach for (slice-wise) dynamic distortion correction in MRI (e.g., fMRI) using FIDnavs (e.g., ultra-short FIDnavs) and spatial encoding provided by multi-channel array coils. Sample experiments in phantom and volunteer scanning, discussed below, show that in these examples, field changes up to second order can be accurately characterized by FIDnavs embedded in each slice of an EPI sequence using information from a low-resolution multi-shot EPI reference image. In single-shot EPI, dynamic magnetic field perturbations can result in shifts and geometric distortion of the reconstructed images that change during the time series. Comparison with a reference anatomical scan can demonstrate that geometric distortion correction with FIDnavs can improve image fidelity in the presence of spatiotemporally-varying magnetic field changes.

In fMRI, spatiotemporal field variations can give rise to intensity fluctuations within each voxel, which adversely impacts the tSNR of the BOLD signal time course. In examples discussed below, a shift towards lower tSNR values was observed for both nose-touching and deep-breathing paradigms when static distortion correction was applied. In these scans discussed below, the tSNR distribution was improved using both FID-navigated and DOCMA-based dynamic distortion correction, with slightly larger tSNR gains achieved using the proposed FID-navigated approach. In scans with no intentional field perturbations, discussed below, FID-navigated EPI improved the tSNR distribution. These results demonstrate that the proposed method can improve BOLD sensitivity by compensating for residual geometric distortions in the reconstructed images that arise due to physiological mechanisms, arm motion and hardware instabilities.

Figure 4:
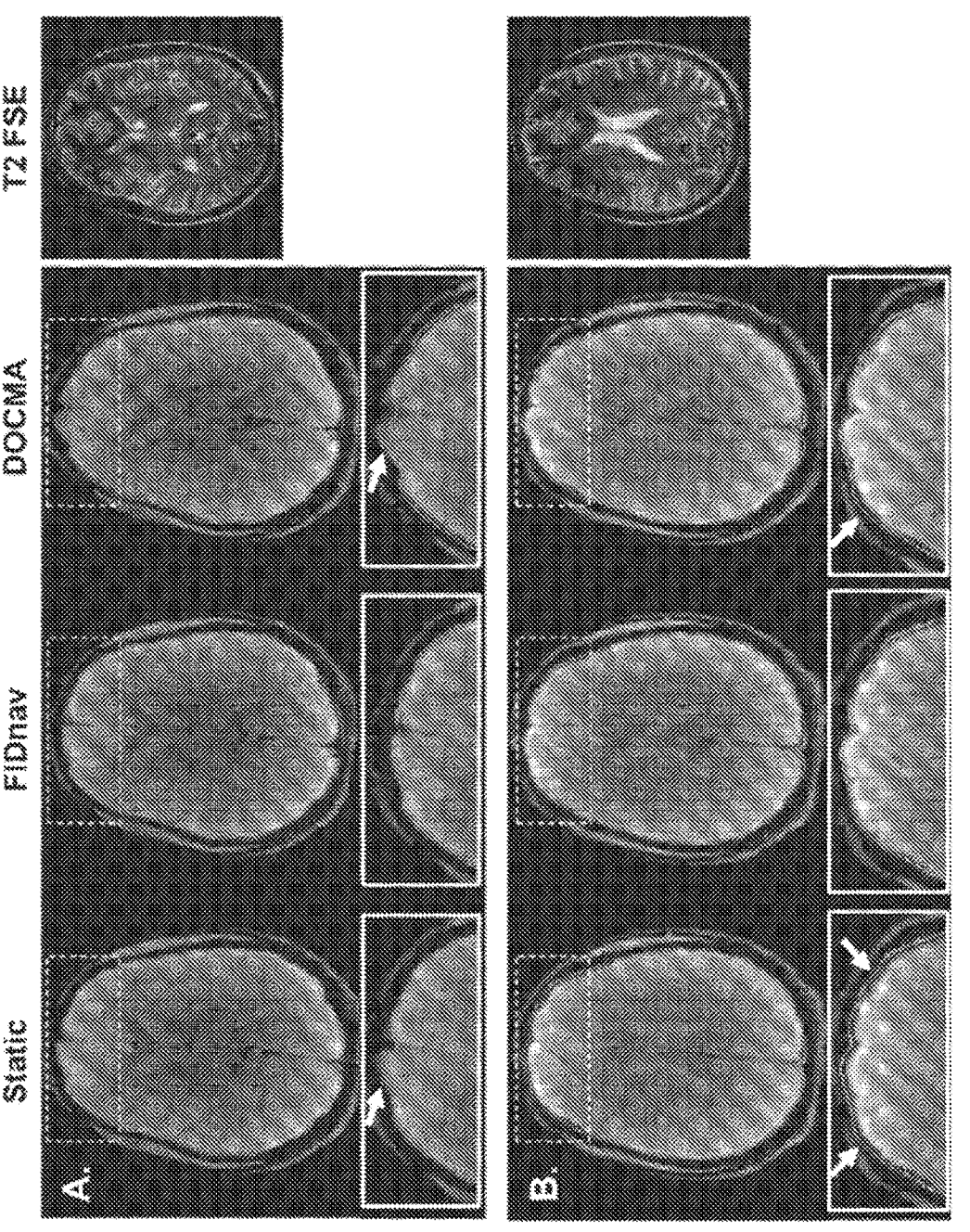
FIG. 4 illustrates a comparison of techniques operating in accordance with some embodiments described herein with other techniques.

In some contexts, an FIDnav-based method may be comparable in performance to, or in some cases outperform, a DOCMA approach with respect to both geometric distortion correction and improvement in BOLD signal stability. Reliable phase unwrapping and the invertibility of distortion are both crucial for the DOCMA approach. A shorter acquisition may be used to reduce the difference in TE values across the multiple echoes to enable more reliable field estimates. However, even with shorter TEs facilitated by shorter acquisition time, signal dropout in the second echo can lead to unreliable phase correction in regions of high inhomogeneity. In contrast, FIG. 4 illustrates that FIDnav correction outperformed DOCMA in the frontal brain cortex, where field inhomogeneity is higher. More particularly, FIG. 4 illustrates distortion correction results in a representative volunteer following correction with a static voxel shift map (VSM) and with VSMs obtained from FIDnav and DOCMA field measurements for changing Y-shim (A) and nose touching (B). The brain boundary extracted from T2 FSE (shown on the right for comparison) is overlaid on each corrected image. Arrows denote regions with residual unwrapping errors, observed with both static and DOCMA correction. FIDnavs enable reliable geometric distortion correction for both shim changes and nose touching.

Unwrapping errors led to temporal instability in field measurements in some subjects, which may help explain why DOCMA may not improve tSNR in the no motion scans. While the DOCMA approach facilitates dynamic distortion correction without a reference scan, it is subject to several other limitations, including the need for a second echo, which restricts the maximum spatial resolution that can be achieved within a given TR, making it impractical for high resolution fMRI. Like most data-driven dynamic distortion correction approaches, DOCMA also requires reconstruction and phase unwrapping of image data to perform field correction, limiting its use for real-time applications or for correcting phase inconsistencies between segments in multi-shot EPI.

Some embodiments of a FIDnav-based solution described herein may have several advantages over other shim navigator approaches. Orthogonal one-dimensional navigator signals have previously been used to measure linear field changes from the phase difference between projections with different TEs in image space or shifts in k-space. These methods assume that inhomogeneities along each axis can be measured independently; however, dephasing effects can cause the phase evolution of the projection data to be not necessarily linearly related to $B_0$ inhomogeneities in that direction. Thus, projection data alone may not be sufficient to resolve field changes in multiple directions without a priori information provided by a reference scan. Also, the time required for spatial encoding may substantially increase the minimal TE or limit the frequency of shim updates. Subsequent studies demonstrated that spatial encoding information provided by dense multi-channel coil arrays may allow for low-spatial-order $B_0$ information to be recovered from an unencoded FIDnav signal, without requiring explicit calculation of coil sensitivity profiles. The first realization of this approach considered the temporal evolution of the FID signal to estimate $\Delta B_0$ at each time point; however, R2*relaxation and, $\Delta B_0$-induced dephasing contribute to non-linear phase evolution, which limits application of this technique in vivo. Changes in $\Delta B_0$ can be more reliably estimated relative to a reference time point using an FIDnav signal sampled at the echo time of the reference image, recently shown with application to T2*-weighted imaging. This approach does not assume that the FIDnav signal evolves linearly as a function of $\Delta B_0$. Employing a multi-shot EPI reference image and a forward model of FIDnav signal changes may enable spatiotemporal field changes up to second order to be rapidly measured during the EPI time series, providing slice-wise dynamic distortion correction without compromising spatiotemporal resolution. The minimal TE/TR may be extended by the duration of the FIDnav (0.4 ms in this work).

To enable spatially resolved field measurements from FIDnavs, a reference image may be used to create a forward model of the FIDnav signals from each receiver coil. Some embodiments reduce the time needed to acquire this reference image data by using a lower-resolution (7 mm in-plane) multi-shot EPI sequence, rather than a GRE sequence used in other contexts. As many fMRI studies already acquire a static field map, model calibration could be integrated in a single step using a multi-shot, multi-echo EPI reference scan. The effect of respiration-induced field perturbations on the reference image data is assumed to be minimal at 3 T. Like many FID navigator methods, some embodiments assume that the measured field does not change within the EPI readout and thus cannot correct for higher-frequency field changes. Currently field probes are the only method that can simultaneously monitor field changes during the EPI readout itself to compensate for trajectory deviations due to eddy currents and other hardware-related instabilities.

Accelerated, multi-echo EPI can be used in some embodiments to provide a reference voxel shift measurement for each volume using the DOCMA approach. Acceleration may limit the amount of geometric distortion by reducing the total readout time. Adjusting the scanner shim settings and nose touching in volunteers induced small, but measurable distortions in the images in examples described below. Using non-accelerated imaging may have made the effect of correction clearer but would have limited use of DOCMA as a comparison. In the examples discussed below, images were unwarped in SPM using either a static field estimate or dynamic field estimates from FIDnavs or DOCMA and aligned using rigid-body registration. As well as correcting for inter-volume head motion, zeroth-order field may should also be partially compensated by rigid-body realignment. Thus, differences in tSNR represent residual unwarping errors, slice-wise shifts, realignment errors (due to changing geometric distortion between volumes) and BOLD contrast changes.

Motion may be a major source of magnetic field perturbations due to the changing orientation of the susceptibility distribution as, for example, a subject's head moves within the static magnetic field. Head motion may be reduced in some embodiments using foam padding. When analyzing MR signals resulting from an MRI scan of a patient's head, in some embodiment, it may be assumed that the relative position of the underlying spin density distribution and the coil sensitivities remained fixed during the MRI scan. Measurement of rigid-body head pose information using FIDnavs in 2D sequences may be non-trivial and difficult to model the effect of out-of-plane motion. Some embodiments may incorporate optical tracking or other motion measurement approaches to measure motion-induced field changes.

Accordingly, in some embodiments, FID navigators may be used to detect and/or to correct for geometric distortions in single-shot EPI at 3 T, although it should be appreciated that embodiments may operate with other EPI-based sequences and field strengths, or other types of MRI scans. FIDnav-based field measurements may be applicable in both 2D multi-shot and 3D EPI as some embodiments do not require formation of an image and may have a small impact on the timing of an MRI scanning sequence. This may enable correction for physiological and hardware-related phase variations between shots, which may otherwise corrupt individual image volumes and reduce the signal stability of the BOLD time course. The tSNR gains realized with FID-navigated dynamic distortion correction may be even higher at 7 T as susceptibility effects scale with field strength.

Accordingly, in some embodiments, higher-order field perturbations may be corrected retrospectively by updating the voxel shift map used to unwarp each EPI image. Shim changes measured from FIDnavs could be used to update the transmit frequency and first-order shim fields in real time in some embodiments, while prospective correction of higher-order field changes is becoming feasible using custom-built shim array coils. Real-time shimming could enable correction for the effects of magnetic field perturbations on RF excitation, fat suppression and intra-voxel dephasing, in addition to changing geometric distortions. Dynamic distortion correction with FIDnavs may translate to improved BOLD sensitivity in fMRI studies, which could aid many applications including improving localization for presurgical planning in epilepsy patients, improving the reliability of fMRI in patients with Parkinson's and Alzheimer's disease, and in research studies utilizing high-resolution fMRI to measure neuronal activation with sub-millimeter spatial resolution. This technique could also be translated to other EPI applications, such as perfusion and diffusion-weighted imaging and non-BOLD fMRI.

Some embodiments described herein thus include slice-wise dynamic distortion correction using FIDnavs embedded in each slice of a single-shot EPI sequence. FIDnav-based dynamic distortion correction may provide improved geometric accuracy of images acquired with magnetic field perturbations. Improvement in tSNR of the EPI time series was comparable to, and in some cases outperformed, an existing DOCMA approach. Some embodiments of an FID-nav-based approach may have one or more of several advantages over data-driven methods: they may not fundamentally alter the MRI scan and can be implemented without compromising spatiotemporal resolution. Furthermore, they may not require computationally expensive image reconstruction and phase unwrapping, making it more amenable to real-time shimming applications. FID-navigated dynamic distortion correction is widely applicable and is expected to improve BOLD sensitivity in fMRI experiments at field strengths of 3 T and above.

Second Set of Example Embodiments

In some embodiments there is provided a method for real-time field control using rapid FID navigator (FIDnav) measurements. In some such embodiments, FIDnavs may be embedded in a gradient echo sequence and a subject-specific linear calibration model may be generated on the scanner to facilitate rapid shim updates in response to measured FIDnav signals. Applying measured FIDnav shim updates may in some cases compensate for applied global and linear field offsets in MRI scans of a subject. FID-navigated real-time shimming may lead to a reduction in field fluctuations and a consequent improvement in T2*-weighted image quality. Some example experiments, discussed below, showed 7.57%±6.01% and 8.21%±10.90% improvement in peak signal-to-noise ratio and structural similarity, respectively. Accordingly, in some embodiments, FIDnavs may facilitate rapid measurement and application of field coefficients for slice-wise $B_0$ shimming. This may counteract spatiotemporal field perturbations and improve $T_2$*-weighted image quality, which may be helpful for a variety of clinical and research applications, particularly at ultra-high field.

MRI scanners may leverage a homogeneous and stable magnetic field for accurate signal excitation and spatial encoding. Dynamic changes in the underlying susceptibility distribution due to respiration and subject motion can give rise to spatially and temporally varying magnetic field perturbations, which can create ghosting, ringing, and signal modulation artifacts in multi-shot images. Hardware imperfections, such as gradient heating and eddy currents, are further sources of artifacts. These effects may be particularly evident in gradient echo sequences with long echo times, such as $T_2$*-weighted imaging, which may form the basis of susceptibility weighted imaging and quantitative susceptibility mapping. While imaging at ultra-high field enhances sensitivity to microscopic susceptibility variations, which improves contrast in both magnitude and phase images, the impact of macroscopic perturbations in the background magnetic field may also increase with field strength, which can be detrimental to image quality.

To address the problem of dynamic field changes during MRI, various approaches for measuring and correcting the $B_0$ field have been proposed. NMR field probes may be placed around the subject to directly record the $B_0$ field at discrete points. A model can then be fit to these measurements to describe and compensate for low-spatial-order field changes within the imaged region. Field probes can monitor field changes independent of the imaging sequence, and rapid measurements may be used to provide real-time field control. However, the need to integrate specialized hardware within the imaging set-up can limit clinical applicability. Field changes during MRI can also be estimated by acquiring additional navigator signals with varying degrees of complexity. Navigator-based methods typically involve estimating phase changes across selected parts of k-space or low-resolution images. Given the additional time required to acquire spatially resolved navigator data with multiple echoes, interleaving navigators with the imaging sequence reduces scan efficiency, particularly for rapid gradient echo sequences with little intrinsic dead time. Even acquiring a small amount of additional k-space data interleaved with the imaging acquisition can increase scan overhead by up to 30%. Alternatively, navigators may be acquired in a segmented manner; however, this limits the frequency with which field measurements can be made.

Free induction decay navigators (FIDnavs) may be acquired without gradient encoding and may be embedded in an MRI sequence by adding an additional ADC readout between the excitation pulse and imaging readout. This may increase TE and TR by the duration of the navigator (e.g., fraction of a millisecond), while for $T_2^*$-weighted GRE imaging there may be no time increase. FIDnavs have been used to correct for global frequency fluctuations and with the introduction of multi-channel coil arrays, this additional spatial sensitivity information may be leveraged to characterize spatially-varying $B_0$ field distributions. The ability of sensitivity encoding to recover low-spatial-order field inhomogeneity coefficients from unencoded FID navigator points has been proposed, along with the use of contrast-matched reference image data to measure and retrospectively correct for the effects of spatiotemporal field changes in both $T_2^*$-weighted imaging and echo planar imaging. However, retrospective correction can be limited to reversible alterations that are encoded in the perturbed data and therefore cannot compensate for inherent losses of information due to intra-voxel dephasing, inconsistent selective excitation, and disruption of steady state. Retrospective correction also typically requires implementation of offline reconstruction pipelines, which can be computationally slow. Some embodiments described herein include a method for real-time field control using rapid FIDnav measurements, which may update the central frequency and first-order shim terms for each slice of an MRI scan. These measurements can be calibrated directly on the MRI scanner using spatial encoding from a prior low-resolution reference scan, facilitating dynamic updates with minimal latency. Some embodiments thus include accurate online field correction and improved $T_2^*$-weighted image quality in the presence of dynamic field perturbations at different field strengths, such as at 3 T or 7 T.

FIDnavs may characterize spatiotemporal field changes using a forward model that predicts the effect of low-spatial-order changes in $B_0$ on the measured FIDnav signal from each RF receive coil in a multi-channel array. By approximating each FIDnav signal as a summation of pixel intensities from the complex-valued multi-channel reference image data, modulated by spatial variations in the magnetic field, the impact of low-spatial-order field changes on the measured FIDnav signal may be written as follows:

$$\begin{bmatrix} y_{1,n} \\ y_{2,n} \\ \vdots \\ y_{N_c,n} \end{bmatrix} = \begin{bmatrix} S_{1,0} \\ S_{2,0} \\ \vdots \\ S_{N_c,0} \end{bmatrix} \exp(i\gamma\tau_{NAV}\beta b_n)$$

where $y_{j,n}$ is the measured FIDnav from coil j at acquisition n; $S_{j,0}$ is a $1 \times N_p$ vector of the reference complex-valued coil image pixel intensities; $\gamma$ is the gyromagnetic ratio (in $rads^{-1}T^{-1}$); $\tau$ is the sampling time of the FIDnav; $\beta$ is an $N_p \times N_b$ matrix representing the $N_b$ spherical harmonic basis functions for an image with $N_p$ pixels, and b is an $N_b \times 1$ vector representing the shim coefficients at acquisition n. If field changes meet a criterion, such as by being sufficiently small (i.e. $\exp(x) \approx 1+x$), changes in the FIDnav signal may be assumed to be linear with respect to the field inhomogeneity coefficients. For example, a field change of 4 Hz at 3 T may give <1% approximation error. The ability of FIDnavs to estimate first, second, or even higher-order field profiles may in some cases be linked to having a sufficiently large number of spatially independent RF receive profiles. A typical 64-channel brain array may in some cases provide sufficient degrees of freedom to estimate $B_0$ fields in the head up to at least second order spherical harmonics.

In some embodiments, a linear calibration model may be generated on the scanner for each subject by simulating the effect of $B_0$ field offsets up to second order on the complex-valued multi-channel FIDnav signals in each slice. This results in the following overdetermined system of equations:

$$\begin{bmatrix} \mathfrak{R}(Y) \\ \mathfrak{I}(Y) \end{bmatrix} = \begin{bmatrix} \mathfrak{R}(A) \\ \mathfrak{I}(A) \end{bmatrix} \begin{bmatrix} 1 \ b^T \end{bmatrix}$$

where Y is the complex multi-channel FIDnav signal vector, A is the linear calibration matrix, and b is a vector of the (unknown) inhomogeneity coefficients at each time point.

To generate a calibration model, in some embodiments a pair of low-resolution two-dimensional gradient echo (GRE) scans with contrast properties matching the FIDnav embedded in the host GRE sequence may be acquired with reversed gradient polarities. Reversing the read and phase encoding direction of the second calibration scan may mitigate phase errors caused by gradient delays and other system imperfections in this reference image to enable more accurate modeling of the complex-valued FIDnav signal. A multi-channel reference image may be computed by phase-correcting and combining these low-resolution images and calibration of FIDnav shim changes was performed directly on the scanner using the vendor image calculation environment.

Figure 5:
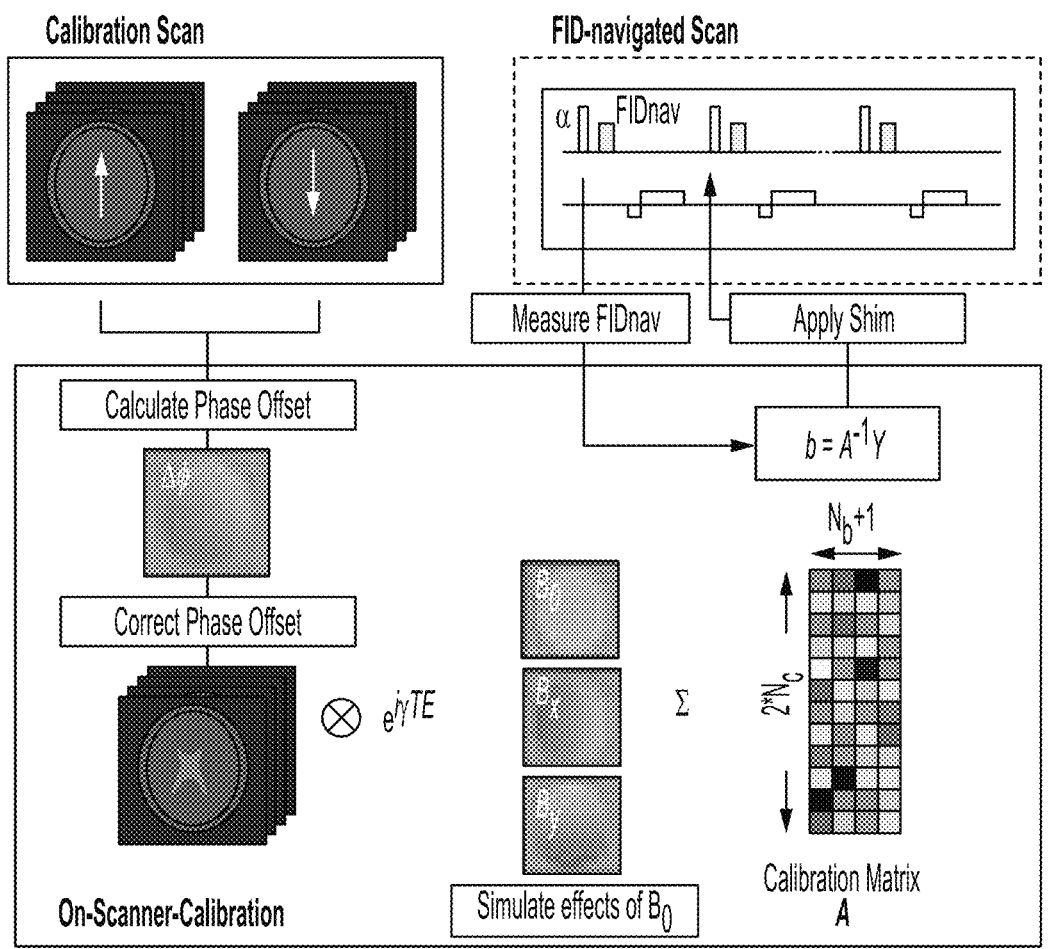
FIG. 5 is a schematic of an illustrative process that may be implemented in some embodiments for on-scanner calibration.

A product GRE sequence may be modified to include an FIDnav every repetition time between the slice-selective excitation pulse and imaging readout. The subject-specific calibration matrix computed for each slice may be loaded into memory at the beginning of the scan. Following each navigator acquisition, $B_0$ shim coefficients may be estimated as described above, via least-squares fitting and zeroth- and first-order shim terms were sent back to the sequence prior to calculation of the next event block (defined as the RF and gradient events comprising one TR). To facilitate real-time modification of the sequence, continuous processing of event blocks may be interrupted and a processing margin of 25 microseconds may be specified to allow time for the sequence to prepare the subsequent event block with updated shim information during execution of the current event block. Global $B_0$ changes may be compensated by updating the center frequency relative to the previous TR. Linear shim corrections may be implemented as offsets to the imaging gradients, which allows shim updates to be switched as rapidly as regular gradient pulses in the sequence. A schematic illustrating the on-scanner calibration and feedback is shown in FIG. 5. More particularly, FIG. 5 is a schematic showing on-scanner calibration of FIDnav $B_0$ shim measurements of some embodiments, which is performed for each subject at the beginning of the acquisition. A pair of low-resolution images with reversed gradient encoding are acquired to create a forward model of FIDnav signal changes. Changes in $B_0$ shim offsets are simulated using the phase-corrected multi-channel reference data to calibrate a linear model for each subject. $B_0$ shim coefficients are estimated from the measured FIDnav signals in each slice using the pre-calculated subject-specific calibration and used to update the center frequency and gradient offsets in real time.

Some embodiments described herein provide a method for real-time field control using FIDnavs. As encoding information is captured in a separate reference scan, FIDnavs may facilitate rapid measurement and correction of spatially resolved $B_0$ field variations in each slice without impacting or with little impact on the timing of the acquisition. Prospectively updating the frequency and gradient offsets each TR to compensate for dynamic field fluctuations means that $B_0$ field changes relative to the previous TR may be assumed to be small. This can enable use of a linear calibration model, which may facilitate fast estimation of shim coefficients via least-squares fitting. Since the calculation may be quick with low computational cost, latency may be linked to the rate of data transfer between the vendor image calculation environment to update the hardware instructions. Applying FID-navigated $B_0$ shim updates may successfully counteract field perturbations induced by manual shim changes in phantoms and volunteers, with high estimation fidelity in both X, Y and Z directions. Spatiotemporal field changes induced by deep breathing and nose touching in volunteers, as in example experiments discussed below, were substantially reduced with application of FID-navigated shimming.

Comparing $T_2$*-weighted images acquired with and without real-time field control demonstrates that FID-navigated shimming may enable high-quality images to be acquired in scans with intentional field perturbations. In experiments discussed below, a nose-touching task consistently introduced strong ghosting and signal dropout artifacts, which in the experiments were successfully corrected in 9 out of 10 subjects. Some residual artifacts remained, possibly due to small amounts of head motion while performing the task, as well as due to effects of residual higher-order field variations. Deep breathing induced more variable artifacts across subjects, which is expected as the impact of respiration is known to depend on multiple factors. Artifacts may generally be stronger for subjects with higher body-mass-index where the impact of chest motion is larger, as well as in lower slices, which are closer to the lungs. Despite these variations, in these experiments discussed below, image quality was consistently improved in 9 out of 10 subjects during deep breathing with application of FID-navigated shimming.

Improvement in $T_2$*-weighted imaging may be advantageous for a range of clinical applications including Alzheimer's disease, Huntington's disease, seizures, and stroke. $T_2$*-weighted imaging may also be used in a variety of research applications in studies investigating brain structure, iron deposition and the effects of aging. Approaches described herein may be useful for subjects who are prone to move and breathe deeply and irregularly, such as children, elderly adults, and patients with Alzheimer's disease. The ability to mitigate dynamic field changes may be advantageous to realize the full potential of these techniques at ultra-high field strengths, which suffer from the increased effects of time-varying macroscopic field changes. Mitigating artifacts due to dynamic field fluctuations may also be helpful for improving the accuracy and reproducibility of $T_2$* mapping and quantitative susceptibility mapping.

Since the impact of dynamic field changes can scale with magnetic field strength, phase stabilization may commonly be employed at 7 T to mitigate global field fluctuations during the scan. In experiments discussed below, preliminary evaluation at 7 T shows that prospective FID-navigated shimming outperformed retrospective phase stabilization for a nose-touching task and was comparable for compensating for deep breathing. Phase stabilization is limited to retrospectively compensate for global field fluctuations, while some techniques described herein may enable prospective correction for field changes up to first order. Phase stabilization may also lead to an overall increase in scan time as it acquires an additional echo following the imaging echo, which increases the minimum TR of the sequence.

Previous studies have demonstrated the utility of real-time shimming using NMR field probes, which facilitate sampling of magnetic field fluctuations with high temporal resolution and without any sequence overhead. Like FIDnavs, field probes sample point-wise measurements and use a model to estimate low-spatial-order spatiotemporal field changes within the imaged region. As field probes are arranged around the subject and measurements are independent of the imaging acquisition, a single three-dimensional spherical harmonics model is used to extrapolate the field information. One advantage of FIDnavs in two-dimensional sequences is that the signal from each FIDnav is limited to the excited slice, so the optimal model may be computed on a slice-by-slice basis, which may be advantageous for compensating for more localized shim changes. FIDnavs may also measure a signal directly from the receiver coils, which may be aided by some minor sequence modifications, but may also enable field measurements without specialized hardware.

Magnetic field measurements from k-space and image-based navigators have also been used to perform dynamic $B_0$ field updates and may also be used to simultaneously measure and correct for head motion. However, it can be challenging to interleave navigators with the host sequence without disturbing the steady state signal or significantly lengthening the scan time. Navigators may be segmented for improved efficiency, although this compromises the temporal resolution of field measurements. Calculation of brain masks and unwrapping of phase maps, and subsequent fitting of shim coefficients, can also be computationally expensive. As FIDnavs do not require gradient encoding, they may be acquired in a fraction of a millisecond, and the linear calibration model proposed herein for use with some embodiments translates FIDnav measurements into shim coefficients that can be directly used to update the frequency and gradient offsets. One limitation that may arise in some contexts may be the need to acquire additional low-resolution reference data to calibrate spatially resolved field changes. The additional scan time in some experiments was approximately 15 seconds per session, which may be reduced in some circumstances using parallel imaging and by applying a pre-calculated offset to compensate for gradient delays in the reference image.

In some embodiments, spatiotemporal field changes up to first order may be compensated for, based on measurements from FIDnavs embedded in each slice of a two-dimensional GRE sequence. Some techniques described herein may be extended to three-dimensional and simultaneous multi-slice acquisitions by estimating an additional shim coefficient in the Z-dimension to create a three-dimensional spherical harmonics model. In some embodiments, a short processing latency makes the technique well suited to 3D susceptibility weighted imaging and quantitative susceptibility mapping protocols, which are typically acquired with TRs on the order of 50-60 ms. Shim updates could be calculated and applied to the subsequent TR to closely track the true field perturbations.

FID-navigated real-time shimming may also be applied in some embodiments in both single-shot and segmented echo planar imaging sequences to reduce dynamic signal fluctuations in functional and diffusion-weighted MRI. As the FIDnav signal may be dependent on the underlying sequence, application of this approach to sequences with an inconsistent steady state or other dynamic contrast changes may benefit from modifications to account for signal changes unrelated to field perturbations. While FIDnavs can retrospectively compensate for higher-order spatiotemporal field changes, the second-order shim coils on the scanner are not designed for rapid switching.

Some embodiments may include prospective motion correction using motion measurements from an external tracking system or additional navigators for simultaneous field stabilization and motion control. Joint retrospective correction for head motion and motion-induced field changes using dual-echo image-based navigators may improve $T_2^*$-weighted image quality and susceptibility weighted imaging, with applications to improved cortical lesion detection in multiple sclerosis.

Accordingly, some embodiments include a technique for real-time shimming based on rapid measurement of spatiotemporal field changes from multi-channel FIDnav measurements in each slice. Some embodiments may successfully counteract spatiotemporal field perturbations up to first order and improve $T_2^*$-weighted images acquired in the presence of intentional field modulations. Reducing dynamic field fluctuations may be advantageous for realizing more or full potential of sequences based on $T_2^*$ contrast, particularly at high field strengths and in challenging patient groups.

EXAMPLE EXPERIMENTS

First Set of Experiments

All imaging experiments in the first set were performed at 3 T (MAGNETOM Skyra; Siemens, Erlangen, Germany) using the vendor-supplied 64-channel head coil. Five volunteers were scanned after providing written informed consent in accordance with an institutional IRB-approved protocol. An FIDnav module was inserted into a gradient-echo EPI sequence between each slice-selective excitation and EPI readout (FIG. 3B). A multi-echo EPI sequence was used in this work to facilitate comparison to DOCMA (second echo not shown in FIG. 3B).

Figure 6:
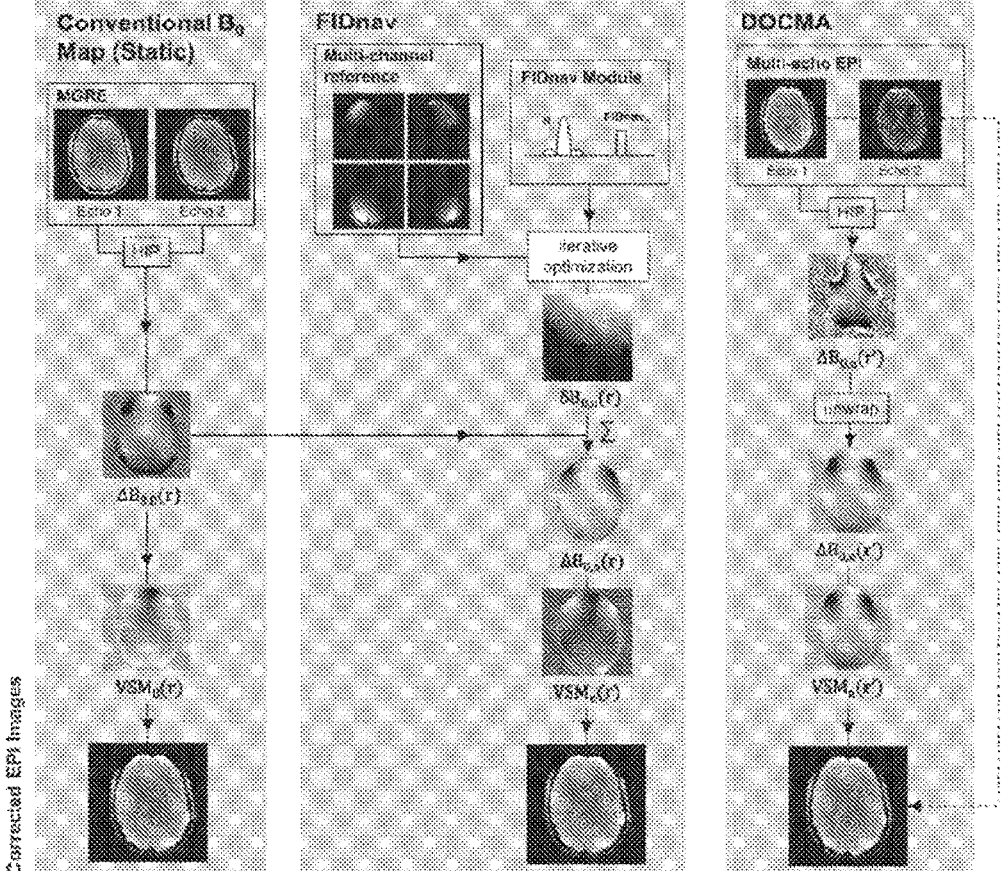
FIG. 6 is a schematic of an illustrative process that may be implemented in some embodiments for dynamic distortion correction.

A schematic of the experimental design comparing conventional static distortion correction with FID-navigated and DOCMA-based dynamic distortion correction is shown in FIG. 6.

FIG. 6 illustrates an example experimental design to compare geometric distortion correction using voxel shift maps (VSMs) computed from conventional static $\Delta B_0$ field measurements from a multi-gradient-echo (MGRE) scan, and from dynamic FIDnav- and DOCMA-based field offsets. Static $\Delta B_0$ field maps were calculated by taking the Hermitian inner product (HIP) over channels of the phase difference between multi echo images and scaling to obtain $\Delta B_{0,0}(r)$. Coefficients describing the change in $B_0$ were estimated from FIDnavs and used to compute maps of $\Delta B_{0,n}(r)$. These were superposed with the static $\Delta B_0$ map to compute $\Delta B_{0,n}(r)$ at each time point n. For the DOCMA approach, maps of $\Delta B_{0,n}(r')$ were computed in distorted image space from the HIP of multi-echo EPI images. VSMs were computed from each $\Delta B_0$ measurement and used to unwarp the first echo EPI image.

Experiment 1: Phantom Validation of FIDnav $\Delta B_0$ Measurements

To validate the accuracy of FIDnav-based $\Delta B_0$ measurements in an EPI sequence and assess the minimal requirements for forward model generation, a cylindrical water-bottle was scanned with manual adjustment of the scanner shim settings. A segmented EPI reference image was acquired with TE 5 ms, TR 1000 ms, EPI factor 3 and blip-up and blip-down encoding (total acquisition time 22 s). Axial FID-navigated multi-echo EPI scans were acquired with the following parameters: TE1/TE2 16.0/33.8 ms, TR 1000 ms, 10 repetitions, GRAPPA acceleration factor 2. The FIDnav module sampled 64 points in 0.4 ms, centered on TNAV 5 ms. Both reference and FID-navigated scans were acquired with flip angle 90°, receiver bandwidth 2232 Hz/pixel, FOV 192 mm, voxel size 3 mm isotropic, 16 slices with 20% inter-slice gap, centered at the isocenter of the magnet. First and second-order shim settings were manually adjusted up to ±10 µT/m and ±100 µT/m2 in increments of 2.5 µT/m and 25 µT/m2, respectively. EPI images were reconstructed using Dual-Polarity GRAPPA (DPG), which incorporates Nyquist ghost correction into the parallel imaging reconstruction (34). Acquisition of two echoes for each EPI volume enabled calculation of spatially-resolved field maps using the DOCMA approach (3).

Specifically, the phase evolution between echoes was obtained via a weighted sum over channels of the Hermitian inner product and used to compute $\Delta B_0$.

Unwrapped field maps were computed in SPM (Statistical Parametric Mapping v12, Wellcome Trust Centre for Neuroimaging, London, UK, www.fil.ion.ucl.ac.uk/spm/) and smoothed with a 5-mm FWHM kernel. SH functions up to second order were fit to the measured pixel-wise DOCMA field maps in the foreground region, masked using intensity thresholding. Field inhomogeneity coefficients up to second order were estimated from each FIDnav measurement (1 per TR) and compared to those measured using the DOCMA approach. This analysis was repeated following retrospective down-sampling of the reference image data up to four-fold to assess the impact of image resolution on the accuracy of model-based FIDnav shim parameter estimation. FIDnav and DOCMA field estimates were also converted into voxel-shift maps (VSMs), using the following equation:

$$d_{PE}(x) = \frac{\gamma \Delta B_0(x)}{BW_{pp}}$$

where $BW_{pp}$ is the effective bandwidth per pixel along the phase-encoding direction. VSMs were applied to the reconstructed EPI data using SPM to evaluate the ability of the proposed approach to correct for geometrical distortions induced by changing shim settings.

Experiment 2: Field Mapping and Geometric Distortion Correction in Volunteers

To compare the performance of FIDnav-based voxel shift maps to the reference DOCMA method, FID-navigated multi-echo EPI images were acquired in five volunteers with the following conditions: 1) resting position, standard shim settings; 2) applied field offset in the phase-encoding (Y) direction of ±10 μT/m; and 3) while subjects raised their arm to touch their nose. Scan parameters for the FID-navigated multi-echo EPI scans were as follows: TNAV 5 ms, TE1/TE2 18/48.1 ms, TR 2000 ms, receiver bandwidth 1860 Hz/pixel, in-plane resolution 2 mm, GRAPPA acceleration factor 2 and 6/8 partial Fourier. Posterior-anterior (PA) phase-encoding was used to avoid signal pileup in the frontal cortex (35). Segmented EPI reference images with blip-up and blip-down encoding were acquired for forward model generation with TE 5 ms, TR 2000 ms, receiver bandwidth 2232 Hz/pixel and matrix size 32×32, yielding an in-plane resolution of 7 mm (total acquisition time 44 s). Both sets of scans were acquired with flip angle 70°, FOV 224 mm, 20 slices with 2.5 mm slice thickness and 20% inter-slice gap, and fat suppression. In addition, a multi-echo GRE field map was acquired for static distortion correction (TE1/TE2 4.92/7.38 ms, TR 250 ms, flip angle 25°, receiver bandwidth 800 Hz/pixel, in-plane resolution 2 mm; matched FOV, slice thickness and spacing). An axial T2-weighted fast-spin-echo (FSE) image (TR 7360 ms, TE 78 ms, receiver bandwidth 220 Hz/pixel, in-plane resolution 0.9 mm, with matched FOV, slice thickness and spacing) was acquired to provide an anatomical reference.

Multi-channel EPI images were reconstructed using DPG and combined using sum of squares. Changes in $B_0$ inhomogeneity coefficients up to second order were measured from FIDnavs in each slice. Estimated field difference maps were superposed onto the static field map and converted into VSMs to correct for geometrical distortions. VSMs estimated using the reference DOCMA method were also applied for comparison. Static, FIDnav-based and DOCMA distortion corrected images were compared to T2 FSE images, assuming these have minimal distortion. Structural images were masked using FSL's BET tool (FMRIB, Oxford, UK, www.fmrib.ox.c.uk/fsl/). Normalized root-mean-square error (NRMSE) was also calculated within the brain region for EPI images with induced geometric distortions corrected using each method, relative to a reference EPI image with static distortion correction. Differences in NRMSE were assessed using two-sided paired Wilcoxon rank sum tests with α=0.05.

Experiment 3: Temporal Stability of BOLD Signal in Volunteers

To evaluate the improvement in BOLD signal stability with the proposed approach, fMRI scans were acquired with the following paradigms: 1) no motion, normal breathing; 2) continuous nose-touching action; 3) deep breathing. Scan parameters were identical to those used in Experiment 2, with 120 multi-echo EPI volumes acquired in each series, resulting in a total acquisition time of approximately 4 minutes. Static distortion correction was applied using field measurements from a multi-echo GRE acquisition acquired prior to each EPI series. Dynamic distortion correction was applied by superimposing second-order field changes estimated from FIDnavs on the static field map for each time point (FIG. 6). Dynamic correction using the DOCMA approach was also applied for comparison. Distortion-corrected images were aligned to the third image in each series using rigid-body registration in the Insight Toolkit (ITK) with a mean-squares similarity metric and Kaiser-Bessel window (sinc) resampling. Temporal SNR (tSNR) was computed as the ratio of the mean and standard deviation of each voxel time-course for each image series as a measure of BOLD signal stability for static, FID-navigated and DOCMA distortion correction. Improvement in mean tSNR associated with FIDnav and DOCMA dynamic distortion correction was characterized by comparing to images reconstructed using the static distortion correction scheme. The relative tSNR gain was calculated as follows:

$$\Delta tSNR(\%) = 100 \frac{\langle tSNR_{dynamic}(r) \rangle - \langle tSNR_{static(r)} \rangle}{\langle tSNR_{static(r)} \rangle}$$

where $\langle tSNR(r) \rangle$ denotes the mean tSNR over all voxels within the whole-brain mask. Significance of the one-sided Wilcoxon signed rank test for median tSNR gain above zero was tested.

Experiment Results

Experiment 1: Phantom Validation of FIDnav LIB0 Measurements

Figure 7:
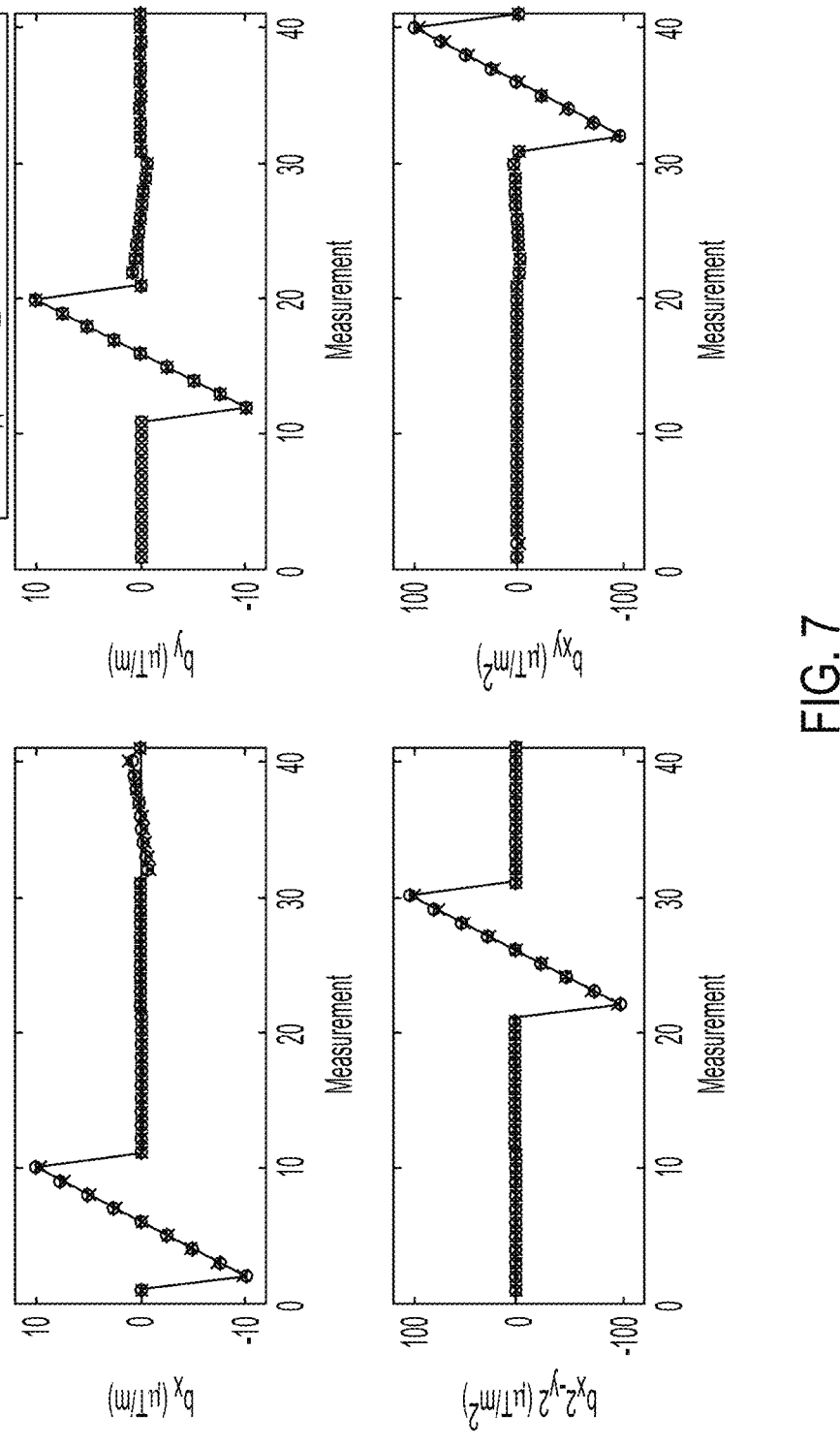
FIG. 7 includes graphs of first- and second-order field offsets that may be used in some experiments in connection with some embodiments.

A comparison between field coefficients measured using the proposed FIDnav-based approach and the DOCMA method for the applied first- and second-order shim changes is shown in FIG. 7. More particularly, FIG. 7 depicts applied first- and second-order field offsets in a phantom showing field inhomogeneity coefficients estimated from the proposed FIDnav-based approach and the reference DOCMA method. As shown in the graphs, FIDnav measurements accurately characterized field changes up to second order in the phantom study. FIDnav measurements were computed using a reference image matrix size of 32×32, as this provided a good trade-off between the efficiency of both reference data acquisition and shim parameter computation and the accuracy of higher-order field estimates. FIG. 8 shows errors in zeroth-, first- and second order field measurements estimated from FIDnavs using a non-linear fit that minimizes error between the measured FIDnav signal and a forward model generated from multi-channel reference images of different resolutions. Time taken to acquire reference data and compute the non-linear fit with each resolution level are also shown. A reference image with matrix size 32×32 provides a good trade-off between accuracy and time taken to acquire the reference data. The proposed FIDnav-based approach accurately characterized shim changes, with mean absolute errors of 0.49±0.06 μT/m (first-order) and 1.22±0.37 μT/m2 (second-order) relative to the reference DOCMA approach for maximum changes of 10 μT/m and 100 μT/m2, respectively.

Figure 9:
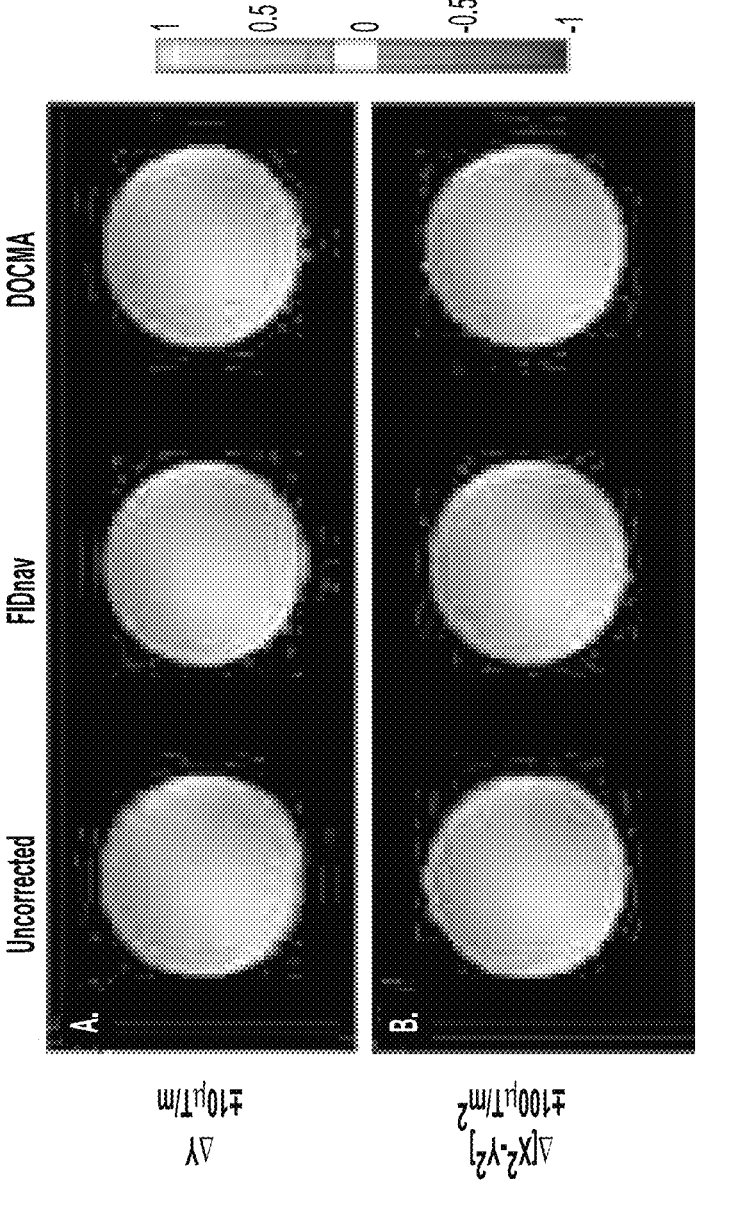
FIG. 9 depicts differences in signal intensity in a representative slice from an experiment in connection with some embodiments.

Maps of normalized signal intensity before and after correction for first- and second-order shim changes are shown in FIG. 9. More particularly, FIG. 9 depicts differences in normalized signal intensity in a representative slice through the water bottle phantom for applied shim offsets of Y±10 μT/m (A) and $X_2$-$Y_2$±100 μT/m2 (B), relative to an undistorted reference scan, before correction, and after correction with voxel shift maps calculated from FIDnav field inhomogeneity coefficients and DOCMA field maps. FIDnav field estimates enable accurate geometric distortion correction in the presence of large field offsets, comparable to that achieved with the reference DOCMA method.

Experiment 2: Geometric Distortion Correction in Volunteers

Figure 10:
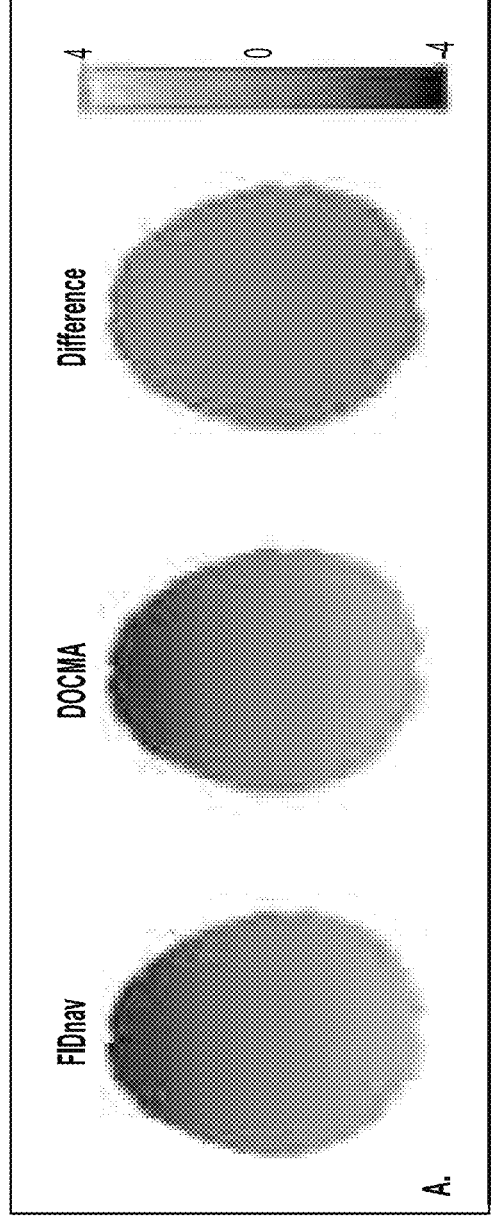
FIG. 10 illustrates a comparison in voxel shifts that may be performed in an experiment in connection with some embodiments.
Figure 10:
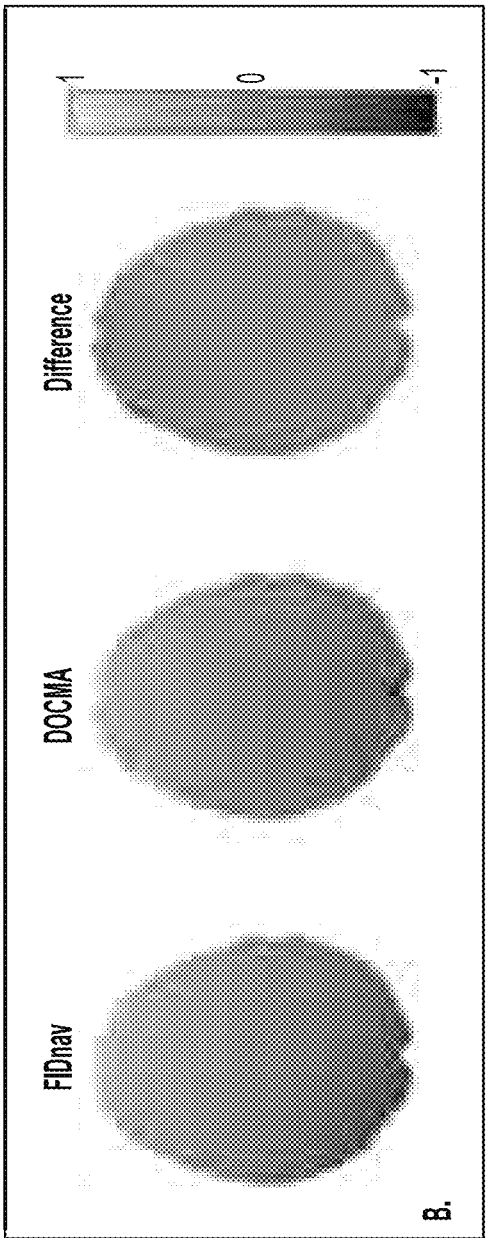
Figure 11:
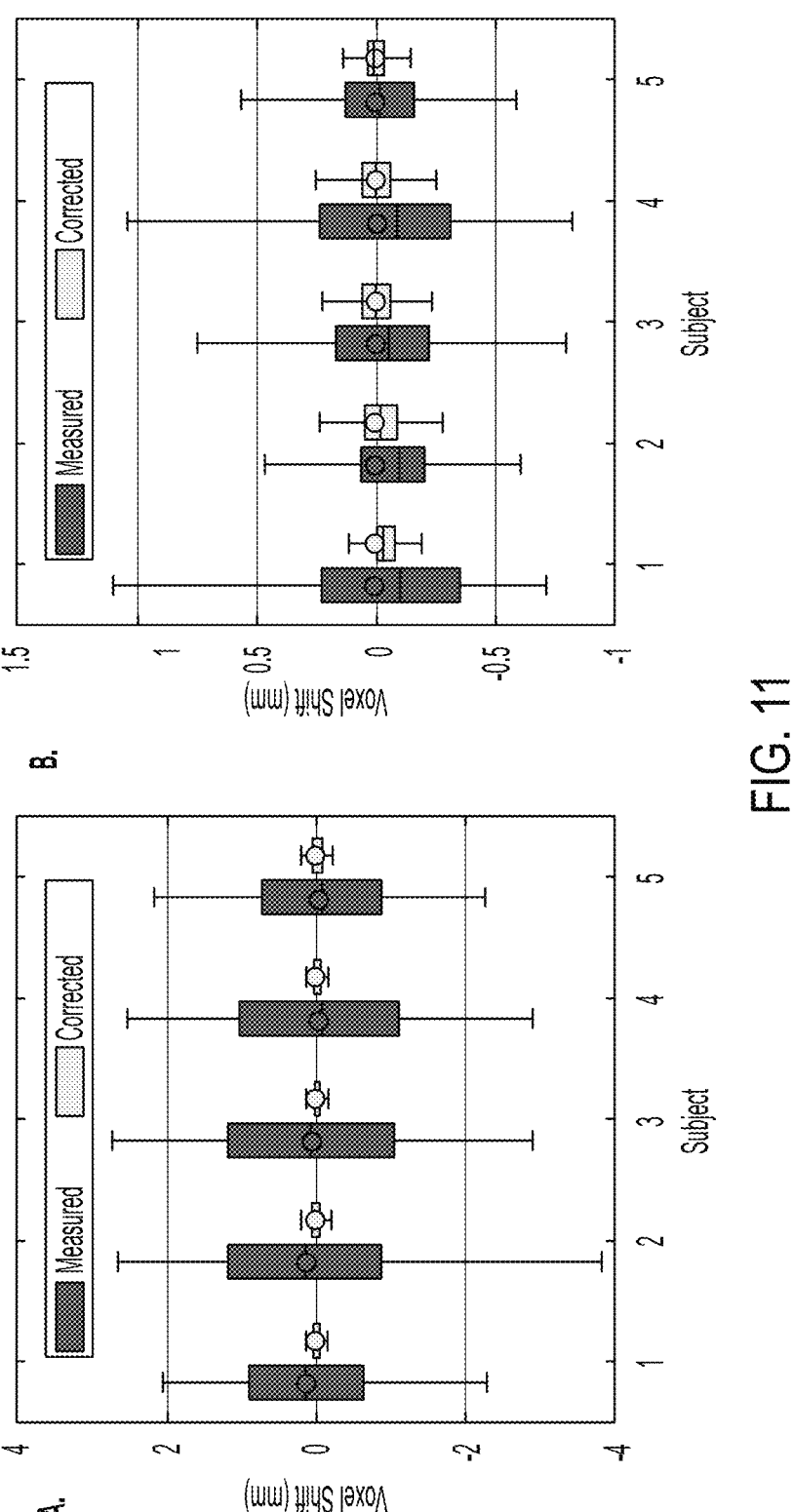
FIG. 11 includes boxplot graphs for residual voxel shifts that may be calculated in an experiment in connection with some embodiments.

FIG. 10 shows a comparison of the voxel shifts induced by modifying the shim settings along the phase-encoding direction (Y-shim) and by the volunteer touching their nose, computed with the proposed FIDnav-based approach and the reference DOCMA method. Increasing the Y-shim gradient resulted in negative voxel shifts in the frontal brain region (stretching) with respect to the posterior-anterior phase encoding direction, while nose touching in volunteers led to positive voxel shifts in this region. Difference maps confirm that these two measures are in good agreement. More particularly, FIG. 10 provides a comparison of voxel shift maps (VSMs) in an axial slice showing the residual geometric distortion in the brain induced by +10□T/m change in the Y-shim gradient (A) and nose touching (B) in a representative volunteer, measured from FIDnavs and the reference DOCMA method. Difference maps confirm that spatial field offsets estimated by the proposed FIDnav-based approach are in good agreement with pixel-wise estimates from multi-echo EPI. Relative to the spatially-resolved VSMs measured using the DOCMA approach, correction with FIDnav field estimates led to a substantial reduction in the residual voxel shift. FIG. 11 depicts a comparison of residual voxel shifts measured using DOCMA ("measured") and after subtraction of voxel shifts modelled using the proposed FIDnav method ("corrected") for all subjects in the brain region with applied Y-shim gradient (A) and with nose touching (B). Boxes delineate 25th and 75th quantiles, with whiskers extending to the maximum voxel shifts. Median and mean are denoted by solid lines and open circles, respectively. The mean absolute error of voxel shifts reduced from $1.01 \pm 0.67$ mm to $0.06 \pm 0.10$ mm (Y-shim) and $0.25 = 0.25$ mm to $0.09 \pm 0.17$ mm (nose touching) following correction with FIDnav estimates. FIG. 4 displays EPI images in a representative volunteer acquired following an adjustment in Y-shim and during nose touching, illustrating geometric distortion correction results using static, FIDnav and DOCMA field estimates. Comparison with the reference anatomical image shows that static distortion correction resulted in residual unwarping errors, which are most easily observed in the frontal brain regions. FIDnav field estimates accurately compensated for geometric distortions induced by both changing shim settings and the nose-touching action, while residual unwarping errors are present in the DOCMA method. These are likely due to signal dropout in the second echo time of the multi-echo acquisition used in DOCMA, which produces unreliable field estimates in regions of high inhomogeneity. The table of FIG. 12 lists the mean NRMSE values calculated in each EPI image relative to the reference EPI image, which confirms that accuracy of geometric distortion correction is improved following FIDnav correction, compared to static distortion correction.

Experiment 3: Temporal Stability of BOLD Signal in Volunteers

Figure 13:
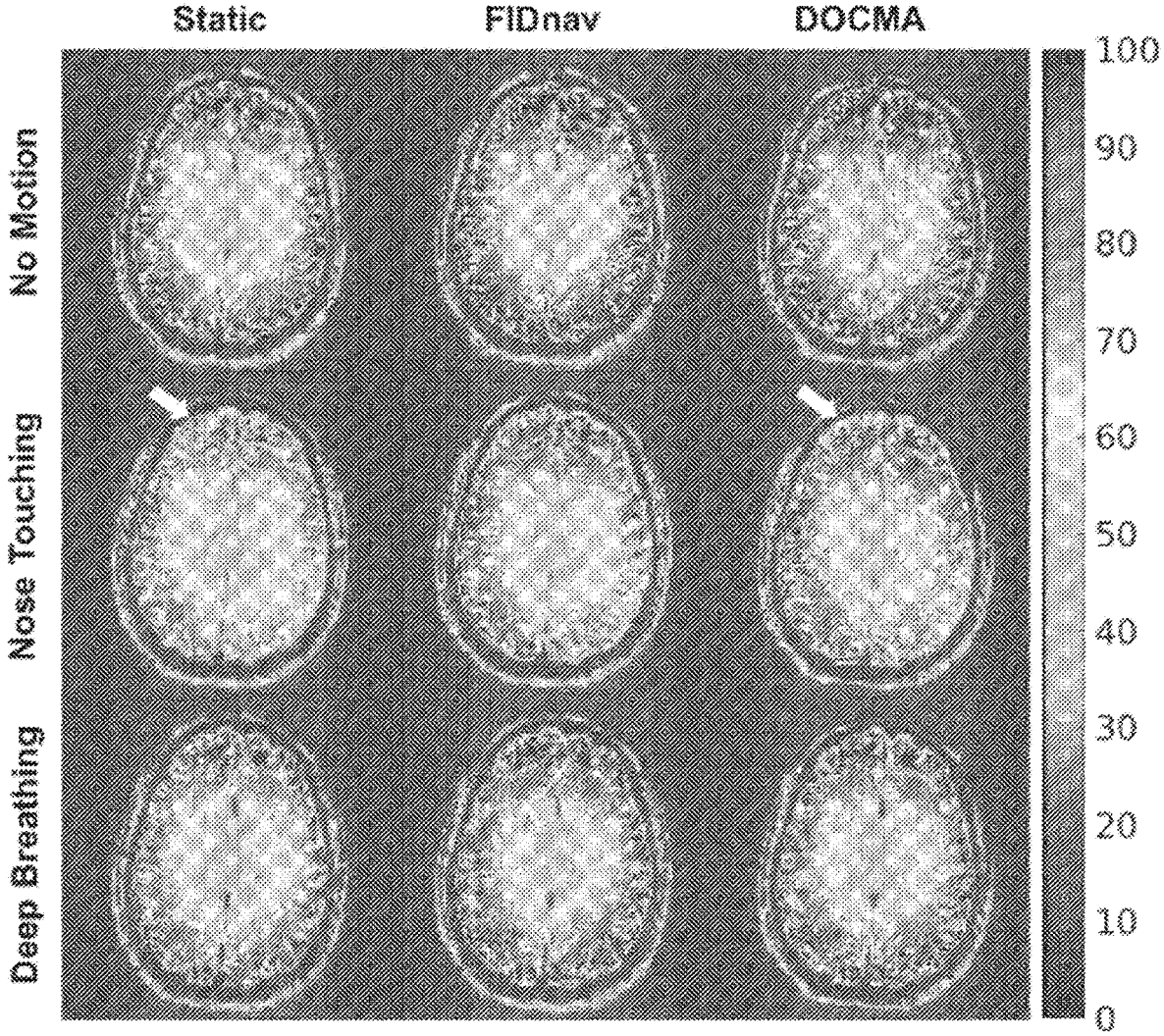
FIG. 13 depicts maps of temporal signal-to-noise ratio that were calculated for an example experiment in connection with some embodiments.
Figure 14:
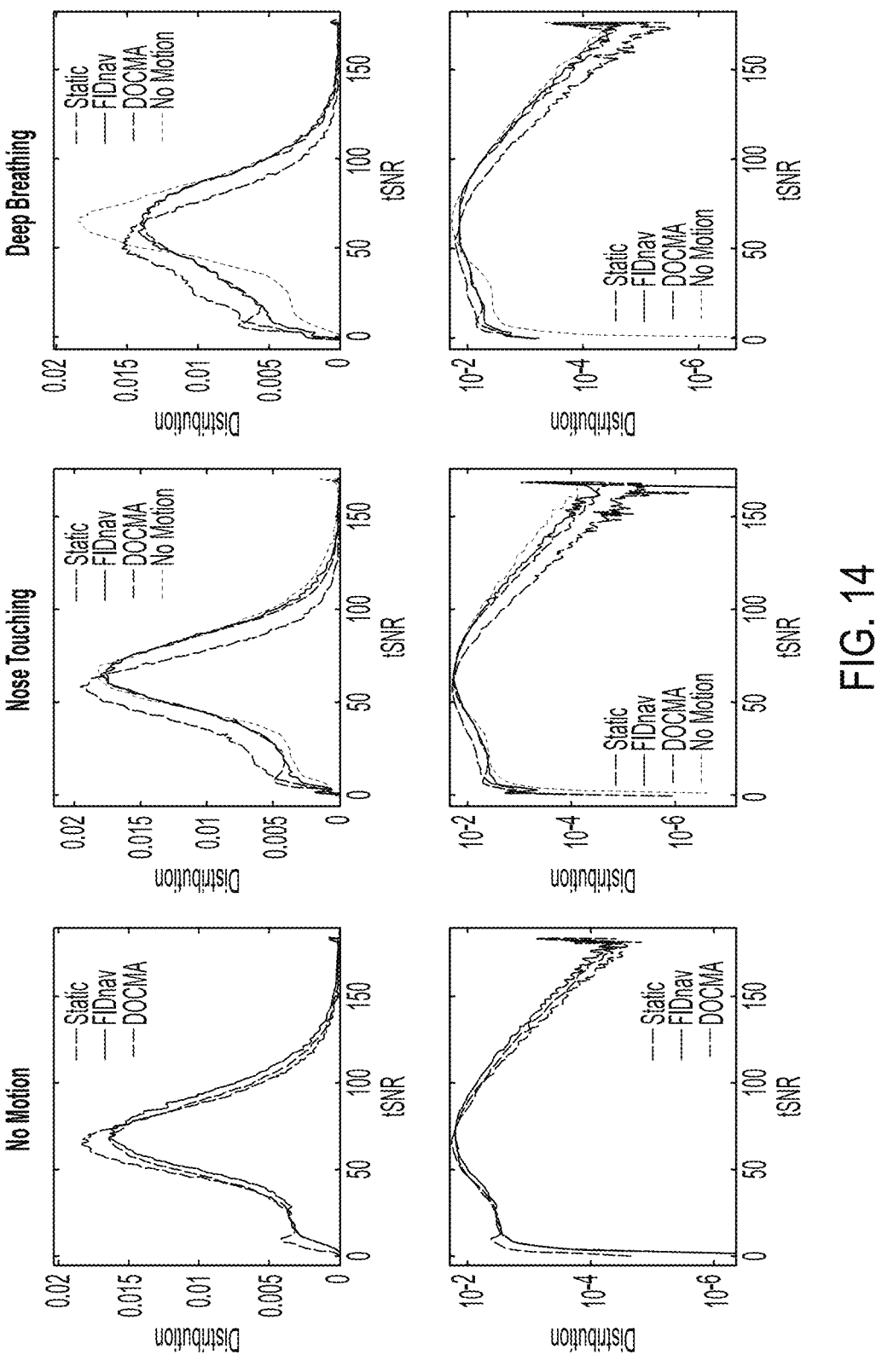
FIG. 14 depicts temporal signal-to-noise ratio distribution calculated for an experiment in connection with some embodiments.
Figure 15:
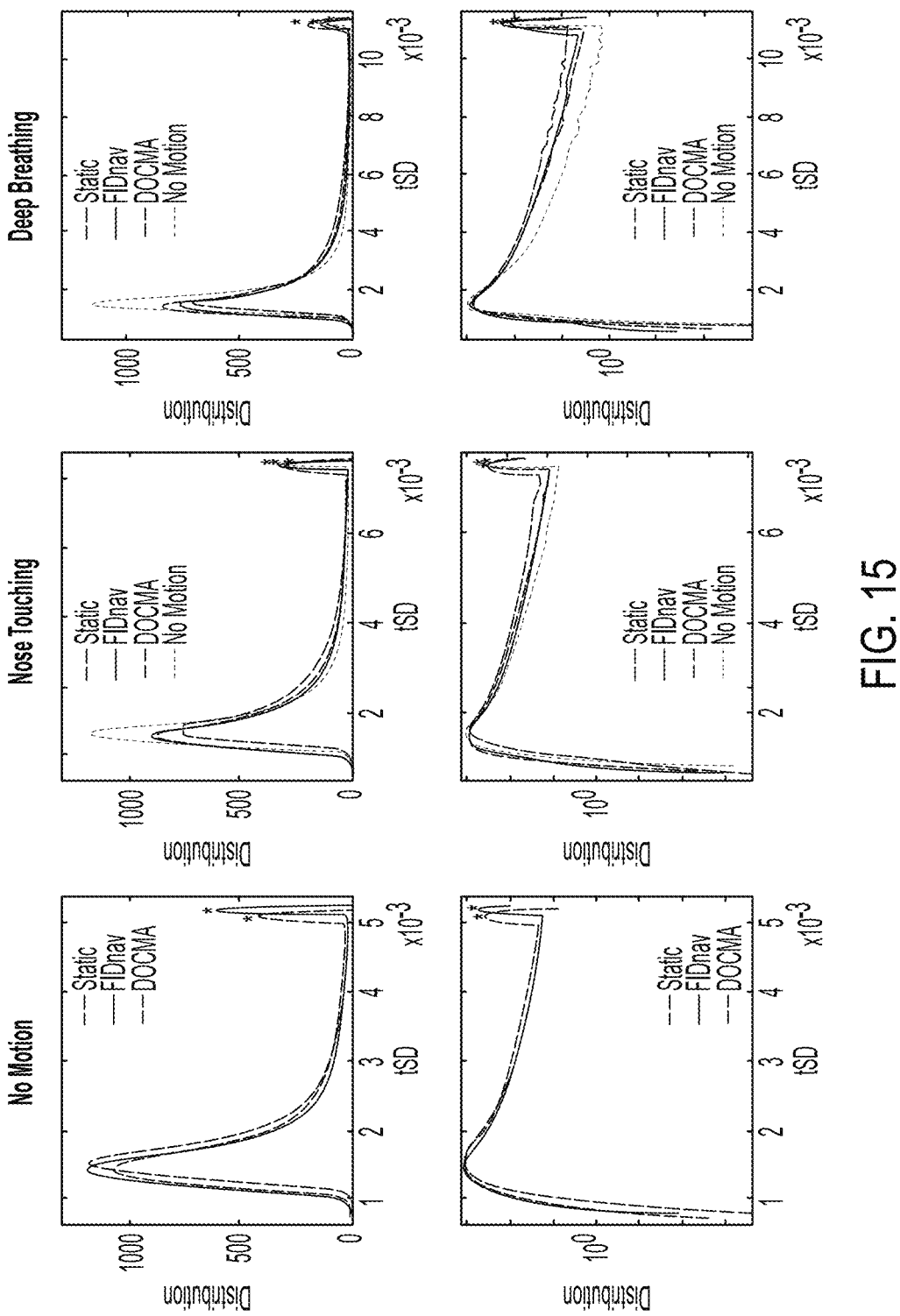
FIG. 15 depicts a temporal standard deviation distribution calculated for an experiment in connection with some embodiments.
Figure 17:
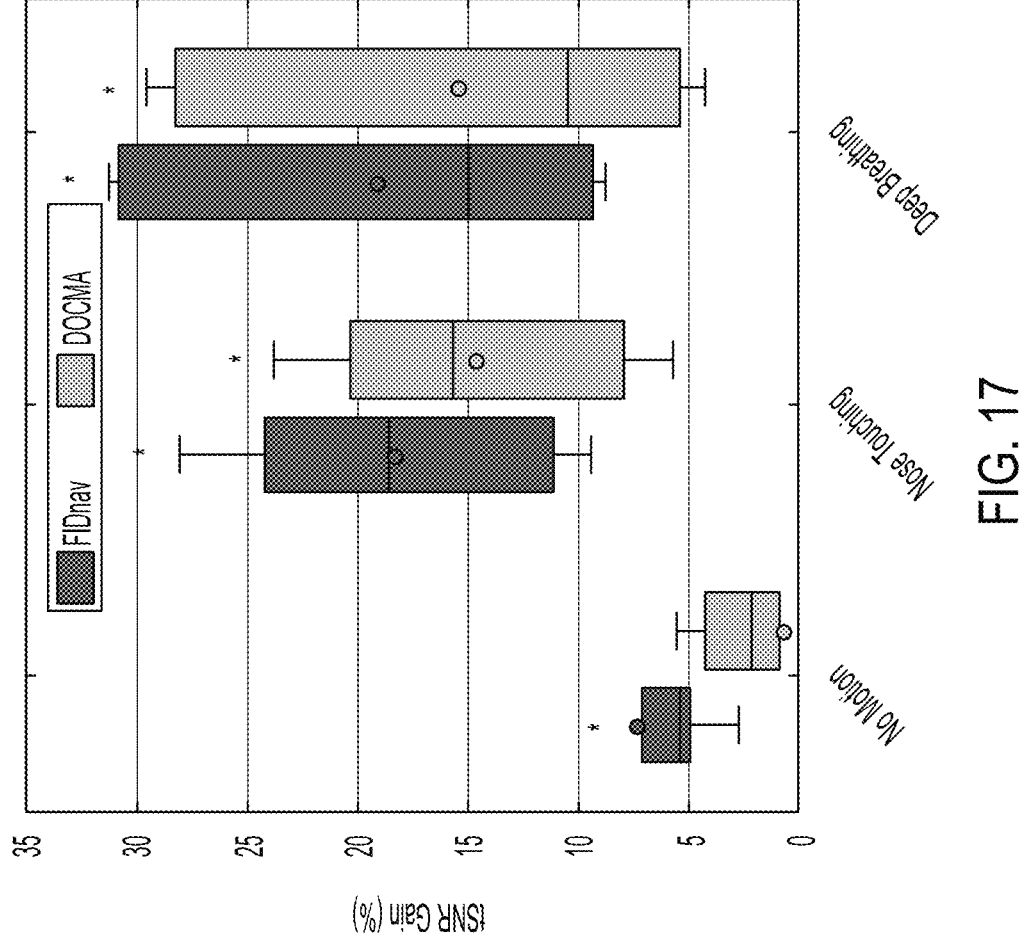
FIG. 17 includes boxplot graphs for temporal signal-to-noise ratio gains that were calculated for an experiment in connection with some embodiments.

Maps displaying tSNR in an axial slice for static, FID-navigated and DOCMA distortion correction are shown in FIG. 13 for a representative subject, for the cases of no motion, nose touching and deep breathing. More particularly, FIG. 13 depicts maps of temporal signal-to-noise ratio (tSNR) in a representative subject for the no motion, nose-touching and deep-breathing paradigms, comparing static distortion correction and dynamic correction using FIDnav and DOCMA field measurements. Dynamic distortion correction results in a substantial tSNR improvement across all paradigms, particularly in the frontal brain region during nose touching. A global increase in tSNR within the whole-brain volume is observed with both FID-navigated and DOCMA-based dynamic distortion correction across all scans. The tSNR increase is particularly marked in the frontal brain regions for the nose-touching paradigm. Histograms of the tSNR distribution across all five subjects within the brain region are displayed in FIG. 14. More particularly, FIG. 14 depicts temporal signal-to-noise ratio (tSNR) distribution in the whole-brain volume measured across all five volunteers for no motion, nose touching and deep breathing with static, FIDnav and DOCMA distortion correction. Histograms are shown on a linear scale (top of FIG. 14), as well as a logarithmic scale (bottom of FIG. 14) to show the differences in high tSNR values more clearly. The tSNR distribution for the "no motion" case is shown as a dashed line in FIG. 14 for comparison. Across all paradigms, the proposed FIDnav method enables an increase in tSNR for all paradigms, comparable to, or in the case of "no motion"—outperforming, the DOCMA method. Histograms of temporal standard deviation (tSD) are also displayed in FIG. 15. More particularly, FIG. 15 depicts temporal standard deviation (tSD) distribution in the wholebrain volume measured across all five volunteers for no motion, nose touching and deep breathing with static, FIDnav and DOCMA distortion correction. Histograms are shown on a linear scale (top of FIG. 15), as well as a logarithmic scale (bottom of FIG. 15) to show the differences in high tSD values more clearly. The tSD distribution for the "no motion" case is shown as a dashed line in FIG. 15 for comparison. In cases with no intentional field perturbations, median tSNR increased from 66 to 71 with FIDnav correction and 67 with DOCMA correction. For both the nose-touching and deep-breathing paradigms, tSNR distributions for static distortion correction were shifted towards lower values. For nose-touching, median tSNR increased from 55 to 64 with FID-navigated correction and 63 with DOCMA-based correction, while for deep-breathing, tSNR increased from 52 to 61 and 60 for FIDnav and DOCMA corrections, respectively. The tSNR distributions for each subject are quantified in the table of FIG. 16. The table provides a summary of the mean and standard deviation of the tSNR distribution for each subject and scan. FIDnav-based correction reliably improved the tSNR distribution across all subjects and paradigms, while DOCMA results were more variable. FIDnav-based correction improved the tSNR distribution across all paradigms and subjects. The tSNR gains across all subjects, relative to static distortion correction, are shown in FIG. 17. More particularly, FIG. 17 depicts boxplots showing the tSNR gains across all five volunteers for the no motion, nose touching and deep breathing paradigms for FIDnav- and DOCMA-based dynamic distortion correction, relative to static distortion correction. The tSNR gain was evaluated in the wholebrain region of interest for each subject and scan. For the no motion case, FIDnavs result in a significantly higher tSNR gain, relative to DOCMA, while for both paradigms designed to induce magnetic field perturbations, FID-navigated dynamic distortion correction results in a comparable tSNR improvement. Boxes delineate 25th and 75th quantiles, with whiskers extending to the most extreme points. Median and mean are denoted by solid lines and open circles, respectively. Results of one-sided Wilcoxon signed rank test denoted by *.FIDnav-based correction yielded a significant improvement in tSNR for each paradigm (P<0.05) with median tSNR gains of 6%, 19% and 15% for no motion, nose touching and deep breathing, respectively. For DOCMA-based correction, the tSNR gain in the case of no motion was not significant. For nose touching and deep breathing, DOCMA resulted in median tSNR gains of 16% and 10%. Thus, FID-navigated correction improved the tSNR substantially compared to DOCMA.

Second Set of Experiments

Phantom Validation

To validate the performance of embodiments of a proposed FID-navigated shimming method, a water bottle phantom was scanned at 3 T (MAGNETOM Prisma; Siemens Healthcare, Erlangen, Germany) using a 64-channel head coil. Multiple scans were acquired with controlled adjustment of the scanner shim settings to mimic dynamic $B_0$ field changes. To calibrate the FIDnav field measurement model, low-resolution 2D GRE reference images with 32 phase encoding lines and reversed gradient encoding and high bandwidth (2000 Hz/px) were acquired with TE=5 ms and an in-plane resolution of 6 mm (total acquisition time≈15 s). FID-navigated multi-echo GRE scans were acquired with $T_{NAV}$=5 ms, $TE_1/TE_2$=7.38/9.84 ms, 3-mm in-plane resolution and receiver bandwidth=600 Hz/px. The FIDnav module comprised 64 readout points sampled in 0.4 ms. All scans were performed with TR=300; FA=25°; FOV=192×192 mm; 10 interleaved axial slices with 5-mm slice thickness and 20% spacing. Separate scans were acquired while the linear shim gradients (X and Y) were modified in the range ±20 µT/m in increments of 5 µT/m across acquisitions. The central frequency was modified in the range ±20 Hz in increments of 5 Hz. For each shim setting, two repetitions were acquired with FID-navigated shimming switched off and on. This experiment was repeated in sagittal orientation with updates to the Y and Z shim gradients to evaluate the accuracy of estimated Z-shim terms. Field maps were computed from the phase difference between complex-valued multi-channel GRE images acquired at different echo times. Pixel-wise field maps were filtered using a 3×3 median filter and spherical harmonic functions up to second order were fit to the difference $\Delta B_0$ maps to assess relative field changes with and without FID-navigated shimming. Fitting spherical harmonic coefficients to the measured field maps was performed to confirm that the measured $B_0$ field changes matched the applied shim settings and that the applied FIDnav shim updates successfully counteracted these field changes. This experiment was repeated at 7 T (MAGNETOM Terra; Siemens Healthcare, Erlangen, Germany) using an anthropomorphic head phantom and a 32-channel head coil.

We also performed an additional experiment at 3 T to demonstrate the robustness of zeroth- and first-order shim estimates to higher order perturbations. In this experiment, calibration data was acquired with reference shim settings. Separate FID-navigated scans were then acquired while the linear shim gradients (X and Y) and central frequency were modified by 10 µT/m and 10 Hz, respectively, relative to (i) the reference shim settings; (ii) in the presence of an additional shim term of $X^2-Y^2+50$ µT/m²; and (iii) with an additional shim term of $2XY+50$ µT/m², with real-time field control switched off and on. Residual errors following application of zeroth- and first-order shim terms estimated from FIDnavs were compared across scans.

Volunteer Experiments at 3 T

Ten volunteers (four females, six males, aged 39±15 years) were scanned at 3 T using a 64-channel head coil, after obtaining written informed consent. Low-resolution (7-mm in-plane) reference images (TA≈15 s) were acquired to create a calibration model for each subject as described above. To evaluate the accuracy of real-time $B_0$ shim measurements using FIDnavs, each volunteer was scanned using a 2D multi-echo GRE ($TE_1/TE_2/TR$=7.38/9.84/300 ms; FA=25°; FOV=224×224 mm; resolution=3.5×3.5×5 mm; 10 interleaved axial slices; BW=600 Hz/px) during application of controlled gradient and frequency offsets of 10 µT/m and 10 Hz. Maps of $\Delta B_0$ relative to the reference shim setting were generated from the multi-echo GRE data with and without FID-navigated field control.

To compare image quality with and without FID-navigated shimming, high-resolution axial $T_2$*-weighted GRE images (TE/TR=35/500 ms; FA=30°; FOV=224×224 mm; resolution=0.5×0.5×3 mm; 10 slices with interleaved ordering; BW=200 Hz/px; TA=3.8 min) were acquired in each volunteer during (i) continuous deep breathing and (ii) while the subject periodically moved their arm to perform a nose touching action in 10-second increments. A reference scan with no motion and normal breathing was also acquired. All images were reconstructed on the scanner using the standard vendor reconstruction pipeline. The brain region was segmented on the reference (no motion) scan acquired in each subject using FSL's BET tool (FMRIB, Oxford, United Kingdom). Peak signal-to-noise ratio (PSNR) and structural similarity (SSIM) were computed within the masked brain region following rigid-body realignment of each image acquired with and without real-time field control to the reference scan. Differences in PSNR and SSIM were assessed using two-sided paired Wilcoxon rank sum tests with α=0.05.

We conducted several additional volunteer experiments to further evaluate the performance of the proposed approach. One subject was rescanned using a 32-channel head coil to test the performance of FID-navigated shimming across different coil configurations. An additional set of scans were acquired in another volunteer to demonstrate FID-navigated shimming performance in the sagittal plane during deep breathing. Another set of scans were acquired to demonstrate the relative performance of updating the first-order shim terms in real time, compared to prospective zeroth-order only correction estimated using the FIDnavs. In this experiment, axial $T_2$* weighted images were acquired while the volunteer performed a nose-touching task with (i) proposed FID-navigated first-order shimming; (ii) FID-navigated zeroth-order shimming; and (iii) no correction. Sagittal $T_2$*-weighted images were also acquired during deep breathing under the same conditions. Reference images with no motion and no correction were acquired for comparison. In each case, scan parameters for $T_2$*-weighted images were as described above.

Volunteer Experiments at 7 T

An additional volunteer was scanned to evaluate the performance of FID-navigated real-time shimming at 7 T, following written informed consent. Real-time field control using FIDnavs was compared to (i) no correction and (ii) retrospective correction with a phase navigator ("phase stabilization"). Phase stabilization computes the global phase difference between two non-phase encoded echoes; one acquired at the beginning of the scan and the other acquired following each image echo. Prior to the FID-navigated scans, subject-specific calibration data were acquired as described above. $T_2$*-weighted GRE images (TE/TR=25/500 ms; FA=30°; FOV=224×224 mm; resolution=0.5×0.5×3 mm; 10 slices; BW=200 Hz/px; TA=3.8 min) were acquired in the axial plane during nose touching, and in the sagittal plane during deep breathing. Each scan was acquired three times with (i) no correction; (ii) retrospective "phase stabilization" provided with the vendor-supplied pulse sequence; and (ii) prospective FID-navigated first-order shimming. Images were reconstructed on the scanner using the vendor image reconstruction pipeline.

Results of Second Set of Experiments

Accuracy and Latency of FIDnav $B_0$ Shim Updates

Figure 18:
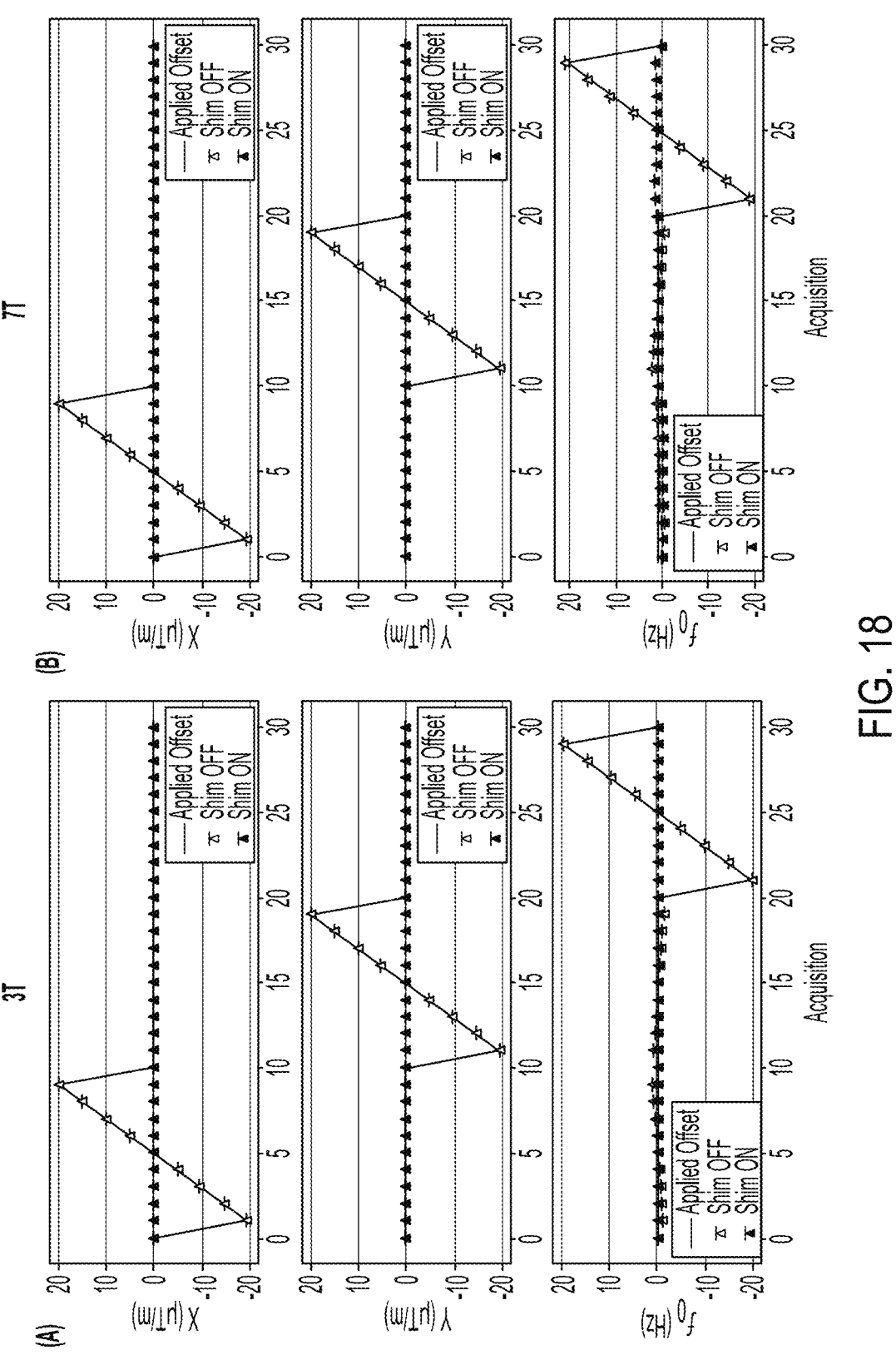
FIG. 18 depicts first-order shim coefficients and frequency offsets that were calculated for an experiment in connection with some embodiments.
Figure 19:
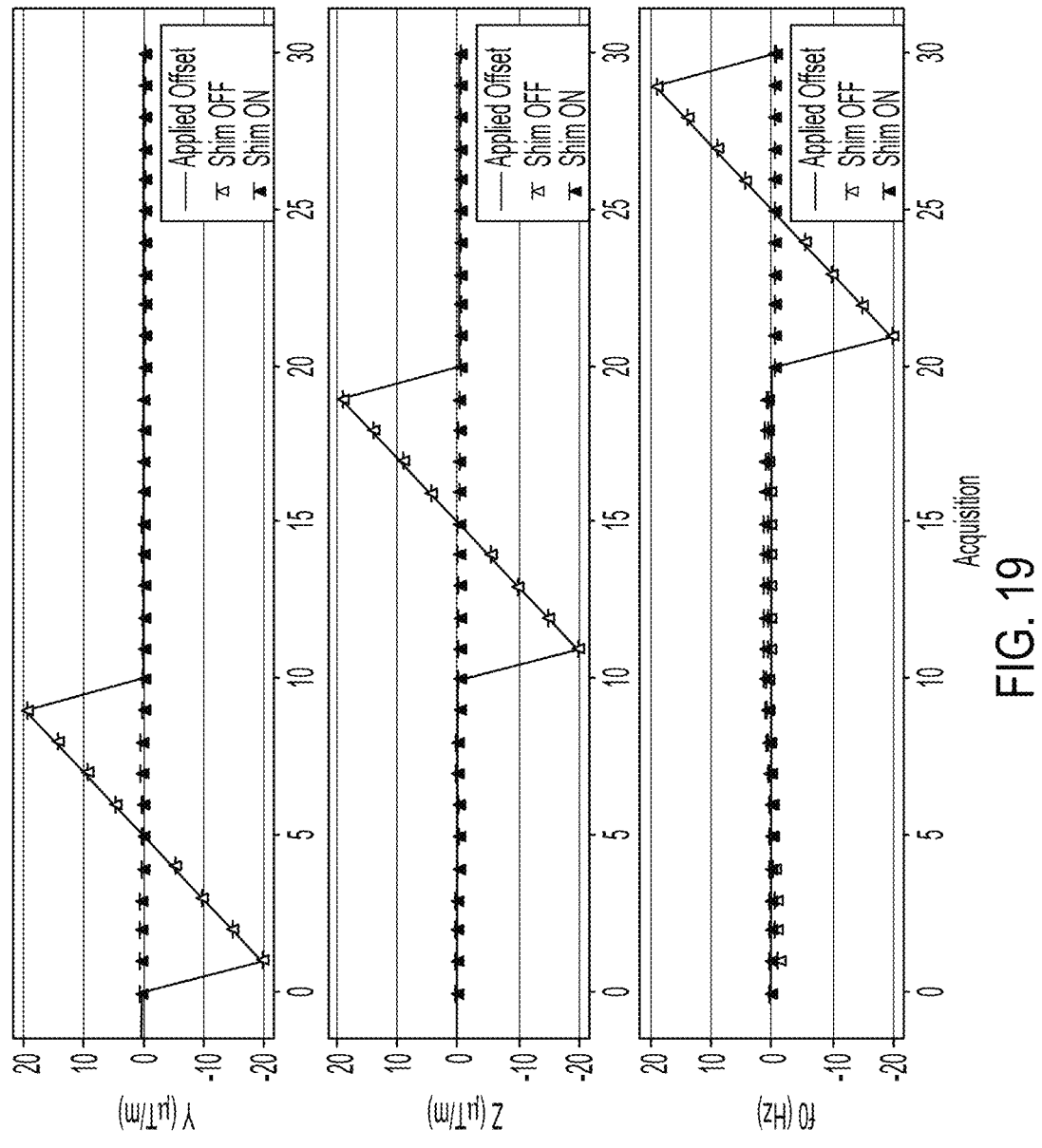
FIG. 19 depicts first-order shim coefficients and frequency offsets that were measured in an experiment in connection with some embodiments.
Figure 20:
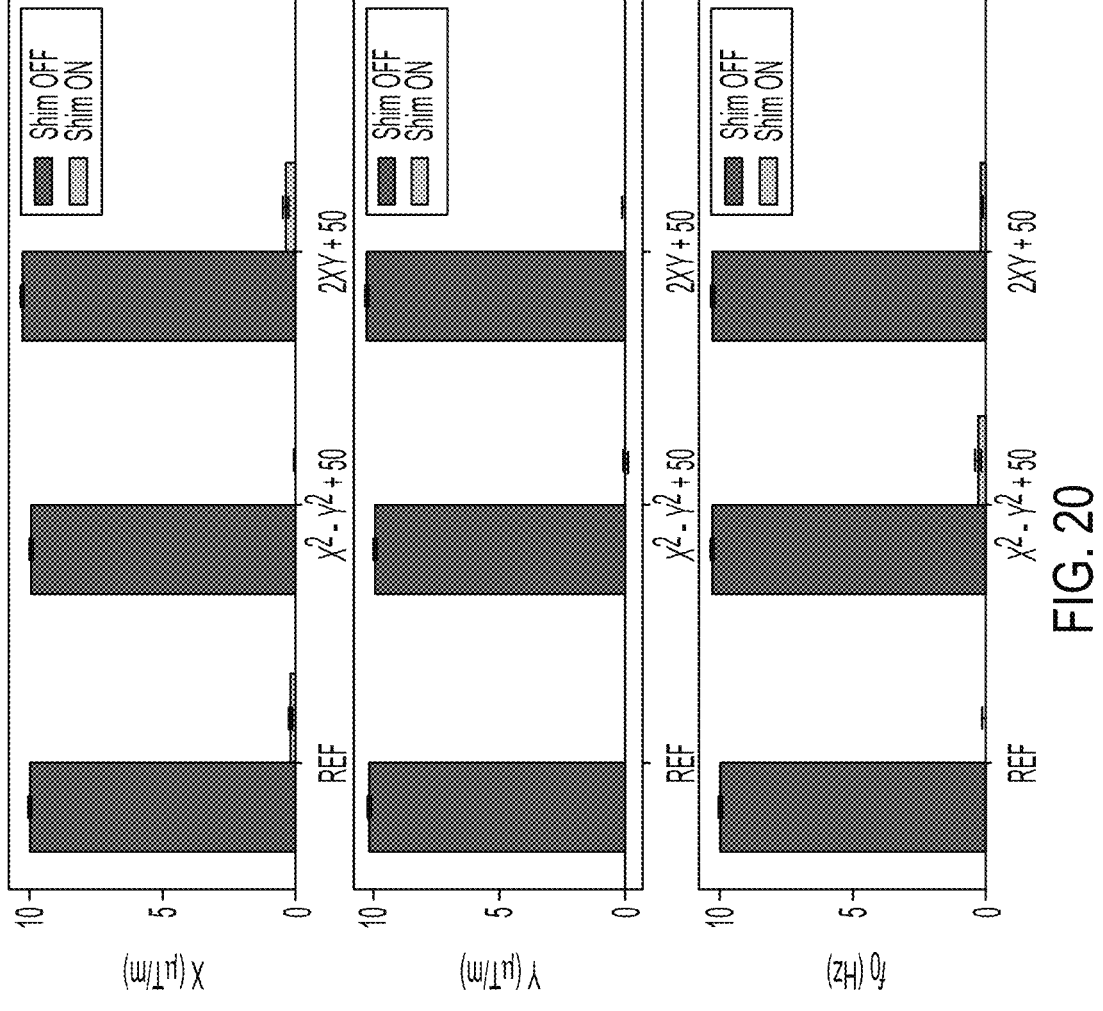
FIG. 20 depicts zeroth- and first-order $B_0$ shim offsets measured in an experiment in connection with some embodiments.

The performance of FID-navigated online field updates in controlled phantom experiments performed at both 3 T and 7 T is shown in FIG. 18. More particularly, FIG. 18 depicts first-order shim coefficients and frequency offsets measured from axial GRE field maps during applied X and Y gradient offsets and central frequency shifts across acquisitions with FID-navigated shimming switched off and on at 3 T (A) and 7 T (B). Applying $B_0$ shim measurements from FIDnavs using the linear calibration model accurately compensates for controlled field offsets. The plots show zeroth- and first-order shim coefficients measured from the GRE field maps that were acquired simultaneously with the FIDnavs, with and without real-time field control. When FIDnav shim updates are not applied, the fitted shim coefficients reflect the applied values, which varied between ±20 Hz and ±20 µT/m. With application of real-time shim updates, residual absolute zeroth- and first-order changes across acquisitions were 0.20±0.10 Hz, 0.16±0.05 µT/m (X) and 0.07±0.05 µT/m (Y) at 3 T. Residual shim coefficients at 7 T were 1.01±0.59 Hz, 0.09±0.04 µT/m (X) and 0.16±0.07 µT/m (Y). The performance of FID-navigated shimming in sagittal orientation is shown in FIG. 19. More particularly, FIG. 19 depicts first-order shim coefficients and frequency offsets measured from sagittal GRE field maps during applied Y and Z gradient offsets and central frequency shifts across acquisitions with FID-navigated shimming switched off and on at 3 T. Applying $B_0$ shim measurements from FIDnavs using the linear calibration model accurately compensates for controlled field offsets in the sagittal plane. In this experiment, residual shim coefficients were 0.63±0.40 Hz, 0.23±0.19 µT/m (Y) and 0.06±0.06 µT/m (Z). Results from the phantom experiments characterizing the accuracy of zeroth- and first-order shim updates in the presence of additional second-order shim terms are summarized in FIG. 20. FIG. 20 depicts zeroth- and first-order $B_0$ shim offsets measured in a phantom during application of shim changes of 10 µT/m and 10 Hz, relative to reference shim settings and in the presence of additional second-order shim changes, with FID-navigated field control switched off and on. Accuracy of FID-navigated shim updates is not degraded in the presence of higher-order field modulations. The accuracy of FIDnav shim updates was not degraded in the presence of substantial higher-order shim modulations.

Figure 21:
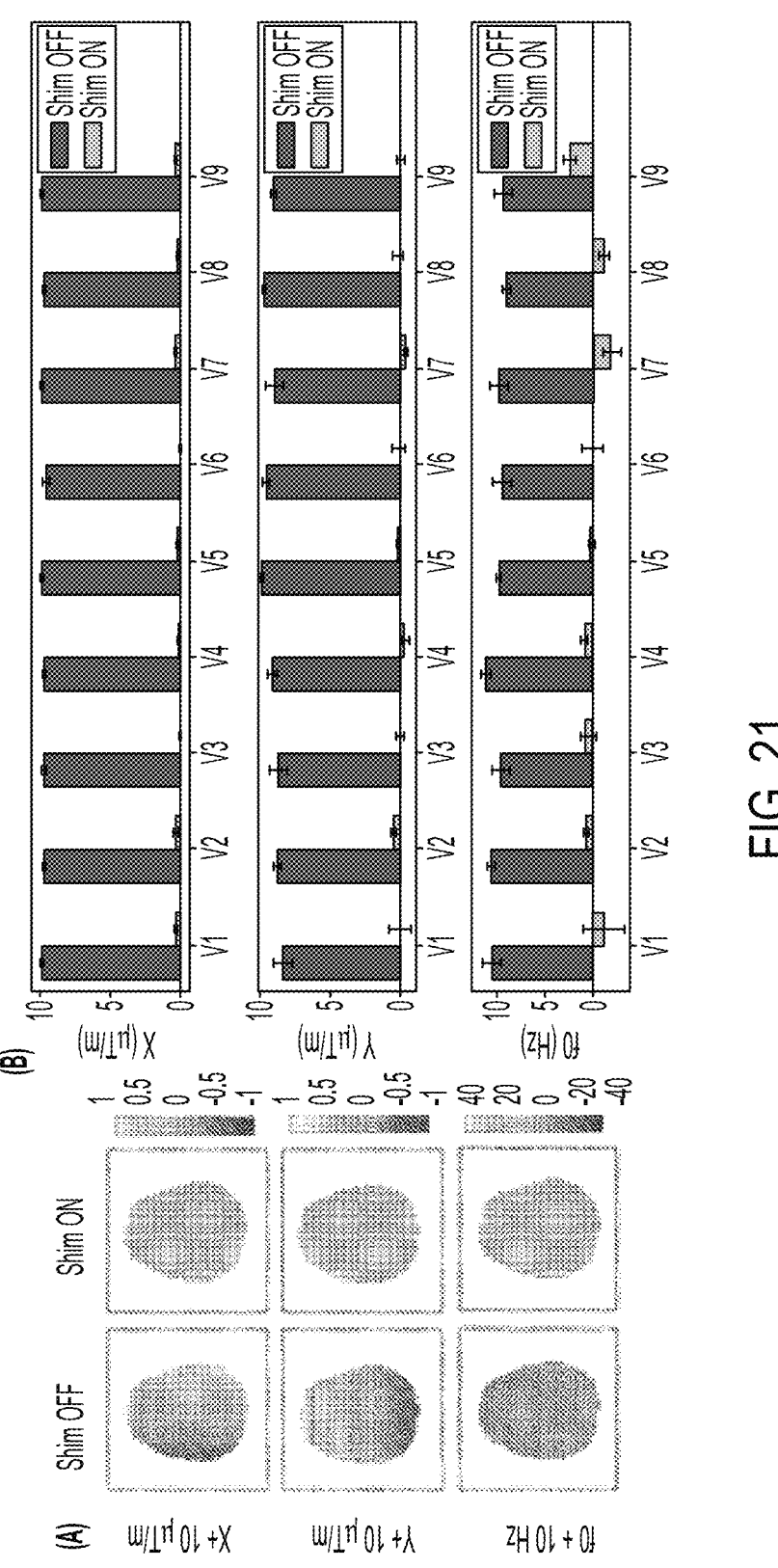
FIG. 21A shows measured $\Delta B_0$ field maps from an experiment in connection with some embodiments.
FIG. 21B includes graphs of shim coefficients from an experiment in connection with some embodiments.

FIG. 21A shows measured $\Delta B_0$ field maps in a representative volunteer with applied gradient offsets of 10 µT/m in X and Y, and a shift in the center frequency of 10 Hz, with FID-navigated real-time field control switched off and on. FIG. 21B summarizes the fitted shim coefficients across all slices with and without FID-navigated field control for nine volunteers scanned with applied shim offsets. The residual measured shim coefficients across all volunteers following application of FID-navigated field control were 0.26±0.13 µT/m (X), 0.17±0.39 µT/m (Y), and 0.99±0.85 Hz, respectively. The measured latency between FIDnav measurements and application of $B_0$ shim updates was <12 ms. As shown in FIG. 21, applying $\Delta B_0$ shim measurements computed from FIDnavs accurately compensates for controlled linear field offsets in volunteers.

Impact on $T_2$*-Weighted Imaging at 3 T

Figure 22:
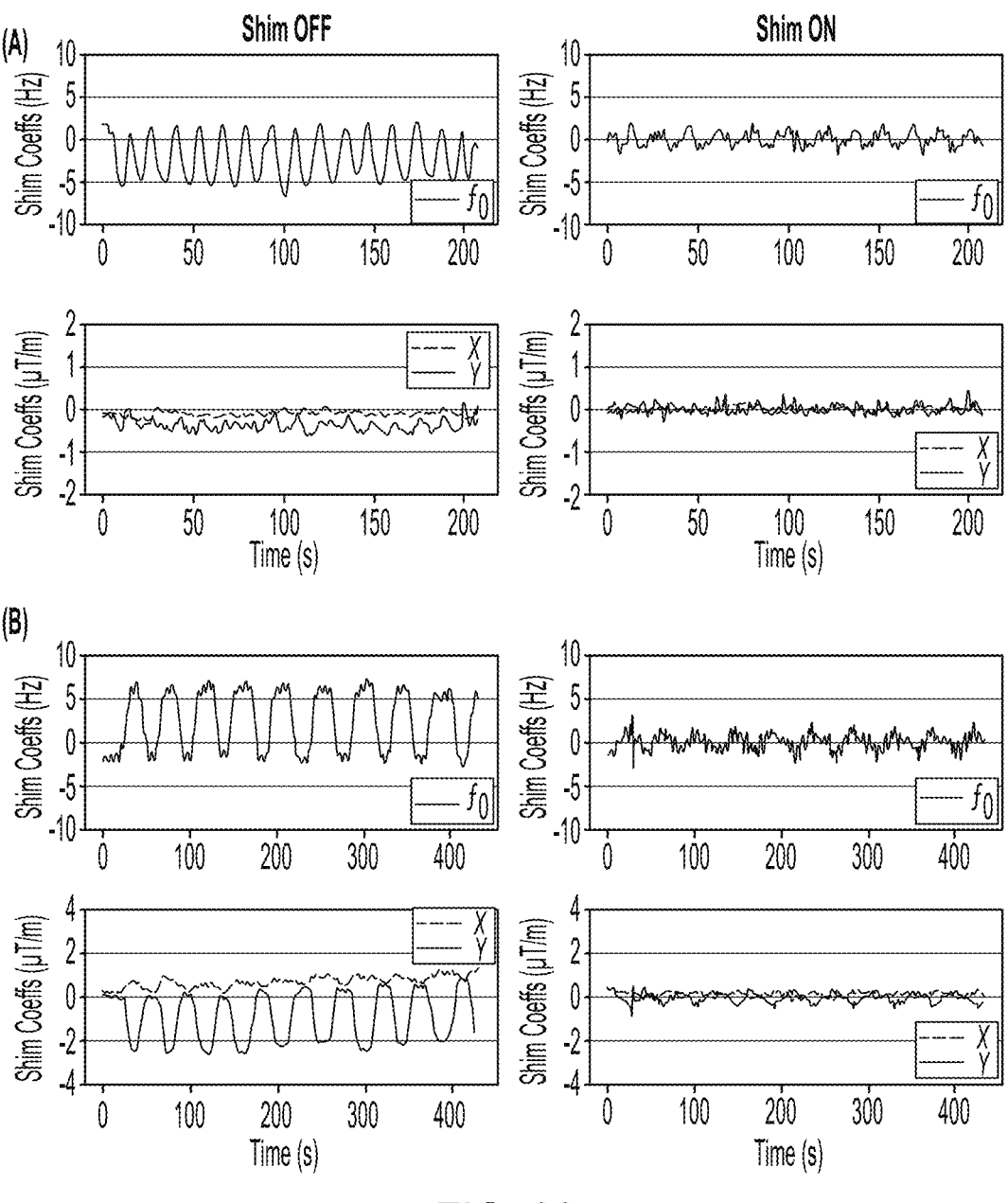
FIG. 22 shows zeroth- and first-order shim coefficients measured in an experiment in connection with some embodiments.
Figure 23:
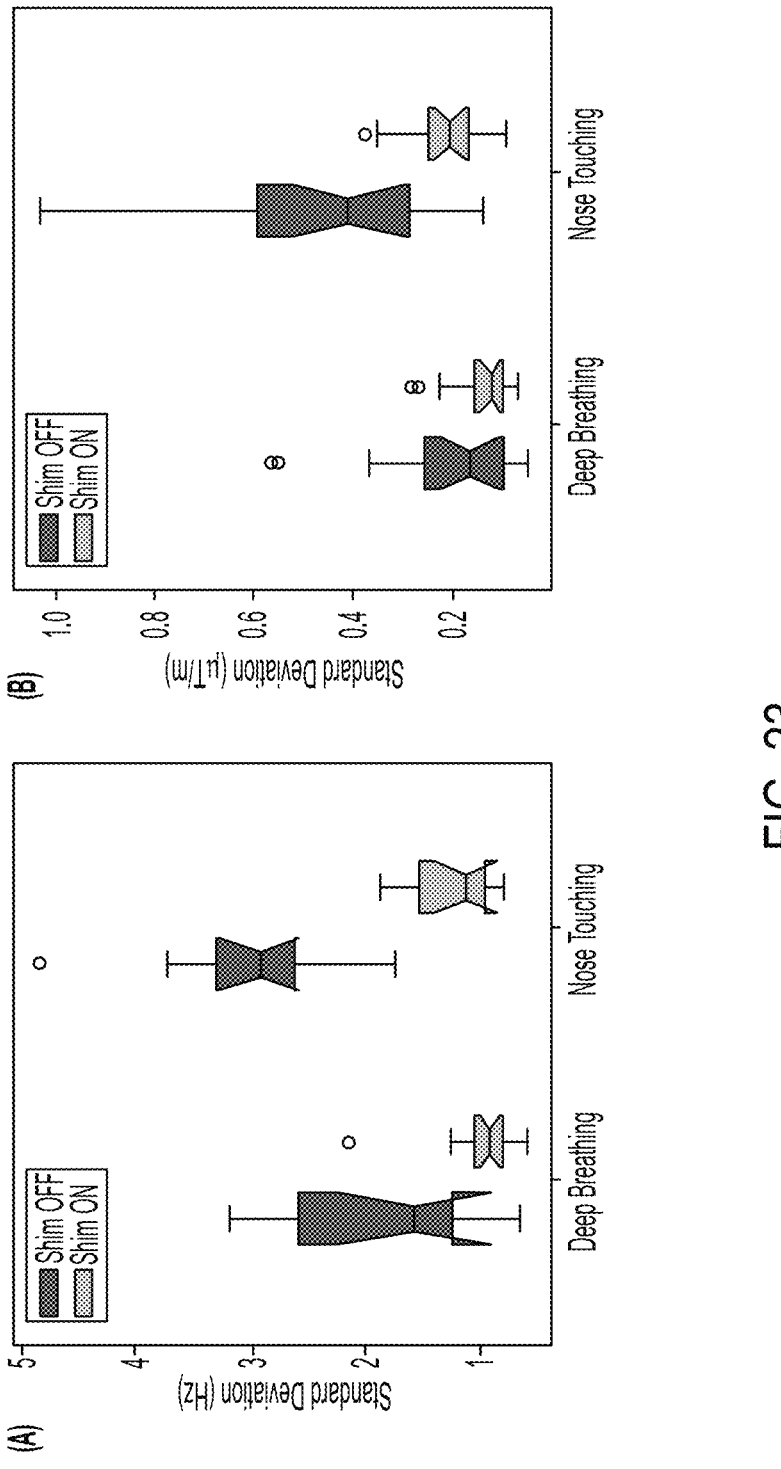
FIG. 23 includes graphs of field fluctuations from an experiment in connection with some embodiments.

Ten volunteers were scanned with the FID-navigated $T_2$*-weighted GRE protocol at 3 T while performing tasks designed to dynamically modulate the $B_0$ field. Examples of the zeroth- and first-order shim coefficients measured from FIDnavs in a single slice are shown in FIG. 22 for representative volunteers during continuous deep breathing (A) and nose touching (B), with and without application of FID-navigated real-time shimming. More particularly, FIG. 22 depicts zeroth- and first-order shim coefficients measured using FIDnavs for a single slice in a representative volunteer performing deep breathing (A) and nose touching (B) at 3 T with real-time shimming switched off and on. Performing real-time field control based on FIDnav measurements reduces spatiotemporal field fluctuations. Both tasks introduced strong global $B_0$ fluctuations, which were compensated by FID-navigated shimming. In addition, arm motion during the nose touching task introduced linear variations in the magnetic field over time, which were successfully corrected by the proposed method. A summary of field fluctuations across all volunteers with and without FID-navigated field control is shown in FIG. 23. More particularly, FIG. 23 depicts boxplots showing standard deviation of zeroth- (A) and first-order (B) $B_0$ field fluctuations measured across all volunteers scanned at 3 T during deep breathing and nose touching with FID-navigated shimming switched off and on. Real-time field control substantially reduces spatiotemporal field fluctuations across all volunteers. The standard deviation of zeroth- and first-order field fluctuations during deep breathing was reduced by 40.1%±16.1% and 13.3%±29.9%, respectively. Overall, first-order field variations in the axial plane during deep breathing were small and improvement in these terms was more variable, with a small increase observed in three subjects. During nose touching, the standard deviation of zeroth- and first-order field fluctuations was reduced by 54.5±19.8% and 41.8%±25.7%, respectively.

Figure 24:
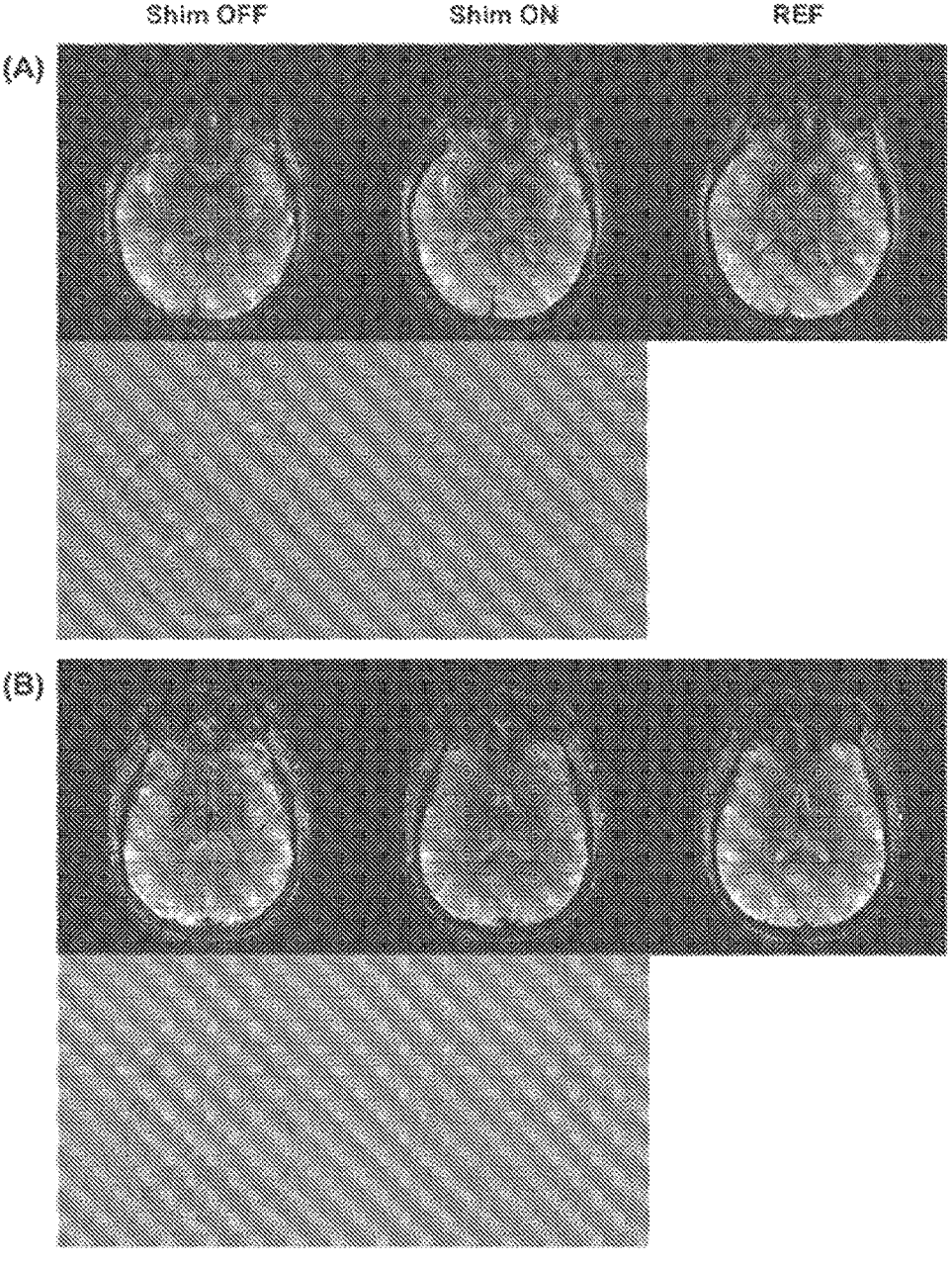
FIGS. 24-25 depict images generated in experiments in connection with some embodiments.
Figure 25:
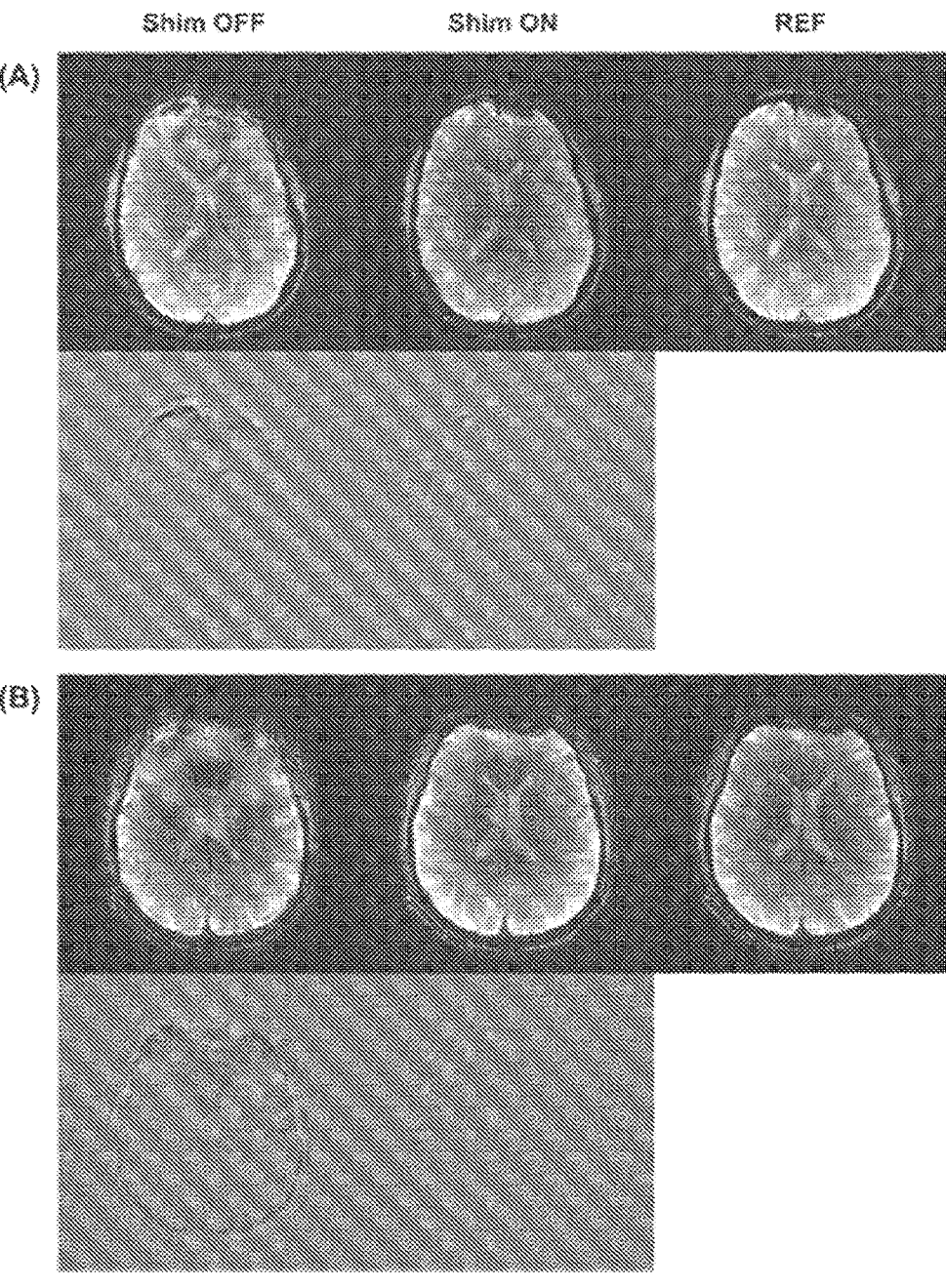
Figure 26:
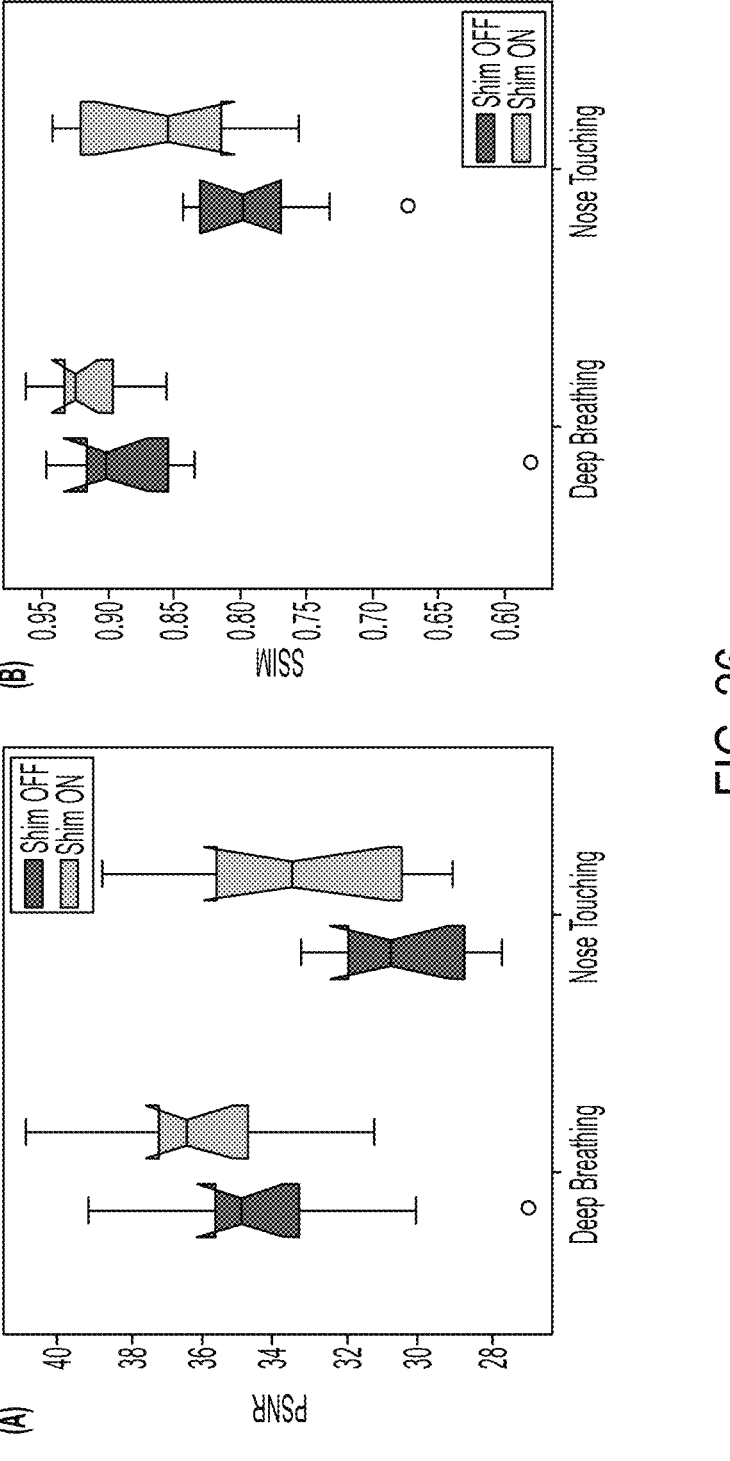
FIG. 26 includes boxplot graphs for values calculated in an experiment in connection with some embodiments.

The impact of FID-navigated real-time shimming on axial $T_2$*-weighted image quality during deep breathing in two volunteers is shown in FIG. 24. More particularly, FIG. 24 depicts axial $T_2$*-weighted GRE images acquired at 3 T in two volunteers during continuous deep breathing with FID-navigated shimming switched off and on. Reference $T_2$*-weighted image acquired during normal breathing (FID-navigated shimming OFF) and difference images relative to this reference are shown for comparison. FID-navigated shimming visibly reduces ghosting and signal modulation artifacts induced by variable susceptibility changes during deep breathing. Ghosting, blurring and signal dropout artifacts are visibly reduced with application of FID-navigated shimming. FIG. 25 shows the ability of FID-navigated real-time shimming to compensate for spatiotemporal field fluctuations induced by nose touching in two volunteers. More particularly, FIG. 25 depicts axial $T_2$*-weighted GRE images acquired at 3 T in two volunteers repeatedly performing a nose touching action inside the scanner with FID-navigated shimming switched off and on. Reference $T_2$*-weighted image acquired with no motion (FID-navigated shimming OFF) and difference images relative to this reference are shown for comparison. FID-navigated shimming successfully compensates for artifacts arising from the spatiotemporal field changes induced by arm motion. Nose touching induced strong ghosting and signal loss in the frontal brain regions, which were considerably improved with application of real-time shimming. Image quality improvements were found in 9 out of 10 subjects for both deep breathing and nose touching tasks. Boxplots of PSNR and SSIM across all volunteers are shown in FIG. 26. More particularly, FIG. 26 depicts boxplots showing peak signal-to-noise ratio (PSNR; A) and structural similarity (SSIM; B) relative to the reference $T_2$*-weighted image for deep breathing and nose touching scans across all ten volunteers.

FID-navigated real-time shimming significantly improved image quality across all volunteers. Across all volunteers, PSNR increased 5.84%±5.05% for deep breathing and 9.29%±6.00% for nose touching (P<0.05). SSIM increased 7.31%±14.10% for deep breathing and 9.12%±6.10% for nose touching (P<0.05).

Figure 27:
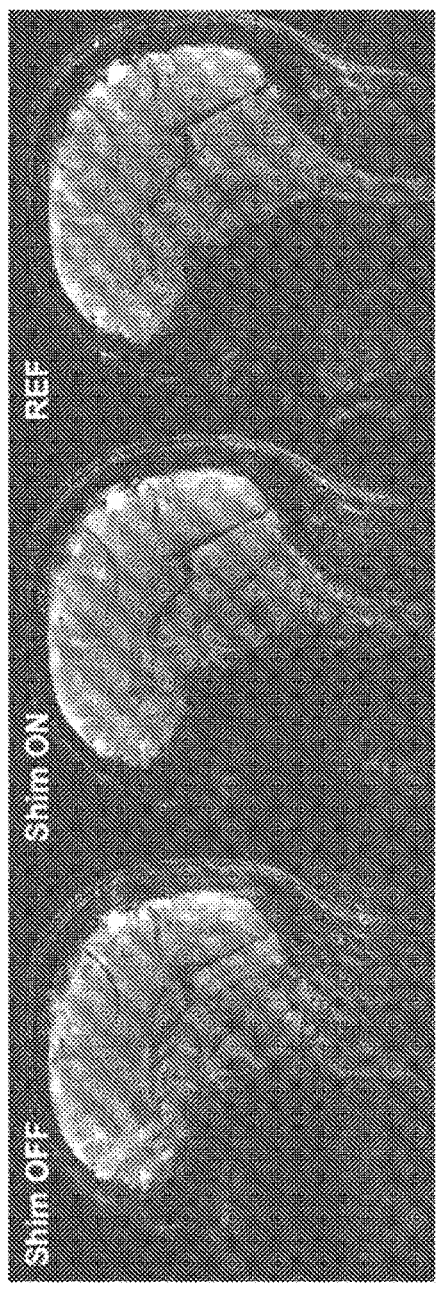
FIGS. 27-31 depict images generated in some experiments in connection with some embodiments.
Figure 28:
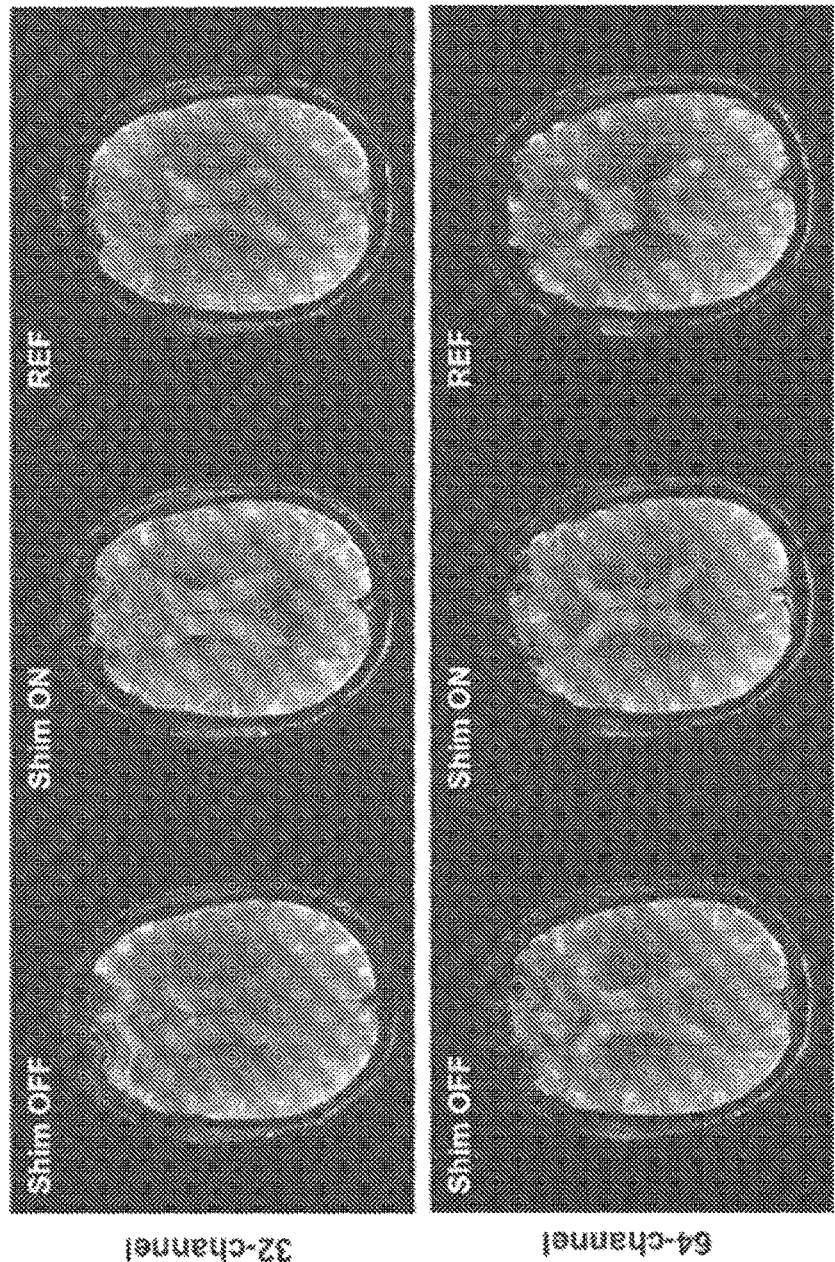
Figure 29:
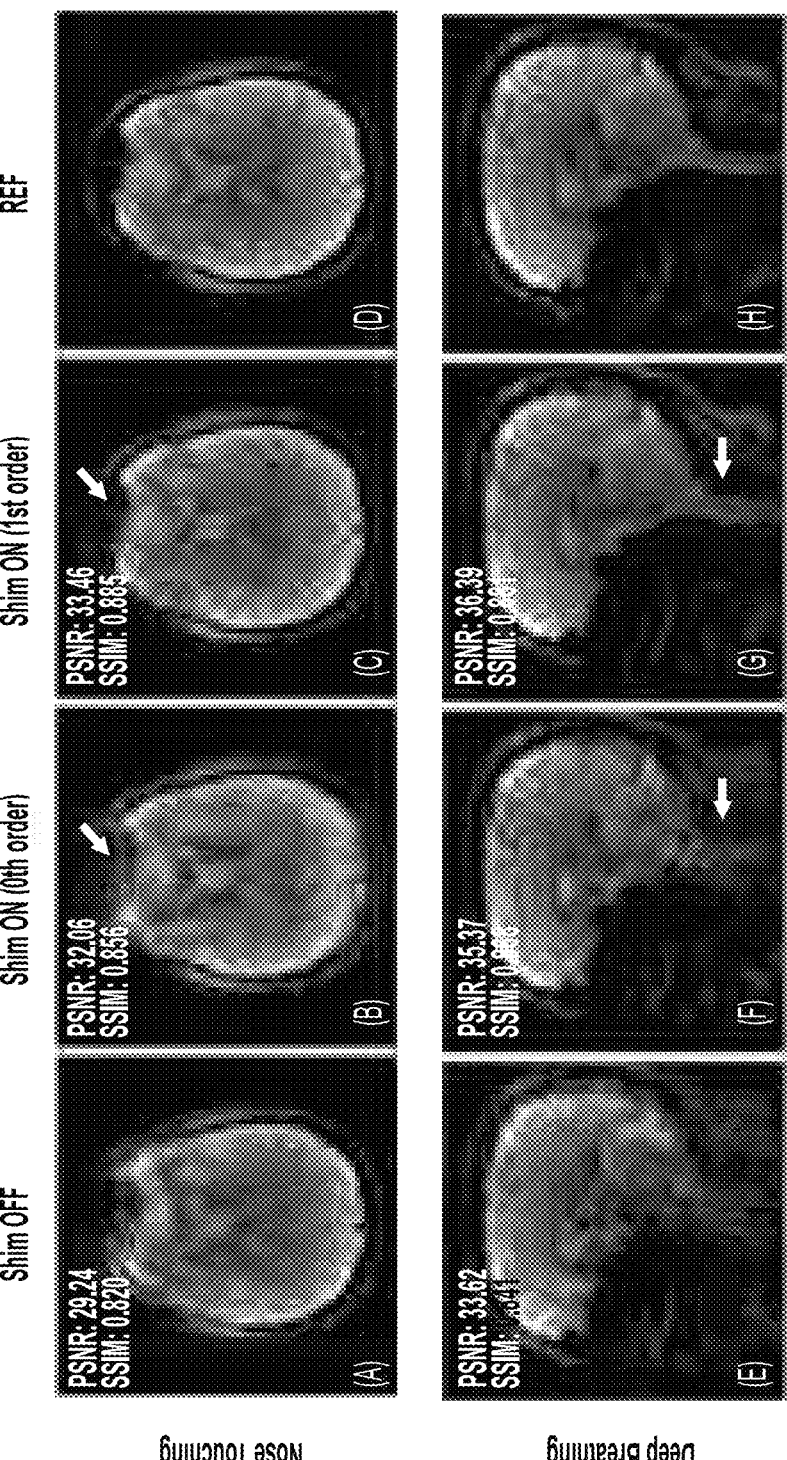

FIG. 27 shows an example of the impact of FID-navigated shimming during deep breathing in a $T_2$*-weighted image acquired in the sagittal plane. More particularly, FIG. 27 depicts sagittal $T_2$*-weighted images acquired at 3 T in a volunteer performing continuous deep breathing during the scan. A reference scan acquired during normal breathing is shown for comparison. Strong ghosting artifacts are induced by respiration in the inferior brain region, which are considerably improved with first-order FID-navigated shimming. The strong ghosting artifacts are observed near the brain stem, which is expected since field fluctuations are greatest in more inferior brain regions closest to the lungs. The amount and severity of artifacts are considerably improved with FID-navigated real-time field control. A comparison of improvement in $T_2$*-weighted image quality at 3 T using a 32-channel and a 64-channel head coil is shown in FIG. 28. More particularly, FIG. 28 depicts a comparison of FID-navigated shimming performance in a volunteer scanned at 3 T with a 32-channel and a 64-channel head coil. The volunteer repeated the same nose touching action with FID-navigated shimming switched off and on. A reference scan with no motion is shown for comparison. Performance of the proposed FID-navigated shimming approach was similar for both coil configurations. Performance of FID-navigated shimming using measurements from a 32-channel coil is comparable, which is expected since only three parameters are needed to express shim changes up to first order in each slice and the condition numbers of the linear calibration matrices are similar. The relative performance of the proposed first-order shimming approach compared to zeroth-order only shimming using FIDnav estimates is shown in FIG. 29. More particularly, FIG. 29 depicts, in the top row, axial $T_2$*-weighted images acquired in a volunteer during nose touching at 3 T without any correction (A); with FID-navigated zeroth-order shimming (B); and with the proposed FID-navigated first-order shimming (C). A reference image acquired with no motion and no correction (D) is shown for comparison. Updating the first-order shim terms yielded improved performance compared to zeroth-order only correction in the frontal brain regions, which are subject to spatially-varying field changes due to arm motion. FIG. 29 also depicts, in the bottom row, sagittal $T_2$*-weighted images acquired in the same volunteer during deep breathing without any correction (E); with zeroth-order shimming (F); with the proposed first-order shimming (G); reference image acquired during normal breathing (H). FID-navigated first-order shimming yielded substantially improved image quality compared to both no correction and zeroth-order only shimming, which is expected since breathing-induced field fluctuations vary along the head-foot axis. Image quality and corresponding quantitative metrics are substantially improved with first-order correction for nose touching in the axial plane, compared to both zeroth-order and no correction, which is expected since arm motion induces substantial spatiotemporal field variations, particularly in frontal brain regions. Similarly, first-order shimming yielded improved performance over zeroth-order correction for deep breathing in the sagittal plane, where linear field variations are expected along the head-foot axis.

Comparison to Phase Stabilization at 7 T

Figure 30:
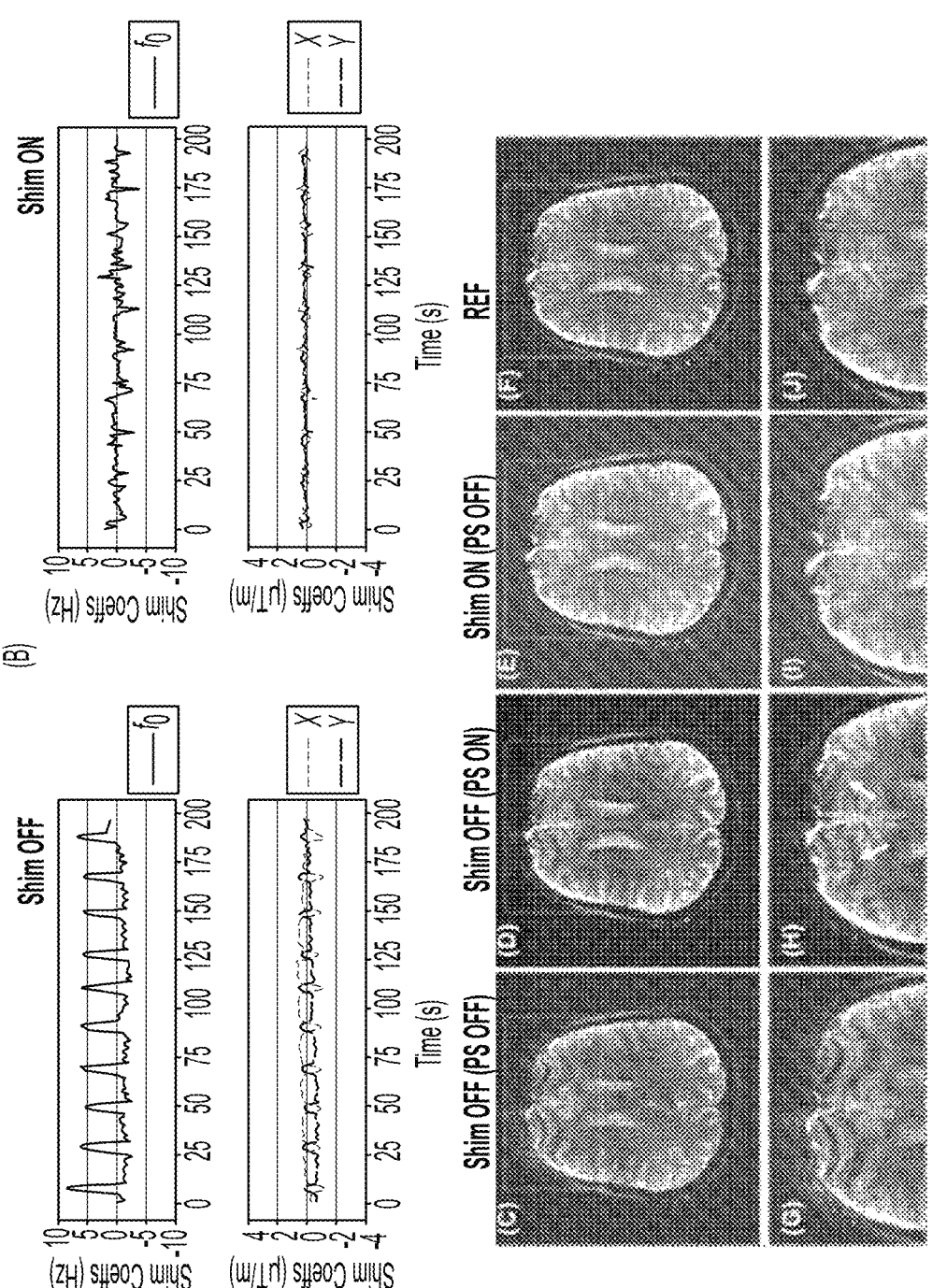
Figure 31:
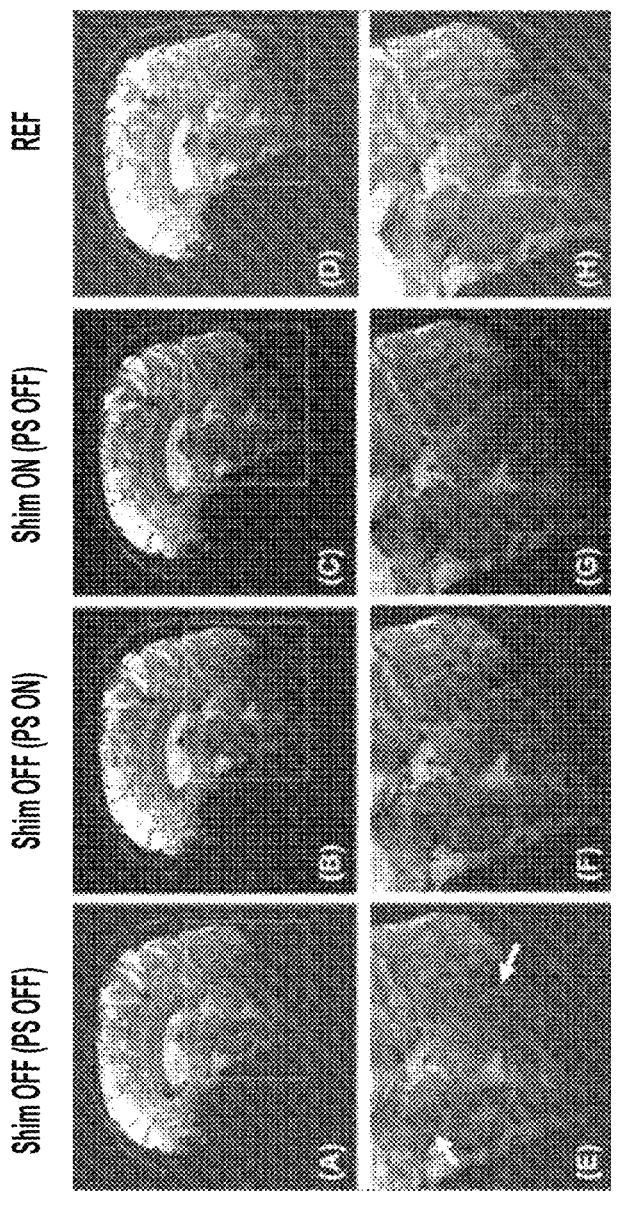

The performance of FID-navigated shimming in a volunteer scanned at 7 T is shown in FIG. 30. More particularly, FIG. 30 depicts measured shim coefficients in a volunteer performing the nose touching task at 7 T (A) and with FID-navigated shimming (B). Axial $T_2$*-weighted image acquired during nose touching without any phase stabilization (PS) correction applied (C); with PS; with FID-navigated shimming (E). A reference scan acquired without any intentional motion (with PS correction) is shown for comparison (F). Zoomed in sections (G-J) show that FID-navigated shimming successfully compensates for zeroth- and first-order field perturbations induced by nose touching, outperforming retrospective PS correction. Measured shim coefficients during repeated nose touching during the scan are shown in FIG. 30A and in FIG. 30B with application of FID-navigated shimming. Strong ghosting artifacts are observed in the frontal brain region with nose touching, which are partially corrected by retrospective phase stabilization, which compensates for global $B_0$ fluctuations. Residual artifacts are denoted by the white arrows in FIG. 30H. These artifacts are substantially reduced with prospective FID-navigated shimming (FIG. 30I), which successfully compensates for first-order field variations. For the deep breathing task, FID-navigated shimming was comparable to the results of retrospective phase stabilization (FIG. 31). FIG. 31 depicts sagittal $T_2$*-weighted images acquired during deep breathing at 7 T without any phase stabilization (PS) correction applied (A); with retrospective PS (B); with FID-navigated shimming (C); and a reference scan acquired during normal breathing with retrospective PS correction (D). Zoomed in sections (E-H) show that retrospective PS and prospective FID-navigated shimming exhibit comparable performance for improving image quality.

EXAMPLE PROCESSING TECHNIQUES

Techniques operating according to the principles described herein may be implemented in any suitable manner. Included in the discussion above are a series of flow charts showing the steps and acts of various processes that analyze MR data to evaluate an image that would result from an MRI scan. The processing and decision blocks of the flow charts above represent steps and acts that may be included in algorithms that carry out these various processes. Algorithms derived from these processes may be implemented as software integrated with and directing the operation of one or more single- or multi-purpose processors, may be implemented as functionally-equivalent circuits such as a Digital Signal Processing (DSP) circuit or an Application-Specific Integrated Circuit (ASIC), or may be implemented in any other suitable manner. It should be appreciated that the flow charts included herein do not depict the syntax or operation of any particular circuit or of any particular programming language or type of programming language. Rather, the flow charts illustrate the functional information one skilled in the art may use to fabricate circuits or to implement computer software algorithms to perform the processing of a particular apparatus carrying out the types of techniques described herein. It should also be appreciated that, unless otherwise indicated herein, the particular sequence of steps and/or acts described in each flow chart is merely illustrative of the algorithms that may be implemented and can be varied in implementations and embodiments of the principles described herein.

Accordingly, in some embodiments, the techniques described herein may be embodied in computer-executable instructions implemented as software, including as application software, system software, firmware, middleware, embedded code, or any other suitable type of computer code. Such computer-executable instructions may be written using any of a number of suitable programming languages and/or programming or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application, for example as a software program application such as a signal analysis facility.

Some exemplary functional facilities have been described herein for carrying out one or more tasks. It should be appreciated, though, that the functional facilities and division of tasks described is merely illustrative of the type of functional facilities that may implement the exemplary techniques described herein, and that embodiments are not limited to being implemented in any specific number, division, or type of functional facilities. In some implementations, all functionality may be implemented in a single functional facility. It should also be appreciated that, in some implementations, some of the functional facilities described herein may be implemented together with or separately from others (i.e., as a single unit or separate units), or some of these functional facilities may not be implemented.

Computer-executable instructions implementing the techniques described herein (when implemented as one or more functional facilities or in any other manner) may, in some embodiments, be encoded on one or more computer-readable media to provide functionality to the media. Computer-readable media include magnetic media such as a hard disk drive, optical media such as a Compact Disk (CD) or a Digital Versatile Disk (DVD), a persistent or non-persistent solid-state memory (e.g., Flash memory, Magnetic RAM, etc.), or any other suitable storage media. Such a computer-readable medium may be implemented in any suitable manner, including as computer-readable storage media 3206 of FIG. 32 described below (i.e., as a portion of a computing device 3200) or as a stand-alone, separate storage medium. As used herein, "computer-readable media" (also called "computer-readable storage media") refers to tangible storage media. Tangible storage media are non-transitory and have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

In some, but not all, implementations in which the techniques may be embodied as computer-executable instructions, these instructions may be executed on one or more suitable computing device(s) operating in any suitable computer system, including the exemplary computer system of FIG. 1, or one or more computing devices (or one or more processors of one or more computing devices) may be programmed to execute the computer-executable instructions. A computing device or processor may be programmed to execute instructions when the instructions are stored in a manner accessible to the computing device or processor, such as in a data store (e.g., an on-chip cache or instruction register, a computer-readable storage medium accessible via a bus, a computer-readable storage medium accessible via one or more networks and accessible by the device/processor, etc.). Functional facilities comprising these computer-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing devices (co-located or geographically distributed) dedicated to executing the techniques described herein, one or more Field-Programmable Gate Arrays (FPGAs) for carrying out the techniques described herein, or any other suitable system.

Figure 32:
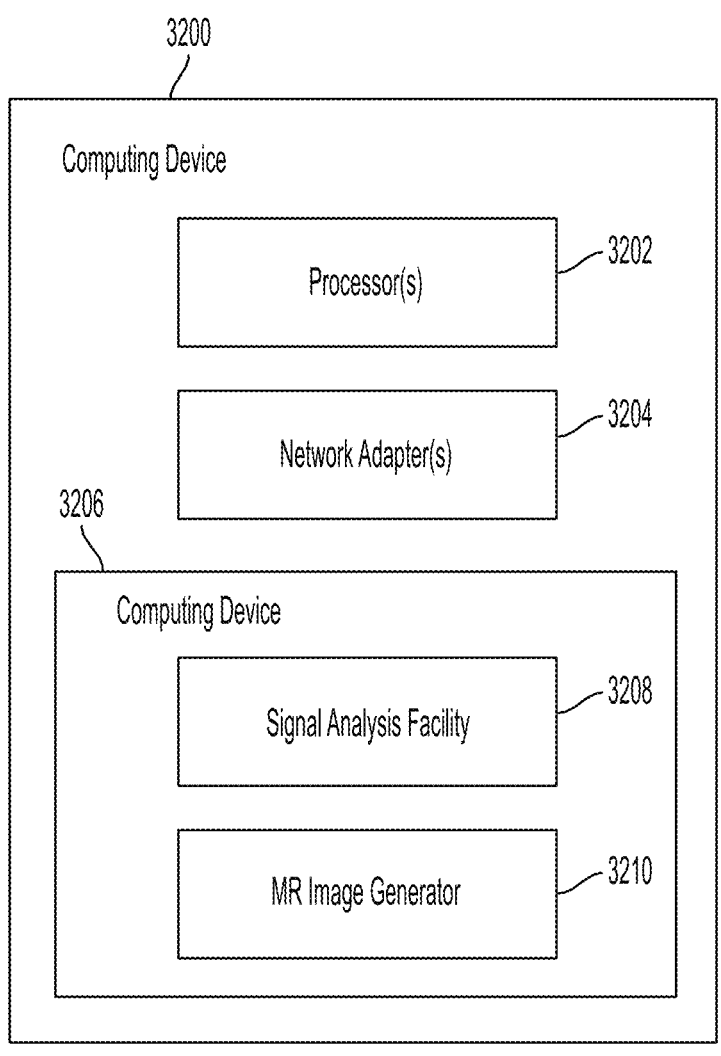
FIG. 32 is a schematic diagram of an illustrative computing device with which aspects described herein may be implemented.

FIG. 32 illustrates one exemplary implementation of a computing device in the form of a computing device 3200 that may be used in a system implementing techniques described herein, although others are possible. It should be appreciated that FIG. 32 is intended neither to be a depiction of necessary components for a computing device to operate as a device for controlling generation of an image that would result from an MRI scan in accordance with the principles described herein, nor a comprehensive depiction.

Computing device 3200 may comprise at least one processor 3202 (e.g., a computer hardware processor), a network adapter 3204, and computer-readable storage media 3206. Computing device 3200 may be, for example, a desktop or laptop personal computer, a personal digital assistant (PDA), a smart mobile phone, or any other suitable computing device. Network adapter 3204 may be any suitable hardware and/or software to enable the computing device 3200 to communicate wired and/or wirelessly with any other suitable computing device over any suitable computing network. The computing network may include wireless access points, switches, routers, gateways, and/or other networking equipment as well as any suitable wired and/or wireless communication medium or media for exchanging data between two or more computers, including the Internet. Computer-readable media 3206 may be adapted to store data to be processed and/or instructions to be executed by processor 3202. Processor 3202 enables processing of data and execution of instructions. The data and instructions may be stored on the computer-readable storage media 3206.

The data and instructions stored on computer-readable storage media 3206 may comprise computer-executable instructions implementing techniques which operate according to the principles described herein. In the example of FIG. 32, computer-readable storage media 3206 stores computer-executable instructions implementing various facilities and storing various information as described above. Computer-readable storage media 3206 may store signal analysis facility 3208 configured to perform techniques described herein. Media 3206 may also store an MR image generator 3210 to generate one or more images from signals captured during an MRI scan.

While not illustrated in FIG. 32, a computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the principles described herein. Accordingly, the foregoing description and drawings are by way of example only.

What is claimed is:

1. A method for controlling creation of a magnetic resonance (MR) image from a magnetic resonance imaging (MRI) scan of a subject using an MRI scanner, the method comprising:

prior to completion of the MRI scan of the subject using the MRI scanner, evaluating MR signals captured during the MRI scan at a time to determine first information indicative of a state of a magnetic field within the MRI scanner at the time;

comparing the first information indicative of the state of the magnetic field within the MRI scanner at the time to second information indicative of an expected state of the magnetic field for the time, wherein the second information indicative of the expected state of the magnetic field at the time was derived from previously-captured MR data for the MRI scan of the subject using the MRI scanner; and in response to detecting that a result of the comparing of the first information indicative of the state of the magnetic field at the time to the second information on the expected state of the magnetic field for the time satisfies at least one criterion, adjusting the MRI scanner and/or a processing of MR signals during the MRI scan based at least in part on the result; and capturing additional MR data of the MRI scan of the subject.

2. The method of claim 1, wherein adjusting the MRI scanner in response to detecting that the result of the comparing satisfies the at least one criterion comprises modifying an MRI scanning sequence being executed by the MRI scanner for the MRI scan.

3. The method of claim 2, wherein modifying the MRI scanning sequence comprises performing shim updates to the MRI scanning sequence.

4. The method of claim 2, wherein modifying an MRI scanning sequence comprises modifying frequency and gradient offsets.

5. The method of claim 1, wherein adjusting the MRI scanner in response to detecting that the result of the comparing satisfies at least one criterion comprises generating modified MR data by modifying MR data captured during the MR scan based at least in part on the result of the comparing of the first information and the second information.

6. The method of claim 5, wherein generating the modified MR data by modifying the MR data captured during the MR scan comprises, by the MRI scanner, modifying MR data for the time prior to output from the MRI scanner of the MR data for the time.

7. The method of claim 1, wherein:

evaluating the MR signals to determine the first information indicative of the state of the magnetic field at the time comprises evaluating free-induction decay (FID) navigator signals captured during the MR scan at the time; and comparing the first information indicative of the state of the magnetic field within the MRI scanner at the time to the second information indicative of the expected state of the magnetic field for the time comprises comparing values for the FID navigator signals at the time to expected values for FID navigator signals for the time.

8. The method of claim 7, wherein:

comparing values for the FID navigator signals at the time to expected values for FID navigator signals for the time comprises comparing, for a coil of the MRI scanner, a value for an FID navigator signal captured for the time by the coil to a computed value based on reference data for the coil and a set of parameters; and adjusting the MRI scanner and/or a processing of MR signals during the MRI scan based at least in part on the result comprises adjusting one or more of the set of parameters in response to identifying a difference between the value for the FID navigator signal captured for the time by the coil and the computed value.

9. The method of claim 8, wherein adjusting the MRI scanner and/or a processing of MR signals during the MRI scan based at least in part on the result comprises adjusting a spatially-resolved map of field distortion based at least in part on the result.

10. The method of claim 1, wherein performing the evaluating, the comparing, the adjusting and/or the processing, and the capturing prior to completion of the MRI scan of the subject comprises performing the evaluating, the comparing, the adjusting and/or the processing, and the capturing prior to collection of all MR data for the MRI scan.

11. The method of claim 1, wherein performing the evaluating, the comparing, the adjusting and/or the processing, and the capturing prior to completion of the MRI scan of the subject comprises performing the evaluating for the time, the comparing for the time, and the adjusting and/or the processing for the time prior to capturing MR signals for a second time of the MRI scan, the second time being later than the time.

12. The method of claim 1, wherein the MRI scan is a functional MRI (fMRI) scan.

13. The method of claim 1, wherein the evaluating, the comparing, the adjusting and/or the processing, and the capturing are performed by the MRI scanner.

14. The method of claim 1, wherein the previously-captured MR data is obtained during a reference scan.

15. The method of claim 1, wherein the previously-captured MR data is obtained during the MRI scan and prior to the time.

16. A system configured to evaluate a magnetic resonance image (MRI) scan, comprising:

at least one processor; and at least one non-transitory computer-readable storage medium storing processor executable instructions that, when executed by the at least one processor, cause the at least one processor to perform a method comprising:

prior to completion of the MRI scan of the subject using the MRI scanner, evaluating MR signals captured during the MRI scan at a time to determine first information indicative of a state of a magnetic field within the MRI scanner at the time;

comparing the first information indicative of the state of the magnetic field within the MRI scanner at the time to second information indicative of an expected state of the magnetic field for the time, wherein the second information indicative of the expected state of the magnetic field at the time was derived from previously-captured MR data for the MRI scan of the subject using the MRI scanner; and in response to detecting that a result of the comparing of the first information indicative of the state of the magnetic field at the time to the second information on the expected state of the magnetic field for the time satisfies at least one criterion, adjusting the MRI scanner and/or a processing of MR signals during the MRI scan based at least in part on the result; and capturing additional MR data of the MRI scan of the subject.

17. A magnetic resonance imaging (MRI) system configured to evaluate a magnetic resonance image (MRI) scan, comprising:

an MRI scanner;

at least one processor; and at least one non-transitory computer-readable storage medium storing executable instructions that, when executed by the at least one processor, cause the at least one computer hardware processor to perform a method comprising:

prior to completion of the MRI scan of the subject using the MRI scanner, evaluating MR signals captured during the MRI scan at a time to determine first information indicative of a state of a magnetic field within the MRI scanner at the time;

comparing the first information indicative of the state of the magnetic field within the MRI scanner at the time to second information indicative of an expected state of the magnetic field for the time, wherein the second information indicative of the expected state of the magnetic field at the time was derived from previously-captured MR data for the MRI scan of the subject using the MRI scanner; and in response to detecting that a result of the comparing of the first information indicative of the state of the magnetic field at the time to the second information on the expected state of the magnetic field for the time satisfies at least one criterion, adjusting the MRI scanner and/or a processing of MR signals during the MRI scan based at least in part on the result; and capturing additional MR data of the MRI scan of the subject.

* * * * *